(12) United States Patent
Inaba et al.

(10) Patent No.: US 12,349,359 B2
(45) Date of Patent: Jul. 1, 2025

(54) SEMICONDUCTOR MEMORY DEVICE

(71) Applicant: Kioxia Corporation, Tokyo (JP)

(72) Inventors: Tsuneo Inaba, Kamakura (JP); Keisuke Nakatsuka, Kobe (JP); Takashi Maeda, Kamakura (JP)

(73) Assignee: Kioxia Corporation, Tokyo (JP)

( * ) Notice: Subject to any disclaimer, the term of this patent is extended or adjusted under 35 U.S.C. 154(b) by 401 days.

(21) Appl. No.: 17/930,300

(22) Filed: Sep. 7, 2022

(65) Prior Publication Data

US 2023/0122500 A1 Apr. 20, 2023

(30) Foreign Application Priority Data

Oct. 20, 2021 (JP) ................. 2021-171853

(51) Int. Cl.
*H10B 43/40* (2023.01)
*G11C 5/06* (2006.01)
*H10B 43/23* (2023.01)
*H10B 43/35* (2023.01)

(52) U.S. Cl.
CPC ............ *H10B 43/40* (2023.02); *G11C 5/063* (2013.01); *H10B 43/23* (2023.02); *H10B 43/35* (2023.02)

(58) Field of Classification Search
CPC ........ H10B 43/40; H10B 43/23; H10B 43/35; H10B 43/27; G11C 5/063; G11C 16/24; G11C 7/18; G11C 2207/005; G11C 16/0483; G11C 16/26; H10D 89/10
See application file for complete search history.

(56) References Cited

U.S. PATENT DOCUMENTS 7,016,214 B2 * 3/2006 Kawamata .......... G11C 11/4087
257/E27.081
7,145,194 B2 * 12/2006 Nishida .................. H10B 10/00
257/E27.098

FOREIGN PATENT DOCUMENTS

JP 2020-48179 A 3/2020

* cited by examiner

Primary Examiner — Allison Bernstein
(74) Attorney, Agent, or Firm — Oblon, McClelland, Maier & Neustadt, L.L.P.

(57) ABSTRACT

According to one embodiment, in a semiconductor memory device, a gate electrode of a first PMOS transistor and a gate electrode of a first NMOS transistor are commonly connected, and a first contact plug is connected to the commonly-connected gate electrodes to at least partly overlap with an isolation portion when viewed in a third direction perpendicular to a first direction and a second direction. A gate electrode of a second PMOS transistor and a gate electrode of a second NMOS transistor are commonly connected, and a second contact plug is connected to the commonly-connected gate electrodes to at least partly overlap with the isolation portion when viewed in the third direction.

25 Claims, 33 Drawing Sheets

| WIRING LAYER | SENSE AMPLIFIER (SA) | DATA LATCH (DL) |
|---|---|---|
| THIRD LAYER | MIM WIRING LINE (MIM WIRING CAPACITOR) | X-DIRECTION WIRING LINE (GLOBAL CONTROL LINE) |
| SECOND LAYER | Y-DIRECTION WIRING LINE | Y-DIRECTION WIRING LINE |
| FIRST LAYER | X-DIRECTION WIRING LINE (GLOBAL CONTROL LINE) | X-DIRECTION WIRING LINE (LOCAL CONTROL LINE) |

| WIRING LAYER | SENSE AMPLIFIER (SA) | DATA LATCH (DL) |
|---|---|---|
| THIRD LAYER | MIM WIRING LINE (MIM WIRING CAPACITOR) | Y-DIRECTION WIRING LINE (GLOBAL CONTROL LINE) |
| SECOND LAYER | X-DIRECTION WIRING LINE | X-DIRECTION WIRING LINE |
| FIRST LAYER | Y-DIRECTION WIRING LINE (GLOBAL CONTROL LINE) | Y-DIRECTION WIRING LINE (LOCAL CONTROL LINE) |

SEMICONDUCTOR MEMORY DEVICE

CROSS-REFERENCE TO RELATED APPLICATIONS

This application is based upon and claims the benefit of priority from Japanese Patent Application No. 2021-171853, filed on Oct. 20, 2021; the entire contents of which are incorporated herein by reference.

FIELD

Embodiments described herein relate generally to a semiconductor memory device.

BACKGROUND

In a semiconductor memory device, a peripheral circuit is disposed around a memory cell array. In order to reduce the cost of the semiconductor memory device, it is desirable to reduce the layout area of the peripheral circuit.

DETAILED DESCRIPTION

Figure 1:
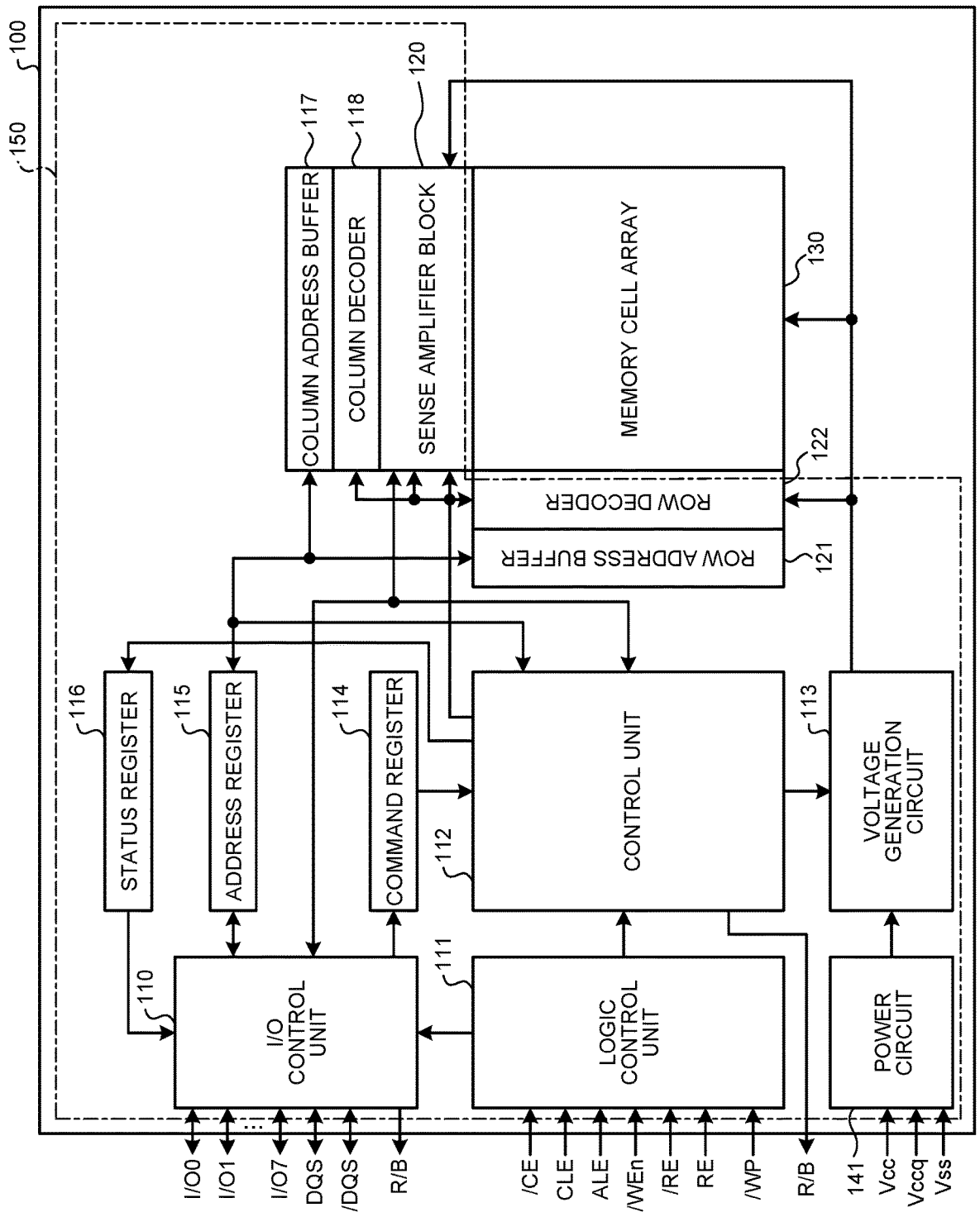
FIG. 1 is a block diagram illustrating the configuration of a semiconductor memory device according to a first embodiment.

In general, according to one embodiment, there is provided a semiconductor memory device including a substrate, a memory cell array and a peripheral circuit. The substrate has a surface extending in a first direction and a second direction perpendicular to the first direction. The memory cell array includes plural memory cells arranged. The peripheral circuit is disposed around the memory cell array. The peripheral circuit includes a sense amplifier and plural data latches. The sense amplifier is connected to the memory cell via a bit line. The plural data latches are connected to the sense amplifier via a first bus. The data latch includes plural PMOS transistors and plural NMOS transistors. The plural PMOS transistors are formed on the surface of the substrate and arranged in the first direction. The plural NMOS transistors formed on the surface of the substrate at positions adjacent to the respective plural PMOS transistors in the second direction and arranged in the first direction. The plural PMOS transistors includes a first PMOS transistor, a second PMOS transistor, a third PMOS transistor, and a fourth PMOS transistor. The plural NMOS transistors includes a first NMOS transistor, a second NMOS transistor, a third NMOS transistor, and a fourth NMOS transistor. A gate electrode of the first PMOS transistor and a gate electrode of the first NMOS transistor are commonly connected, and a first contact plug connected to the commonly-connected gate electrodes is disposed at least partly overlapping an isolation portion when viewed in a third direction perpendicular to the first direction and the second direction. A gate electrode of the second PMOS transistor and a gate electrode of the second NMOS transistor are commonly connected, and a second contact plug connected to the commonly-connected gate electrodes is disposed at least partly overlapping the isolation portion when viewed in the third direction. A third contact plug is connected to a gate electrode of the third PMOS transistor to at least partly overlap with the isolation portion when viewed in the third direction. A fourth contact plug is connected to a gate electrode of the fourth PMOS transistor to at least partly overlap with the isolation portion when viewed in the third direction. A fifth contact plug is connected to a gate electrode of the third NMOS transistor to at least partly overlap with the isolation portion when viewed in the third direction. A sixth contact plug is connected to a gate electrode of the fourth NMOS transistor to at least partly overlap with the isolation portion when viewed in the third direction.

Exemplary embodiments of a semiconductor memory device will be explained below in detail with reference to the accompanying drawings. The present invention is not limited to the following embodiments.

First Embodiment

In a semiconductor memory device according to a first embodiment, a peripheral circuit is disposed around a memory cell array. In the semiconductor memory device, a layout configuration of the peripheral circuit is devised to reduce the layout area of the peripheral circuit.

Specifically, a semiconductor memory device 100 can be configured as illustrated in FIG. 1. FIG. 1 is a block diagram illustrating the configuration of the semiconductor memory device 100. While a case where the semiconductor memory device 100 is a NAND flash memory will be described below as an example, the semiconductor memory device 100 may be another type of nonvolatile semiconductor memory (e.g., a NOR flash memory) or a volatile semiconductor memory (e.g., a dynamic random access memory (DRAM)).

The semiconductor memory device 100 includes a memory cell array 130 and a peripheral circuit 150. The peripheral circuit 150 is disposed around the memory cell array 130. The peripheral circuit 150 controls the memory cell array 130. For example, the peripheral circuit 150 reads data from the memory cell array 130 and writes data to the memory cell array 130.

The peripheral circuit 150 includes an I/O control unit 110, a logic control unit 111, a control unit 112, a voltage generation circuit 113, a command register 114, an address register 115, a status register 116, a column address buffer 117, a column decoder 118, a data register 119, a sense amplifier block 120, a row address buffer 121, a row decoder 122, a power circuit 141, and a clock generation circuit 142.

The logic control unit 111 receives inputs of various control signals via input pins (e.g., CE and ALE) for various control signals. The I/O control unit 110 executes the sorting of I/O signals into registers in which the I/O signals are to be stored, based on the control signals received by the logic control unit 111. Also, the logic control unit 111 transfers the received control signals to the control unit 112. A CE illustrated as the input pin of the logic control unit 111 is a chip enable pin of the semiconductor memory device 100.

The control unit 112 includes a state transition circuit (state machine) that transitions the state based on the various control signals received via the logic control unit 111 and controls the operation of the entire semiconductor memory device 100.

The I/O control unit 110 is a buffer circuit for transmitting and receiving, to and from a controller (not illustrated), an I/O signal and a strobe signal via I/O signal pins I/O0 to I/O7 and strobe pins DQS and /DQS. A command, an address, and data (write data) captured by the I/O control unit 110 as I/O signals via the I/O signal pins I/O0 to I/O7 are sorted and stored in an address register 115, a command register 114, and a data register 119, respectively.

The power circuit 141 receives, for example, power supply voltages Vcc, Vccq, and Vss from the controller via a power supply pin, and supplies these voltages to respective units of the semiconductor memory device 100. The power supply voltage Vccq is, for example, a power supply voltage used in the operation of the I/O control unit 110. The power supply voltage Vss is, for example, a ground voltage.

The control unit 112 indicates a value of voltage to be generated and a power supply timing to the voltage generation circuit 113. The control unit 112 transmits a ready/busy signal R/B to the controller.

The voltage generation circuit 113 generates a voltage in accordance with the control of the control unit 112. The voltage generation circuit 113 supplies the generated voltage to the memory cell array 130, the row decoder 122, and the sense amplifier block 120.

The status register 116 stores therein, for example, status information indicating whether writing to the memory cell array 130 has succeeded and status information indicating whether erasure to the memory cell array 130 has succeeded. The I/O control unit 110 transmits, to the controller, these pieces of status information as response signals.

The memory cell array 130 includes plural memory cells arranged and stores therein write data from the controller.

Figure 2:
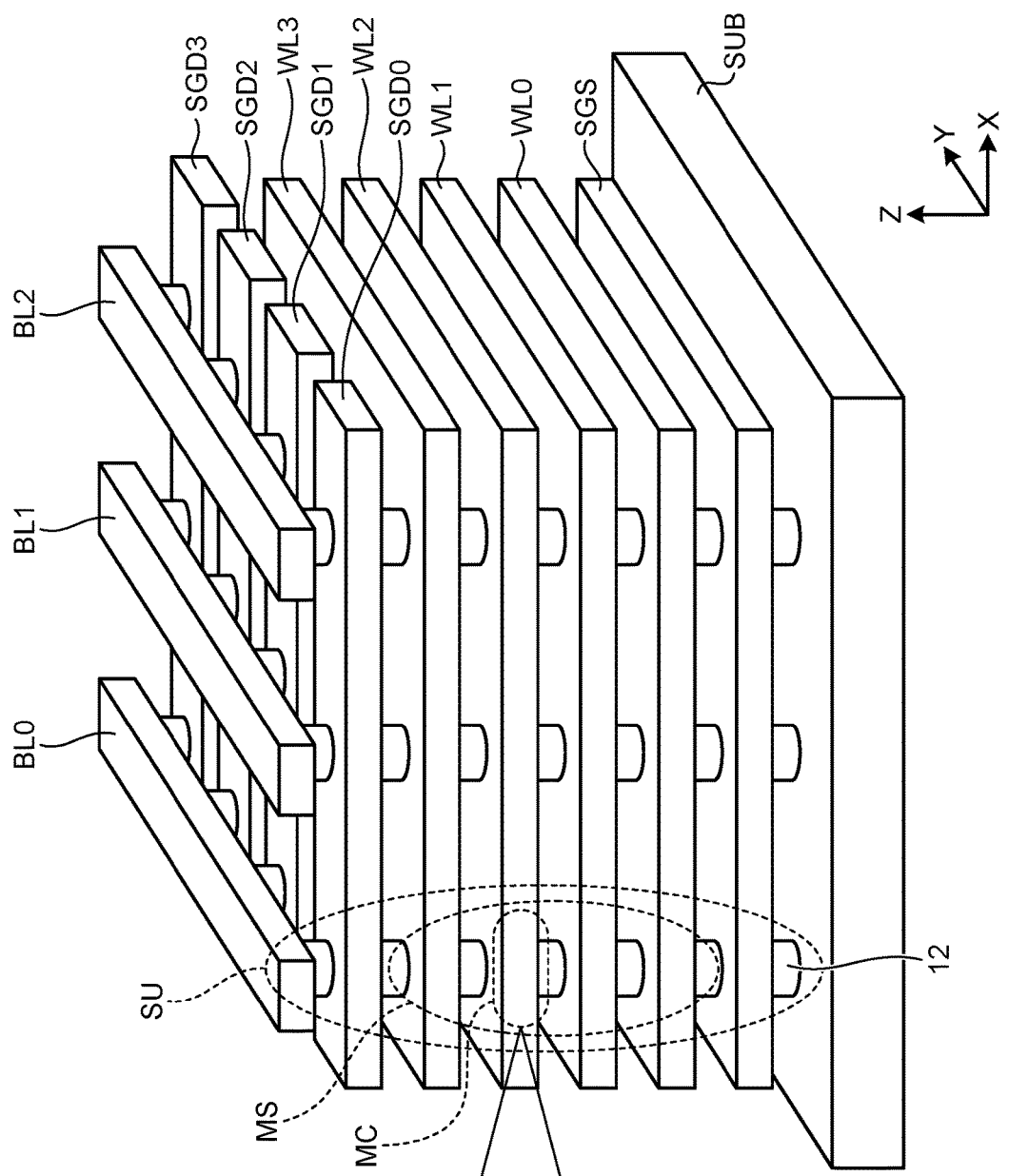
FIGS. 2A and 2B are perspective views illustrating the configuration of a memory cell array in the first embodiment.

The row decoder 122, the column decoder 118, and the sense amplifier block 120 make access to the memory cell array 130 in accordance with the control of the control unit 112. The row decoder 122 selects a word line corresponding to a row address and activates the selected word line. The column decoder 118 selects a bit line corresponding to a column address and activates the selected bit line. The sense amplifier block 120 applies voltage to the bit line selected by the column decoder 118 and writes data stored in the data register 119 to a memory cell transistor located at an intersection point between the word line selected by the row decoder 122 and the bit line selected by the column decoder 118. Also, the sense amplifier block 120 reads data stored in the memory cell transistor located at the intersection point between the word line selected by the row decoder 122 and the bit line selected by the column decoder 118 via the bit line and stores the read data in the data register 119. The data stored in the data register 119 is transmitted to the I/O control unit 110 via a data line and transferred from the I/O control unit 110 to the outside (e.g., the controller). FIGS. 2A and 2B are diagrams illustrating the configuration of the memory cell array 130. FIG. 2A is a perspective view illustrating the schematic configuration of the memory cell array 130, and FIG. 2B is a cross-secitional view illustrating the schematic configuration of a part of FIG. 2A corresponding to a memory cell MC. Hereinbelow, a direction in which a bit line BL extends is referred to as a Y direction, a direction perpendicular to the surface of a substrate SUB is referred to as a Z direction, and a direction perpendicular to the Y direction and the Z direction is referred to as an X direction.

Note that an example of FIG. 2A illustrates a configuration in which four layers of memory cells MC are stacked in the Z direction, and the four memory cells MC are connected in series to constitute a memory string MS. In FIG. 2A, for the sake of simplification, an interlayer insulating film formed between impurity-doped silicon layers 2 with a diffusion-proof layer 3 interposed therebetween is omitted.

In FIG. 2A, a source-side select gate electrode SGS is formed on the substrate SUB. Note that a conductive layer may be used instead of the substrate SUB. Plural layers of word lines is stacked on the source-side select gate electrode SGS. FIG. 2A illustrates an example in which four layers of word lines WL0 to WL3 are staked in the Z direction. Drain-side select gate electrodes SGD0 to SGD3 are formed on the word line WL3 of the uppermost layer.

The source-side select gate line SGS, the word lines WL0 to WL3, and the drain-side select gate lines SGD0 to SGD3 each extend in the X direction. This extending direction (X direction) may be referred to as the "row" direction. The row direction is perpendicular to a stacking direction of the source-side select gate line SGS, the word lines WL0 to WL3, and the drain-side select gate lines SGD0 to SGD3 (Z direction).

A columnar body 12 penetrates the drain-side select gate lines SGD0 to SGD3, the word lines WL0 to WL3, and the source-side select gate line SGS in the Z direction. Each of the drain-side select gate electrodes SGD0 to SGD3 constitutes a string unit SU. That is, the string unit SU is a unit that includes plural memory strings MS arranged in the row direction (X direction) and selectively accessible by the corresponding one of the drain-side select gate lines SGD0 to SGD3.

Bit lines BL<0> to BL2 are formed on the drain-side select gate electrodes SGD0 to SGD3. An extending direction of the bit lines BL<0> to BL2 (Y direction) may be referred to as the "column direction". The column direction is perpendicular to the stacking direction of the source-side select gate line SGS, the word lines WL0 to WL3, and the drain-side select gate lines SGD0 to SGD3 (Z direction) and perpendicular to the row direction. The columnar body 12 extends, for example, from the substrate SUB to the bit lines BL<0> to BL2.

The columnar body 12 is formed inside a through hole 4 penetrating the source-side select gate electrode SGS, the word lines WL0 to WL3, and the drain-side select gate lines SGD0 to SGD3. A columnar insulator 11 is formed on the center of the columnar body 12. For example, a silicon oxide film can be used as the material of the columnar insulator 11.

The columnar insulator 11 is formed on the center of the columnar body 12. For example, a silicon oxide film can be used as the material of the columnar insulator 11. A channel layer 7 is formed between the outer face of the columnar insulator 11 and the inner face of the through hole 4. A tunnel insulating film 8 is formed between the inner face of the through hole 4 and the channel layer 7. A charge trap layer 9 is formed between the inner face of the through hole 4 and the tunnel insulating film 8. A block insulating film 6 is formed between the inner face of the through hole 4 and the charge trap layer 9. For example, the channel layer 7, the tunnel insulating film 8, the charge trap layer 9, and the block insulating film 6 are each configured to penetrate the source-side select gate electrode SGS, the word lines WL0 to WL3, and the drain-side select gate lines SGD0 to SGD3. For example, a semiconductor such as Si can be used as the channel layer 7. For example, a silicon oxide film can be used as the tunnel insulating film 8 and the block insulating film 6. For example, a silicon nitride film or an ONO film (having a three-layer structure of a silicon oxide film/a silicon nitride film/a silicon oxide film) can be used as the charge trap layer 9.

Note that, while the configuration in which the four layers of memory cells MC are stacked has been described with reference to FIGS. 2A and 2B, n (n is an integer equal to or greater than 2) layers of memory cells MC may be stacked.

Also, while the method of forming the columnar insulator 11 on the center of the columnar body 12 penetrating the source-side select gate electrode SGS, the word lines WL0 to WL3, and the drain-side select gate lines SGD0 to SGD3 has been described in the embodiment of FIGS. 2A and 2B, a columnar semiconductor may be embedded instead of the columnar insulator 11.

Figure 3:
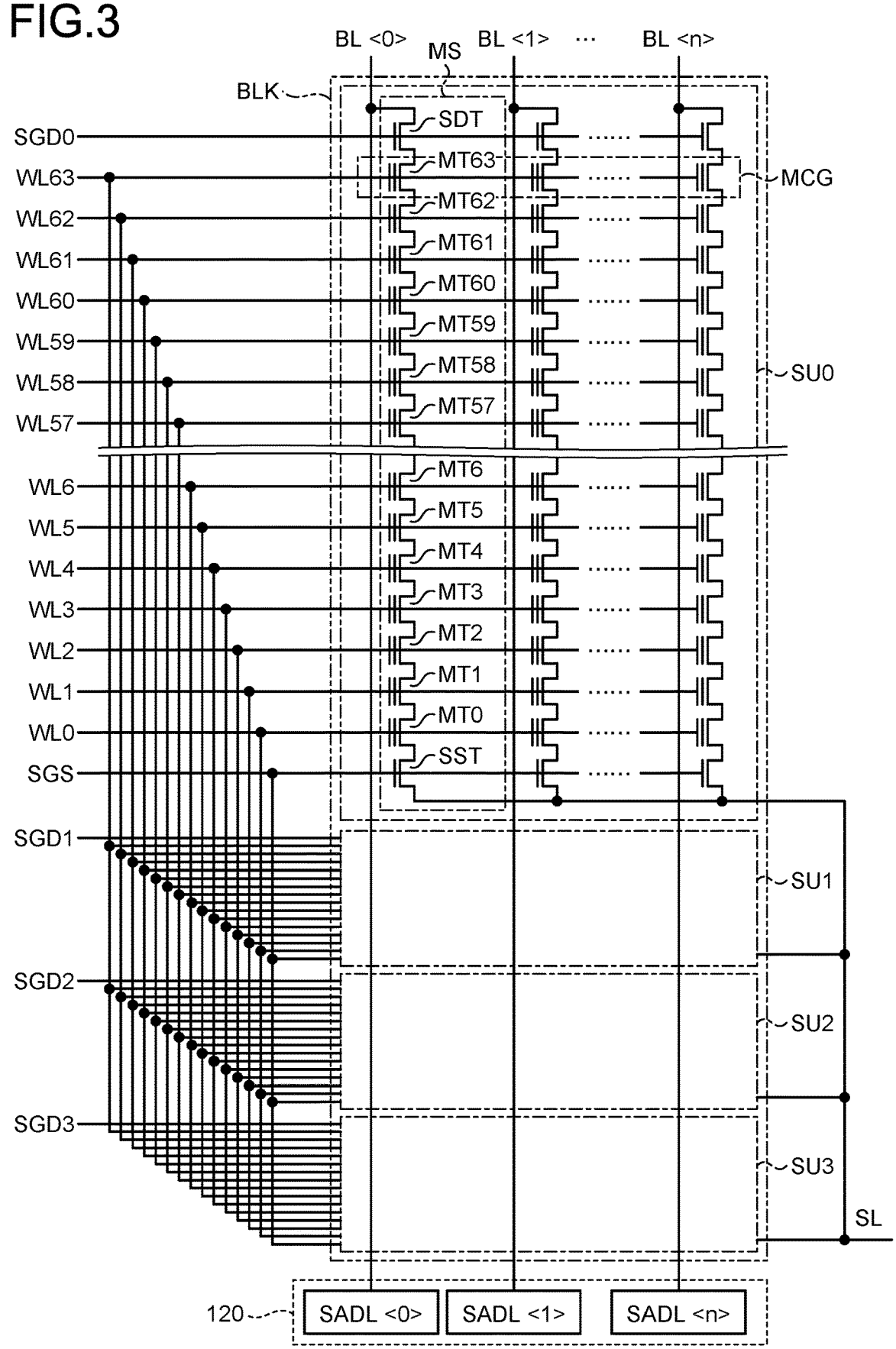
FIG. 3 is a circuit diagram illustrating the configuration of the memory cell array in the first embodiment.

The memory cell array 130 includes plural blocks. Each of the blocks includes memory cells at intersection positions between plural word lines and plural bit lines that intersect each other with a space therebetween. FIG. 3 is a circuit diagram illustrating a configuration example of one block.

A block BLK includes plural string units SU0 to SU3. The string units SU0 to SU3 correspond one-to-one to the drain-side select gate lines SGD0 to SGD3 and share the source-side select gate line SGS. The string units SU0 to SU3 are selectively accessible by the drain-side select gate lines SGD0 to SGD3, respectively. Also, each of the string units SU0 to SU3 includes plural memory strings MS.

Each of the memory strings MS includes, for example, 64 memory cell transistors MT (MT0 to MT63) and selection transistors SDT and SST. The memory cell transistor MT includes a control gate and a charge storage film, and holds data in a nonvolatile manner. The 64 memory cell transistors MT (MT0 to MT63) are connected in series between a source of the selection transistor SDT and a drain of the selection transistor SST. Note that the number of memory cell transistors MT in the memory string MS is not limited to 64.

Bit lines BL<0> to BL<n> (referred to as "BLs" when the bit lines are not distinguished from each other) are connected to the memory strings MS. When the selection transistor SDT is turned on, a channel area of each of the memory cell transistors MT in the memory string MS can be electrically connected to the bit line BL. Among plural sense amplifier circuits SADL<0> to SADL<n> in the sense amplifier block 120, the corresponding sense amplifier SA is connected to each of the bit lines BL.

Each of the word lines WL0 to WL63 (referred to as "WLs" when the word lines are not distinguished from each other) commonly connects control gates of the memory cell transistors MT between the memory strings MS in each string unit SU in the physical block BLK. That is, in each string unit SU in the physical block BLK, the control gates of the memory cell transistors MT located in each row are connected to the same word line WL. That is, the string unit SU of the physical block BLK includes plural memory cell groups MCG corresponding one-to-one to plural word lines WL, and each of the memory cell groups MCG includes (n+1) memory cell transistors MT connected to the same word line WL. When each memory cell transistor MT is configured to be capable of holding a 1-bit value (operating in a single-level cell (SLC) mode), the (n+1) memory cell transistors MT connected to the same word line WL (that is, the memory group MCG) are treated as one physical page, and a data writing process and a data reading process are performed on a physical page by physical page basis.

Each memory cell transistor MT may be configured to be capable of holding a multiple-bit value. For example, when each memory cell transistor MT is capable of storing a p-bit value (p≥2), a storage capacity per word line WL is equal to the size of p physical pages. That is, each memory cell group MCG is treated as p physical pages. For example, in a multi-level cell (MLC) mode in which each memory cell transistor MT stores a 2-bit value, each word line WL holds data for two physical pages. Alternatively, in a triple-level cell (TLC) mode in which each memory cell transistor MT stores a 3-bit value, each word line WL holds data for three physical pages.

Figure 4:
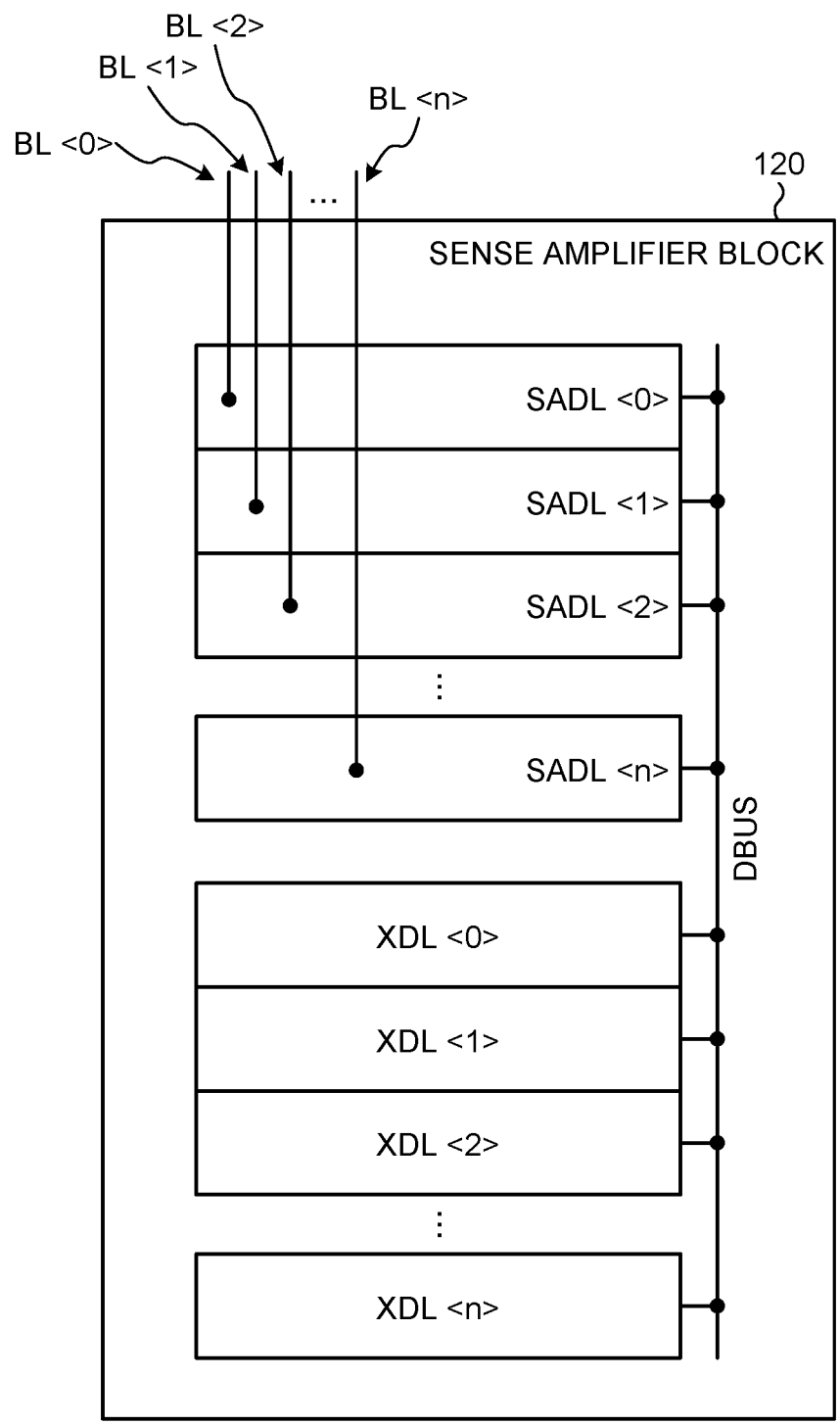
FIG. 4 is a circuit diagram illustrating the schematic configuration of a sense amplifier block in the first embodiment.

As illustrated in FIG. 4, the sense amplifier block 120 includes plural sense amplifier circuits SADL<0> to SADL<n> and plural input/output data latches XDL<0> to XDL<n>. FIG. 4 is a circuit diagram illustrating the configuration of the sense amplifier block 120.

The sense amplifier circuits SADL<0> to SADL<n> correspond one-to-one to the bit lines BL<0> to BL<n>. To each sense amplifier circuit SADL, the corresponding bit line BL is connected. The plural sense amplifier circuit SADL<0> to SADL<n> and the plural input/output data latches XDL<0> to XDL<n> are connected via a data bus DBUS.

The plural input/output data latches XDL<0> to XDL<n> is connected to the I/O control unit 110 (refer to FIG. 1). The input/output data latches XDL<0> to XDL<n> correspond one-to-one to the sense amplifier circuits SADL<0> to SADL<n>. Each input/output data latch XDL functions as an input/output buffer for the corresponding sense amplifier circuit SADL.

When each sense amplifier circuit SADL detects data read to the corresponding bit line BL, for example, at a read operation, the sense amplifier circuit SADL holds the detected data. Each sense amplifier circuit SADL transfers the read data to the corresponding input/output data latch XDL via the data bus line DBUS. The input/output data latch XDL outputs the data to the outside (e.g., the controller) via the I/O control unit 110 and the I/O signal pin I/O.

Figure 5:
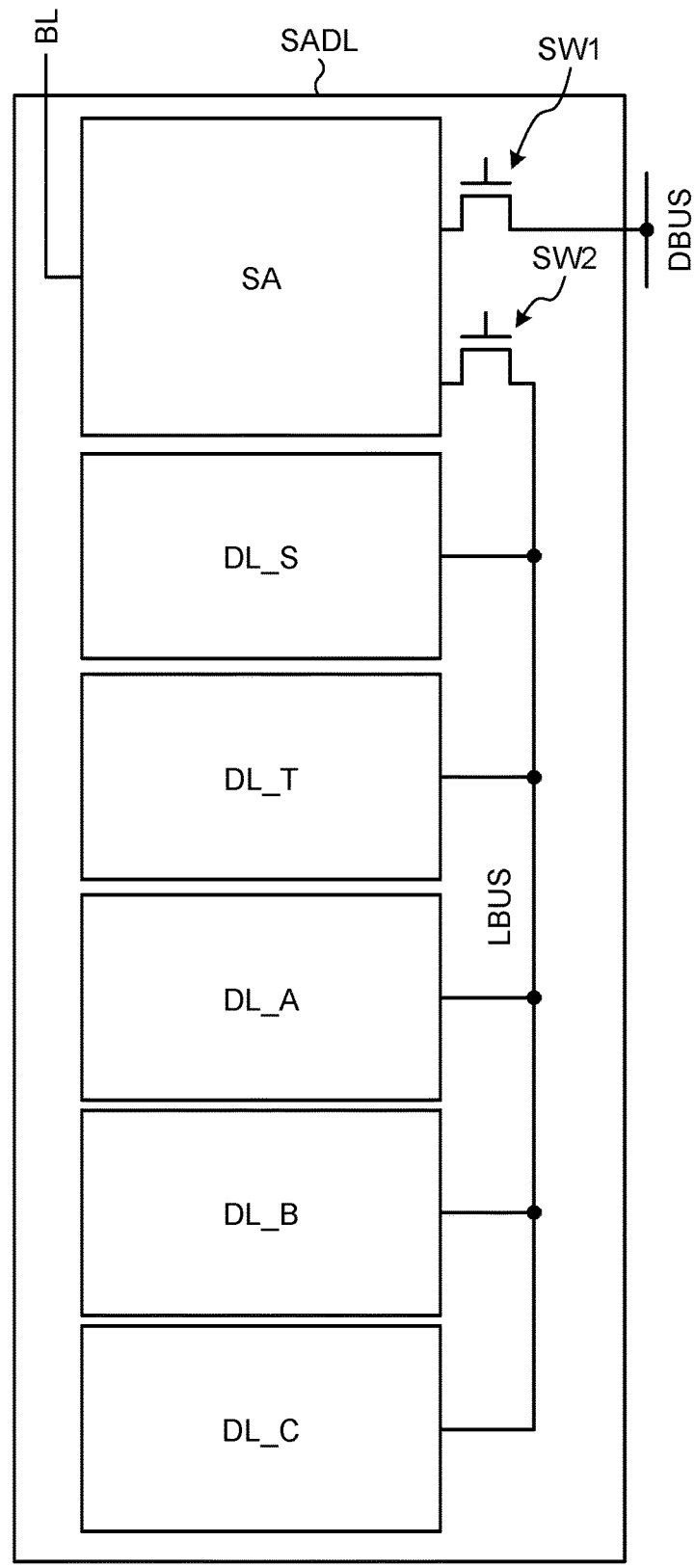
FIG. 5 is a circuit diagram illustrating the schematic configuration of a sense amplifier circuit in the first embodiment.

As illustrated in FIG. 5, each sense amplifier circuit SADL includes a sense amplifier SA, and plural data latches DL_S, DL_T, DL_A, DL_B, and DL_C. FIG. 5 is a circuit illustrating the configuration of the sense amplifier circuit SADL.

The sense amplifier SA is connected to the memory cells MT0 to MT63 in one column (refer to FIG. 3) via the bit line BL. The sense amplifier SA is connected to the other sense amplifier circuits SADL and the input/output data latches XDL via a switch SW1 and the data bus DBUS. The switch SW1 is turned on when a control terminal receives an active-level control signal to connect the sense amplifier SA to the data bus DBUS and turned off when the control terminal receives a nonactive-level signal to isolate the sense amplifier SA from the data bus DBUS. Note that the switch SW1 may be omitted.

The plural data latches DL_S, DL_T, DL_A, DL_B, and DL_C is connected to the sense amplifier SA via a local bus LBUS and a switch SW2. The switch SW2 is turned on when a control terminal receives an active-level control signal to connect the sense amplifier SA to the local bus LBUS and turned off when the control terminal receives a nonactive-level control signal to isolate the sense amplifier SA from the local bus LBUS. Note that the switch SW2 may be omitted. Hereinbelow, each of the data latches DL_S, DL_T, DL_A, DL_B, and DL_C is merely referred to as the data latch DL when these data latches are not distinguished from each other.

The sense amplifier SA includes a node SEN for sensing. At a read operation, the sense amplifier SA precharges the node SEN to a predetermined H level before receiving a signal from the bit line BL and detects whether the node SEN is maintained at the H level or lowered to an L level in response to the signal from the bit line BL. Accordingly, the sense amplifier SA detects whether a value of data read to the bit line BL is 0 or 1.

Figure 6:
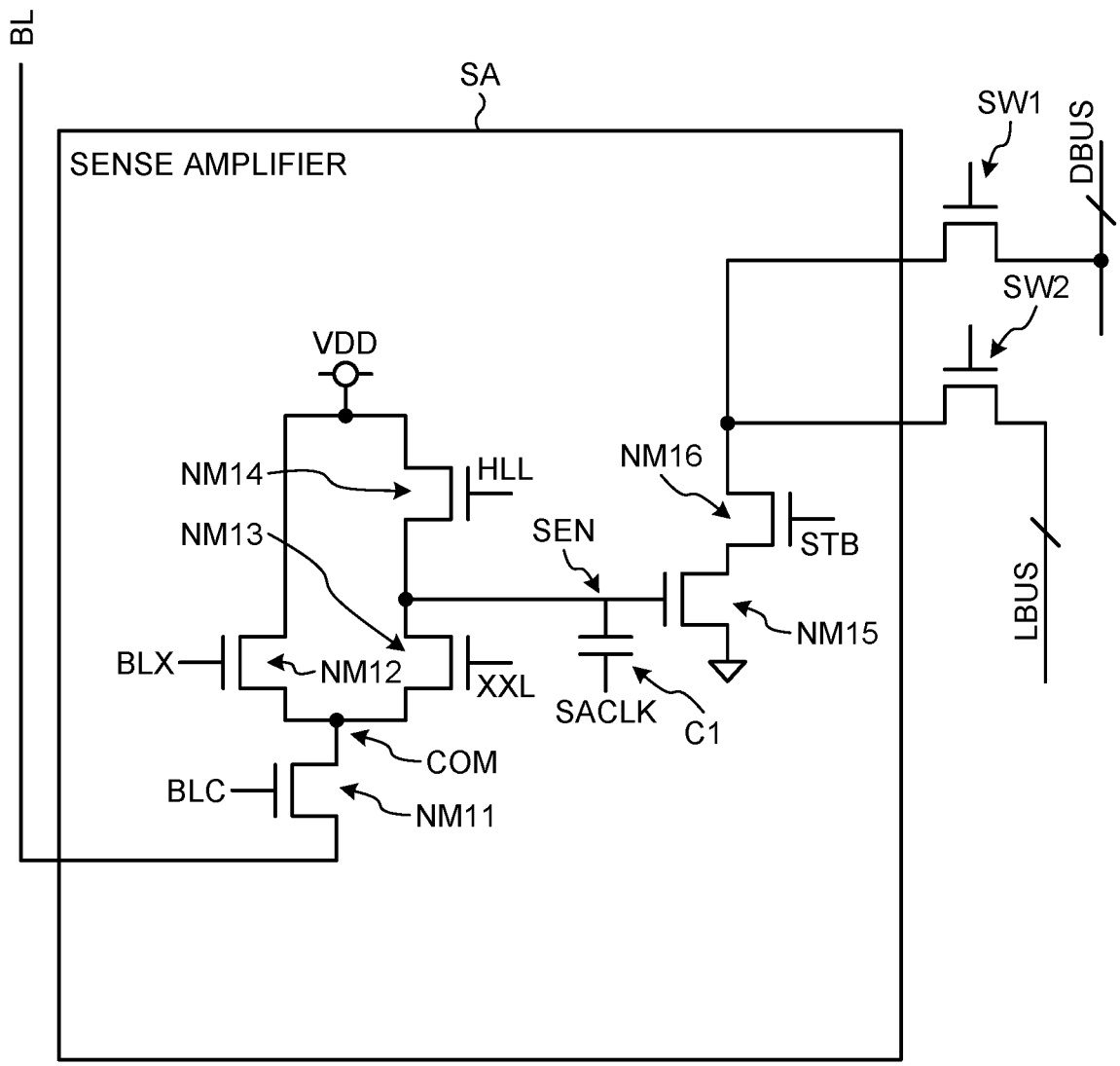
FIG. 6 is a circuit diagram illustrating the configuration of a sense amplifier in the first embodiment.

As illustrated in FIG. 6, the sense amplifier SA includes plural transistors NM11 to NM16 and a capacitive element C1. FIG. 6 is a circuit diagram illustrating the configuration of the sense amplifier SA.

The transistor NM11 is, for example, an NMOS transistor. The transistor NM11 has a source connected to the bit line BL, a drain connected to a node COM, and a gate that receives a control signal BLC.

The transistor NM12 is, for example, an NMOS transistor. The transistor NM12 has a source connected to the node COM, a drain connected to a power supply potential VDD, and a gate that receives a control signal BLX.

The transistor NM13 is, for example, an NMOS transistor. The transistor NM13 has a source connected to the node COM, a drain connected to the node SEN, and a gate that receives a control signal XXL.

The transistor NM14 is, for example, an NMOS transistor. The transistor NM14 has a source connected to the node COM, a drain connected to the node SEN, and a gate that receives a control signal HLL.

The capacitive element C1 has one end connected to the node SEN and the other end that receives a clock signal SACLK for the sense amplifier.

The transistor NM15 is, for example, an NMOS transistor. The transistor NM15 has a source connected to a ground potential, a drain connected to the transistor NM16, and a gate connected to the node SEN.

The transistor NM16 is, for example, an NMOS transistor. The transistor NM16 has a source connected to the transistor NM15, a drain connected to the switch SW1 and the switch SW2, and a gate that receives a control signal STB.

Figure 7:
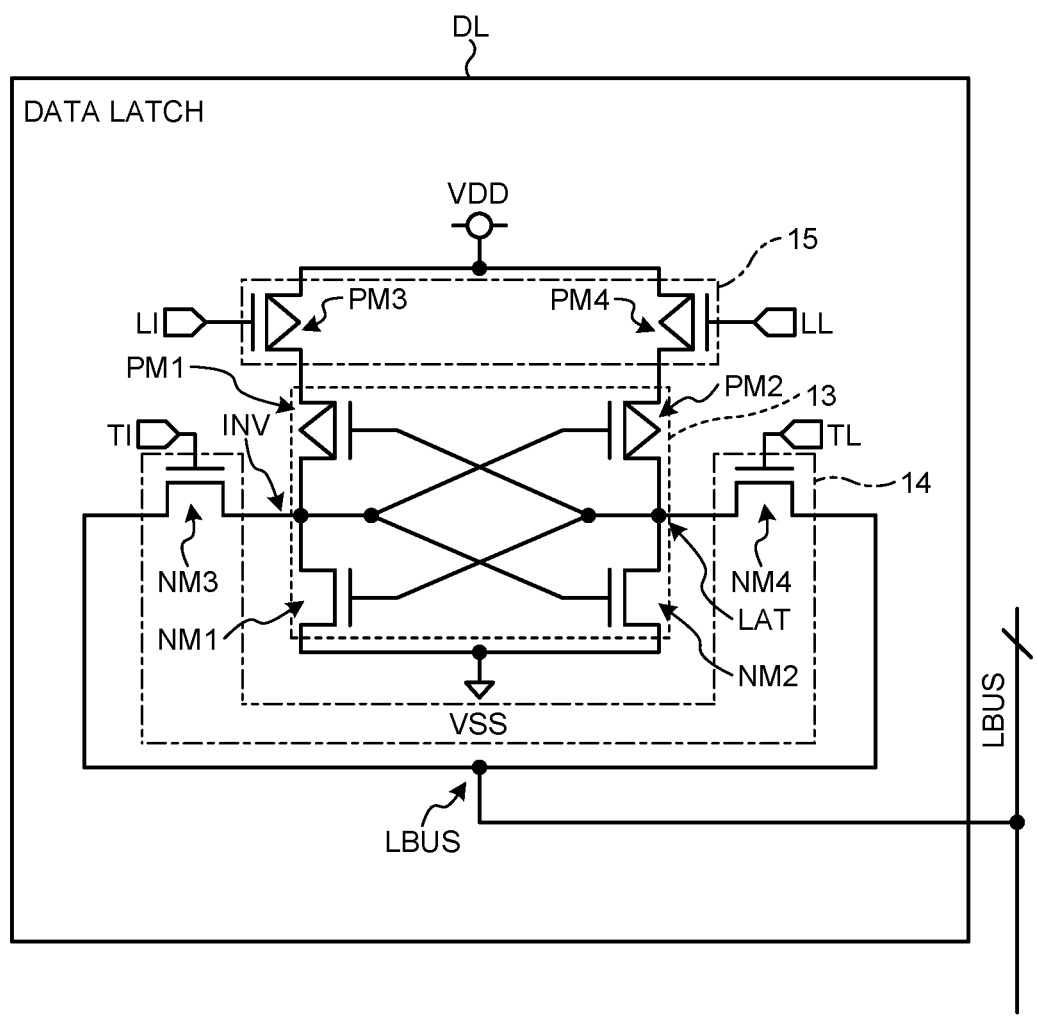
FIG. 7 is a circuit diagram illustrating the configuration of a data latch in the first embodiment.

As illustrated in FIG. 7, the data latch DL includes a latch unit 13, an input/output unit 14, and a load unit 15. FIG. 7 is a circuit diagram illustrating the configuration of the data latch DL. The latch unit 13 is electrically connected between the ground potential and the load unit 15. The input/output unit 14 is electrically connected between the latch unit 13 and the local bus LBUS. The load unit 15 is electrically connected between the power supply potential VDD and the latch unit 13. The latch unit 13 latches data input thereto from the local bus LBUS via the input/output unit 14 and outputs the latched data to the local bus LBUS via the input/output unit 14. At this time, the load unit 15 drives the input and output of data performed by the latch unit 13.

As illustrated in FIG. 7, the data latch DL may be an 8-transitsor type data latch. The data latch DL includes plural transistors NM1 to NM4 and PM1 to PM4.

The transistor NM1 is, for example, an NMOS transistor. The transistor NM1 has a source connected to a ground potential VSS, a drain connected to a node INV, and a gate connected to a node LAT and a gate of the transistor PM1.

The transistor PM1 is, for example, a PMOS transistor. The transistor PM1 has a source connected to the transistor PM3, a drain connected to the node INV, and a gate connected to the node LAT and the gate of the transistor NM1. That is, the transistor NM1 and the transistor PM1 are inverter-connected.

The transistor NM2 is, for example, an NMOS transistor. The transistor NM2 has a source connected to the ground potential VSS, a drain connected to the node LAT, and a gate connected to the node INV and a gate of the transistor PM2.

The transistor PM2 is, for example, a PMOS transistor. The transistor PM2 has a source connected to the transistor PM4, a drain connected to the node LAT, and a gate connected to the node INV and the gate of the transistor NM2. That is, the transistor NM2 and the transistor PM2 are inverter-connected.

A configuration including the transistors NM1, PM1, NM2, and PM2 functions as the latch unit 13.

The transistor NM3 is, for example, an NMOS transistor. The transistor NM3 has a source connected to the local bus LBUS, a drain connected to the node INV, and a gate connected to a control node TI that receives a control signal TI.

The transistor NM4 is, for example, an NMOS transistor. The transistor NM4 has a source connected to the local bus LBUS, a drain connected to the node LAT, and a gate connected to a control node TL that receives a control signal TL.

A configuration including the transistors NM3 and NM4 functions as the input/output unit 14.

The transistor PM3 is, for example, a PMOS transistor. The transistor PM3 has a source connected to the power supply potential VDD, a drain connected to the transistor PM1, and a gate connected to a control node LI that receives a control signal LI.

The transistor PM4 is, for example, a PMOS transistor. The transistor PM4 has a source connected to the power supply potential VDD, a drain connected to the transistor PM2, and a gate connected to a control node LL that receives a control signal LL.

A configuration including the transistors PM3 and PM4 functions as the load unit 15.

Note that, while FIG. 7 illustrates, as an example, the circuit configuration of the data latch DL, a circuit of the input/output data latch XDL can be configured similarly to the data latch DL of FIG. 7 or at least a part of the circuit of the input/output data latch XDL can be configured similarly to the data latch DL of FIG. 7. For example, in the input/output data latch XDL, the node LBUS of FIG. 7 is connected to the data bus DBUS (refer to FIG. 4), and a connection switch may be additionally provided between the node LBUS and the data bus DBUS.

Figure 8:
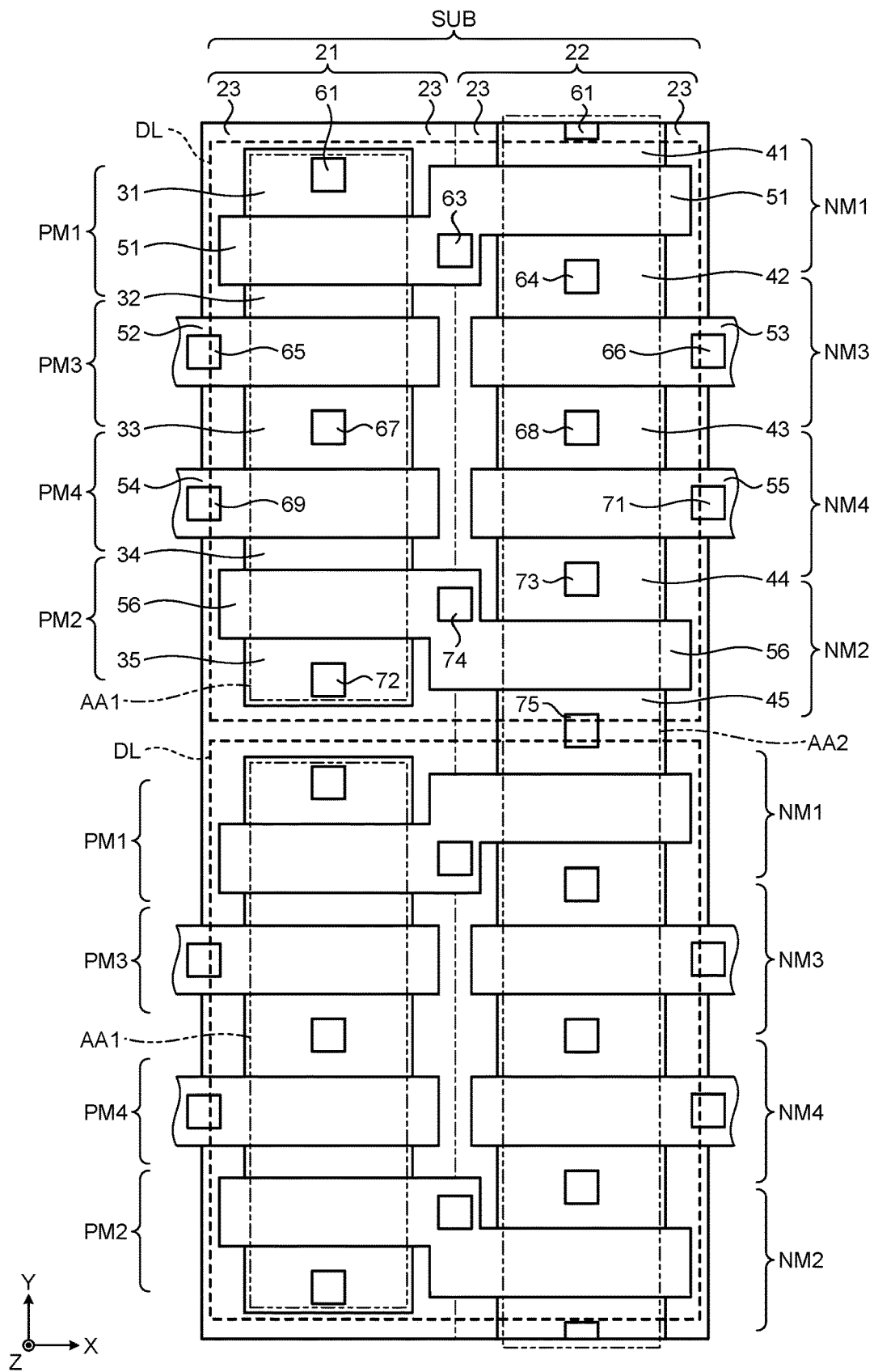
FIG. 8 is a plan view illustrating the layout configuration of the data latch in the first embodiment.

The data latch DL illustrated in FIG. 7 can be laid out as illustrated in FIG. 8. FIG. 8 is a plan view illustrating the layout configuration of the data latch DL. As indicated by dotted lines, two data latches adjacent to each other in the Y direction are illustrated as an example. While the data latch DL on the +Y side will be mainly described below, the same applies to the other data latch DL.

The substrate SUB has, inside thereof, a well region 21 and a well region 22. The well region 21 is disposed at a Z position deeper than the surface of the substrate SUB and extends in the Y direction in the XY plane view. The well region 21 is a semiconductor region containing impurities of a first conductive type (e.g., N type). The well region 22 is disposed at a Z position deeper than the surface of the substrate SUB and extends in the Y direction in the XY plane view. The well region 22 is a semiconductor region containing impurities of a second conductive type (e.g., P type) which is a conductive type opposite to the first conductive type. The X-direction width of the well region 21 and the X-direction width of the well region 22 are substantially equal to each other. The well region 21 is provided for forming a device of the second conductive type (e.g., a PMOS transistor) near the surface of the substrate SUB. The well region 22 is provided for forming a device of the first conductive type (e.g., an NMOS transistor) near the surface of the substrate SUB.

A portion near the surface (+Z-side face) inside the substrate SUB is electrically isolated by an isolation portion 23, and an active region AA1 and an active region AA2 are defined. The isolation portion 23 is of, for example, the shallow trench isolation (STI) type. The isolation portion 23 can be formed of an insulator such as semiconductor oxide.

The active region AA1 is disposed on the +Z side of the well region 21. The active region AA1 is isolated from the active region AA1 of the data latch DL adjacent thereto in the Y direction with the isolation portion 23 interposed therebetween. The active region AA1 is a semiconductor region of the second conductive type (e.g., P type). The active region AA1 contains impurities of the second conductive type at a concentration higher than the impurity concentration in the well region 22. The active region AA1 is surrounded by the isolation portion 23 when viewed in the Z direction.

The active region AA2 is disposed on the +Z side of the well region 22. The active region AA2 is contiguous with the active region AA1 of the data latch DL adjacent thereto in the Y direction. The active region AA2 is a semiconductor region of the first conductive type. The active region AA2 contains impurities of the first conductive type at a concentration higher than the impurity concentration in the well region 21. The active region AA2 is surrounded by the isolation portion 23 when viewed in the Z direction.

A gate electrode 51 is disposed on the surface of the substrate SUB with a gate insulating film (not illustrated) interposed therebetween. When viewed in the Z direction, the gate electrode 51 extends in the +X direction across the active region AA1, extends in the +Y direction in the region of the isolation portion 23 between the active regions AA1 and AA2, and extends in the +X direction across the active region AA2. While the gate electrode 51 can be formed of a semiconductor (e.g., polysilicon) containing impurities, the material of the gate electrode is not limited thereto.

A portion of the gate electrode 51 overlapping the active region AA1 functions as the gate of the transistor PM1 (refer to FIG. 7). A semiconductor region 31 located on the +Y side of the gate electrode 51 in the active region AA1 functions as the drain of the transistor PM1. A semiconductor region 32 located on the −Y side of the gate electrode 51 in the active region AA1 functions as the source of the transistor PM1.

A portion of the gate electrode 51 overlapping the active region AA2 functions as the gate of the transistor NM1 (refer to FIG. 7). A semiconductor region 41 located on the +Y side of the gate electrode 51 in the active region AA2 functions as the source of the transistor NM1. A semiconductor region 42 located on the −Y side of the gate electrode 51 in the active region AA2 functions as the drain of the transistor NM1.

A portion of a gate electrode 56 overlapping the active region AA1 functions as the gate of the transistor PM2 (refer to FIG. 7). A semiconductor region 34 located on the +Y side of the gate electrode 56 in the active region AA1 functions as the source of the transistor PM2. A semiconductor region 35 located on the −Y side of the gate electrode 56 in the active region AA1 functions as the drain of the transistor PM2.

A portion of the gate electrode 56 overlapping the active region AA2 functions as the gate of the transistor NM2 (refer to FIG. 7). A semiconductor region 44 located on the +Y side of the gate electrode 56 in the active region AA2 functions as the drain of the transistor NM2. A semiconductor region 42 located on the −Y side of the gate electrode 51 in the active region AA2 functions as the source of the transistor NM2.

A portion of a gate electrode 52 overlapping the active region AA1 functions as the gate of the transistor PM3 (refer to FIG. 7). The semiconductor region 32 located on the +Y side of the gate electrode 52 in the active region AA1 functions as the drain of the transistor PM3. A semiconductor region 33 located on the −Y side of the gate electrode 51 in the active region AA1 functions as the source of the transistor PM3.

A portion of a gate electrode 53 overlapping the active region AA2 functions as the gate of the transistor NM3 (refer to FIG. 7). The semiconductor region 42 located on the +Y side of the gate electrode 53 in the active region AA2 functions as the drain of the transistor NM3. A semiconductor region 43 located on the −Y side of the gate electrode 53 in the active region AA2 functions as the source of the transistor NM3.

A portion of a gate electrode 54 overlapping the active region AA1 functions as the gate of the transistor PM4 (refer to FIG. 7). The semiconductor region 33 located on the +Y side of the gate electrode 54 in the active region AA1 functions as the source of the transistor PM3. The semiconductor region 34 located on the −Y side of the gate electrode 54 in the active region AA1 functions as the drain of the transistor PM3.

A portion of a gate electrode 55 overlapping the active region AA2 functions as the gate of the transistor NM4 (refer to FIG. 7). The semiconductor region 43 located on the +Y side of the gate electrode 55 in the active region AA2 functions as the source of the transistor NM3. The semiconductor region 44 located on the −Y side of the gate electrode 55 in the active region AA2 functions as the drain of the transistor NM3.

A contact plug 63 to upper layer wiring is connected to the gate electrode 51 in the region of the isolation portion 23 between the active regions AA1 and AA2. The contact plug 63 corresponds to the node LAT (refer to FIG. 7).

A contact plug 74 to the upper layer wiring is connected to the gate electrode 56 in the region of the isolation portion 23 between the active regions AA1 and AA2. The contact plug 74 corresponds to the node INV.

A contact plug 65 to the upper layer wiring is connected to the gate electrode 52 in the region of the isolation portion 23 between the active region AA1 and the active region AA2 of the data latch DL adjacent to the active region AA1 on the −X side of the active region AA1. The control signal LI (refer to FIG. 7) is fed to the contact plug 65.

A contact plug 66 to the upper layer wiring is connected to the gate electrode 53 in the region of the isolation portion 23 between the active region AA2 and the active region AA1 of the data latch DL adjacent to the active region AA2 on the +X side of the active region AA2. The control signal TI (refer to FIG. 7) is fed to the contact plug 66.

A contact plug 69 to the upper layer wiring is connected to the gate electrode 54 in the region of the isolation portion 23 between the active region AA1 and the active region AA2 of the data latch DL adjacent to the active region AA1 on the −X side of the active region AA1. The control signal LL (refer to FIG. 7) is fed to the contact plug 69.

A contact plug 71 to the upper layer wiring is connected to the gate electrode 55 in the region of the isolation portion 23 between the active region AA2 and the active region AA1 of the data latch DL adjacent to the active region AA2 on the +X side of the active region AA2. The control signal TL (refer to FIG. 7) is fed to the contact plug 71.

A contact plug 61 to the upper layer wiring is connected to the semiconductor region 31. The contact plug 61 corresponds to the node INV (refer to FIG. 7).

A contact plug 62 to the upper layer wiring is connected to the semiconductor region 41. The contact plug 62 corresponds to the ground node VSS (refer to FIG. 7).

A contact plug 64 to the upper layer wiring is connected to the semiconductor region 42. The contact plug 64 corresponds to the node INV (refer to FIG. 7).

A contact plug 67 to the upper layer wiring is connected to the semiconductor region 33. The contact plug 67 corresponds to the power supply node VDD (refer to FIG. 7).

A contact plug 68 to the upper layer wiring is connected to the semiconductor region 43. The contact plug 68 corresponds to the node LBUS connected to the local bus LBUS (refer to FIG. 7).

A contact plug 72 to the upper layer wiring is connected to the semiconductor region 35. The contact plug 72 corresponds to the node LAT (refer to FIG. 7).

A contact plug 73 to the upper layer wiring is connected to the semiconductor region 44. The contact plug 73 corresponds to the node LAT (refer to FIG. 7).

A contact plug 75 to the upper layer wiring is connected to the semiconductor region 45. The ground potential VSS (refer to FIG. 7) is fed to the contact plug 75.

In the data latch DL, the transistors PM1 to PM4, each of which is, for example, a PMOS transistor, are disposed in the order of the transistor PM1, the transistor PM3, the transistor PM4, and the transistor PM2 in the −Y direction. The transistors NM1 to NM4, each of which is, for example, an NMOS transistor, are disposed in the order of the transistor NM1, the transistor NM3, the transistor NM4, and the transistor NM2 in the −Y direction.

The positional relationship between the plural transistors PM1 to PM4 and the plural transistors NM1 to NM4 is the same between the two data latches DL disposed adjacent to each other in the Y direction. In the case of FIG. 8, in the data latch DL on the +Y side, the plural transistors NM1 to NM4 is disposed on the +X side of the plural transistors PM1 to PM4. In the data latch DL on the −Y side, the plural transistors NM1 to NM4 is disposed on the +X side of the plural transistors PM1 to PM4.

Note that, while FIG. 8 illustrates, as an example, the layout configuration of the data latch DL, the layout of the input/output data latch XDL can be configured similarly to the layout of FIG. 8, and at least a part of the layout of the input/output data latch XDL can be configured similarly to the layout of FIG. 8. For example, the input/output data latch XDL may further include, in addition to the layout of FIG. 8, a gate electrode and a semiconductor region (a source electrode/a drain electrode) that function as a connection switch between the node LBUS and the data bus DBUS (refer to FIG. 4).

As described above, in the first embodiment, in the layout configuration of the data latch DL of the semiconductor memory device 100, the contact plugs to the gate electrodes are disposed in the region between the active regions AA1 and AA2. Accordingly, an efficient layout can be achieved by using the region between the active regions AA1 and AA2. Thus, the layout area of the data latch DL can be reduced. As a result, the layout area of the peripheral circuit 150 can be reduced, and the chip area of the semiconductor memory device 100 can thus be reduced.

Also, in the first embodiment, the gate electrode 51 of the transistor PM1 and the gate electrode 51 of the transistor NM1 are commonly connected, and the contact plug 63 connected to the commonly-connected gate electrodes 51 is disposed overlapping the isolation portion 23 when viewed in the Z direction. The gate electrode 56 of the transistor PM2 and the gate electrode 56 of the transistor NM2 are commonly connected, and the contact plug 74 connected to the commonly-connected gate electrodes 56 is disposed overlapping the isolation portion 23 when viewed in the Z direction. The contact plug 65 connected to the gate electrode 52 of the transistor PM3 is disposed overlapping the isolation portion 23 when viewed in the Z direction. The contact plug 69 connected to the gate electrode 54 of the transistor PM4 is disposed overlapping the isolation portion 23 when viewed in the Z direction. The contact plug 66 connected to the gate electrode 53 of the transistor NM3 is disposed overlapping the isolation portion 23 when viewed in the Z direction. The contact plug 71 connected to the gate electrode 55 of the transistor NM4 is disposed overlapping the isolation portion 23 when viewed in the Z direction. For example, when all the contact plugs connected to the gate electrodes are disposed overlapping the isolation portions 23, the gate length of each transistor can be made smaller than the plane dimension of the contact plug. Accordingly, an efficient layout can be achieved by using the region between the active regions AA1 and AA2.

For example, a configuration in which the contact plugs 61, 63, 65, 67, 69, 74, and 72 are disposed overlapping the active region AA1 when viewed in the Z direction, and the contact plugs 62, 64, 66, 68, 71, 73, and 75 are disposed overlapping the active region AA2 when viewed in the Z direction is considered. In this configuration, due to a process constraint that requires Y-direction spacing between the contact plugs to be equal to or longer than a predetermined length, it is difficult to shrink the layout in the Y direction.

On the other hand, in the first embodiment, the contacts to the gate electrodes are disposed overlapping the region between the active regions AA1 and AA2 when viewed in the Z direction and thus differs in the X position from the contacts to the active regions AA1 and AA2. This makes it easy to shrink the layout in the Y direction.

Figure 9:
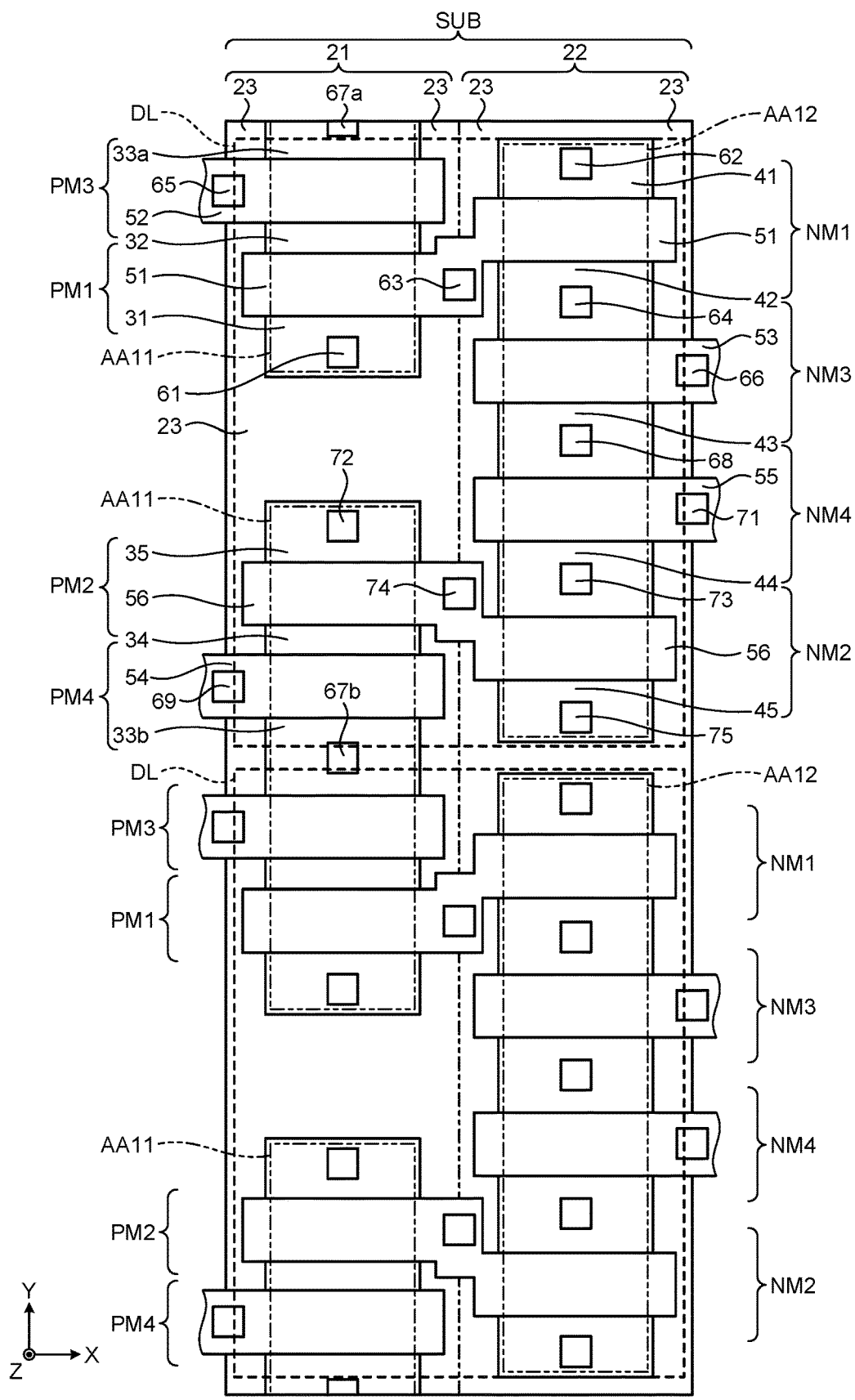
FIG. 9 is a plan view illustrating the layout configuration of a data latch in a first modification of the first embodiment.

Note that, while FIG. 8 illustrates, as an example, the configuration in which the gate electrodes 52 and 54 are disposed inside the commonly-connected gate electrodes 51 and 56 in the Y direction, the gate electrodes 52 and 54 may be disposed outside the commonly-connected gate electrodes 51 and 56 in the Y direction as illustrated in FIG. 9.

FIG. 9 is a plan view illustrating the layout configuration of a data latch DL in a first modification of the first embodiment.

The data latch DL has two active regions AA11 (the +Y-side active region AA11 and the −Y-side active region AA11). The +Y-side active region AA11 and the −Y-side active region AA11 are isolated from each other with the isolation portion 23 interposed therebetween. The +Y-side active region AA11 is disposed across the boundary between the data latch DL and the data latch DL adjacent thereto on the +Y side. The −Y-side active region AA11 is disposed across the boundary between the data latch DL and the data latch DL adjacent thereto on the −Y side. The active regions AA11 contain impurities of the second conductive type at a concentration higher than the impurity concentration in the well region 22.

An active region AA12 is isolated from the active region AA1 of the data latch DL adjacent thereto in the Y direction with the isolation portion 23 interposed therebetween. The active region AA12 is a semiconductor region of the second conductive type (e.g., P type). The active region AA12 contains impurities of the first conductive type at a concentration higher than the impurity concentration in the well region 22. The active region AA12 is surrounded by the isolation portion 23 when viewed in the Z direction.

Compared to the configuration of FIG. 8, the positional relationship between the gate electrode 51 and the gate electrode 52 in the active region AA11 is reversed in the Y direction in the configuration of FIG. 9. The gate electrode 52 is disposed on the +Y side of the gate electrode 51. Accordingly, the configuration corresponding to the transistor PM3 is disposed on the +Y side of the configuration corresponding to the transistor PM1. That is, the semiconductor region 31, the gate electrode 51, and the semiconductor region 32 corresponding to the drain, the gate, and the source of the transistor PM1 are arranged from the −Y side to the +Y side. The semiconductor region 32, the gate electrode 52, and a semiconductor region 33a corresponding to the drain, the gate, and the source of the transistor PM3 are arranged from the −Y side to the +Y side.

Compared to the configuration of FIG. 8, the positional relationship between the gate electrode 54 and the gate electrode 56 in the active region AA11 is reversed in the Y direction in the configuration of FIG. 9. The gate electrode 54 is disposed on the −Y side of the gate electrode 56. Accordingly, the configuration corresponding to the transistor PM4 is disposed on the −Y side of the configuration corresponding to the transistor PM2. That is, the semiconductor region 35, the gate electrode 56, and the semiconductor region 34 corresponding to the drain, the gate, and the source of the transistor PM2 are arranged from the +Y side to the −Y side. The semiconductor region 34, the gate electrode 54, and a semiconductor region 33b corresponding to the drain, the gate, and the source of the transistor PM4 are arranged from the +Y side to the −Y side.

In the data latch DL, the transistors PM1 to PM4, each of which is, for example, a PMOS transistor, are disposed in the order of the transistor PM3, the transistor PM1, the transistor PM2, and the transistor PM4 in the −Y direction. The transistors NM1 to NM4, each of which is, for example, an NMOS transistor, are disposed in the order of the transistor NM1, the transistor NM3, the transistor NM4, and the transistor NM2 in the −Y direction.

The positional relationship between the plural transistors PM1 to PM4 and the plural transistors NM1 to NM4 is the same between the two data latches DL disposed adjacent to each other in the Y direction. In the case of FIG. 8, in the data latch DL on the +Y side, the plural transistors NM1 to NM4 is disposed on the +X side of the plural transistors PM1 to PM4. In the data latch DL on the −Y side, the plural transistors NM1 to NM4 is disposed on the +X side of the plural transistors PM1 to PM4.

Note that, in the configuration illustrated in FIG. 9, the semiconductor region 33 is divided into the semiconductor region 33a and the semiconductor region 33b, and the contact plug 67 is divided into a contact plug 67a and a contact plug 67b.

The configuration of FIG. 9 is similar to the configuration of FIG. 8 in the positional relationship between the gate electrode 51, the gate electrode 53, the gate electrode 55, and the gate electrode 56 in the active region AA12. Also, the configuration of FIG. 9 is similar to the configuration of FIG. 8 in that the contact plugs 63, 65, 66, 69, 71, and 74 to the gate electrodes 51, 52, 53, 54, 55, and 56 are disposed in the region overlapping the isolation portion 23 when viewed in the Z direction. Note that each shape of gate electrodes 51, 56 may be a shape of a crank with eight vertices as illustrated in FIG. 8.

The configuration illustrated in FIG. 9 also enables an efficient layout by using the region between the active regions AA11 and AA12. Thus, the layout area of the data latch DL can be reduced.

Figure 10:
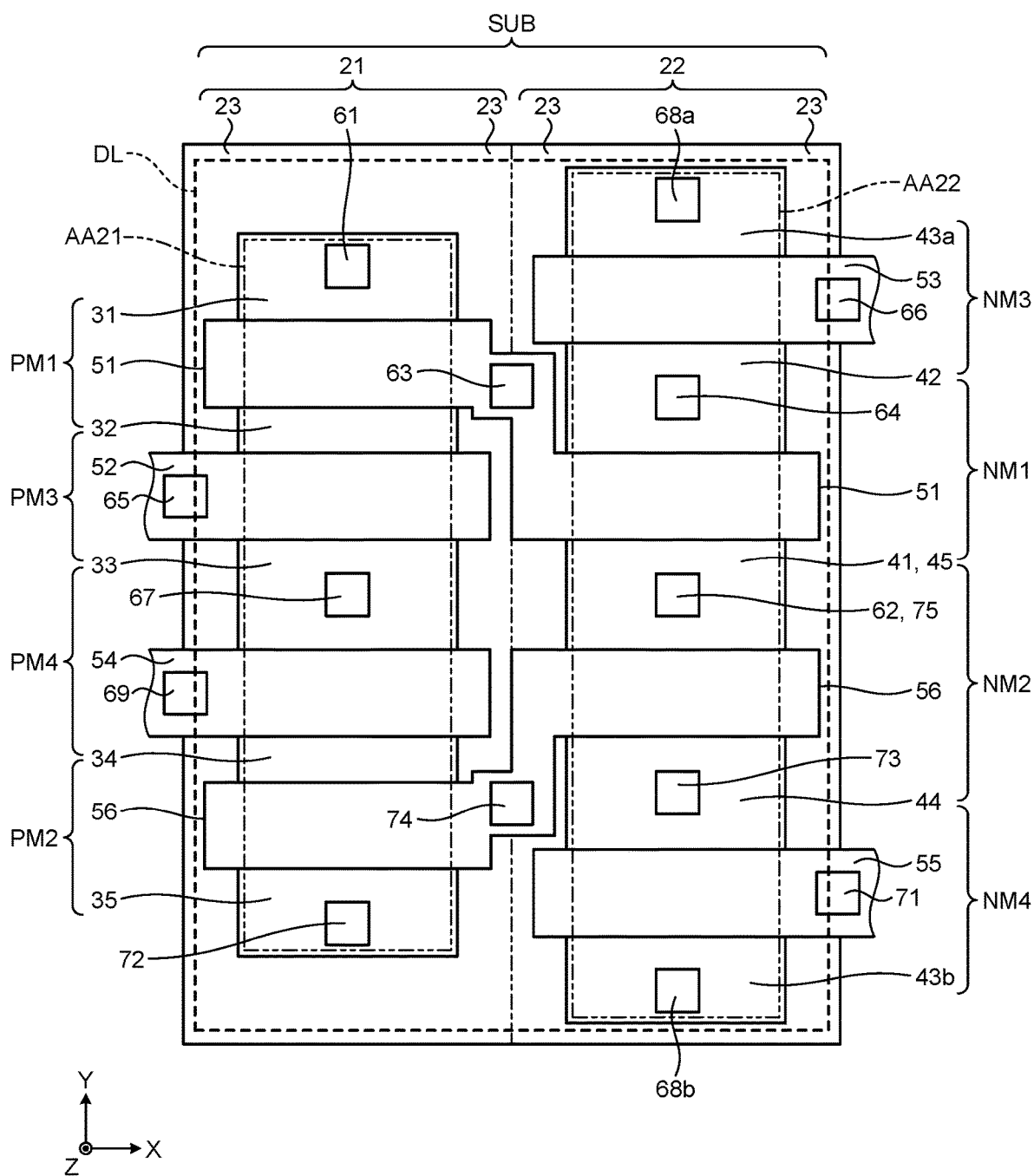
FIG. 10 is a plan view illustrating the layout configuration of a data latch in a second modification of the first embodiment.

While FIG. 8 illustrates, as an example, the configuration in which the gate electrodes 53 and 55 are disposed inside the commonly-connected gate electrodes 51 and 56 in the Y direction, the gate electrodes 53 and 55 may be disposed outside the commonly-connected gate electrodes 51 and 56 in the Y direction as illustrated in FIG. 10. FIG. 10 is a plan view illustrating the layout configuration of a data latch DL in a second modification of the first embodiment.

In the data latch DL, an active region AA21 is isolated from an active region AA21 of the data latch DL adjacent thereto in the Y direction with the isolation portion 23 interposed therebetween. The active region AA21 contains impurities of the second conductive type at a concentration higher than the impurity concentration in the well region 22. An active region AA22 is isolated from an active region AA22 of the data latch DL adjacent thereto in the Y direction with the isolation portion 23 interposed therebetween. The active region AA22 contains impurities of the first conductive type at a concentration higher than the impurity concentration in the well region 22.

Compared to the configuration of FIG. 8, the positional relationship between the gate electrode 51 and the gate electrode 53 in the active region AA22 is reversed in the Y direction in the configuration of FIG. 10. The gate electrode 53 is disposed on the +Y side of the gate electrode 51. Accordingly, the configuration corresponding to the transistor NM3 is disposed on the +Y side of the configuration corresponding to the transistor NM1. That is, the semiconductor region 42, the gate electrode 51, and the semiconductor region 41 corresponding to the drain, the gate, and the source of the transistor NM1 are arranged from the +Y side to the −Y side. A semiconductor region 43a, the gate electrode 53, and the semiconductor region 42 corresponding to the drain, the gate, and the source of the transistor NM3 are arranged from the +Y side to the −Y side.

Compared to the configuration of FIG. 8, the positional relationship between the gate electrode 55 and the gate electrode 56 in the active region AA22 is reversed in the Y direction in the configuration of FIG. 10. The gate electrode 55 is disposed on the −Y side of the gate electrode 56. Accordingly, the configuration corresponding to the transistor NM4 is disposed on the −Y side of the configuration corresponding to the transistor NM2. That is, the semiconductor region 44, the gate electrode 56, and the semiconductor region 45 corresponding to the drain, the gate, and the source of the transistor NM2 are arranged from the −Y side to the +Y side. A semiconductor region 43b, the gate electrode 55, and the semiconductor region 44 corresponding to the drain, the gate, and the source of the transistor NM4 are arranged from the −Y side to the +Y side.

In the data latch DL, the transistors PM1 to PM4, each of which is, for example, a PMOS transistor, are disposed in the order of the transistor PM1, the transistor PM3, the transistor PM4, and the transistor PM2 in the −Y direction. The transistors NM1 to NM4, each of which is, for example, an NMOS transistor, are disposed in the order of the transistor NM3, the transistor NM1, the transistor NM2, and the transistor NM4 in the −Y direction.

Although not illustrated, the positional relationship between the plural transistors PM1 to PM4 and the plural transistors NM1 to NM4 is the same between the two data latches DL disposed adjacent to each other in the Y direction.

Note that, in the configuration illustrated in FIG. 10, the semiconductor regions 41 and 45 are configured as a common semiconductor region, and the contact plugs 62 and 75 are configured as a common contact plug. The semiconductor region 43 is divided into the semiconductor region 43a and the semiconductor region 43b, and the contact plug 68 is divided into a contact plug 68a and a contact plug 68b.

The configuration of FIG. 10 is similar to the configuration of FIG. 8 in the positional relationship between the gate electrode 51, the gate electrode 52, the gate electrode 54, and the gate electrode 56 in the active region AA21. Also, the configuration of FIG. 10 is similar to the configuration of FIG. 8 in that the contact plugs 63, 65, 66, 69, 71, and 74 to the gate electrodes 51, 52, 53, 54, 55, and 56 are disposed in the region overlapping the isolation portion 23 when viewed in the Z direction. Note that each shape of gate electrodes 51, 56 may be a shape of a crank with eight vertices as illustrated in FIG. 8.

The configuration illustrated in FIG. 10 also enables an efficient layout by using the region between the active regions AA21 and AA22. Thus, the layout area of the data latch DL can be reduced.

Figure 11:
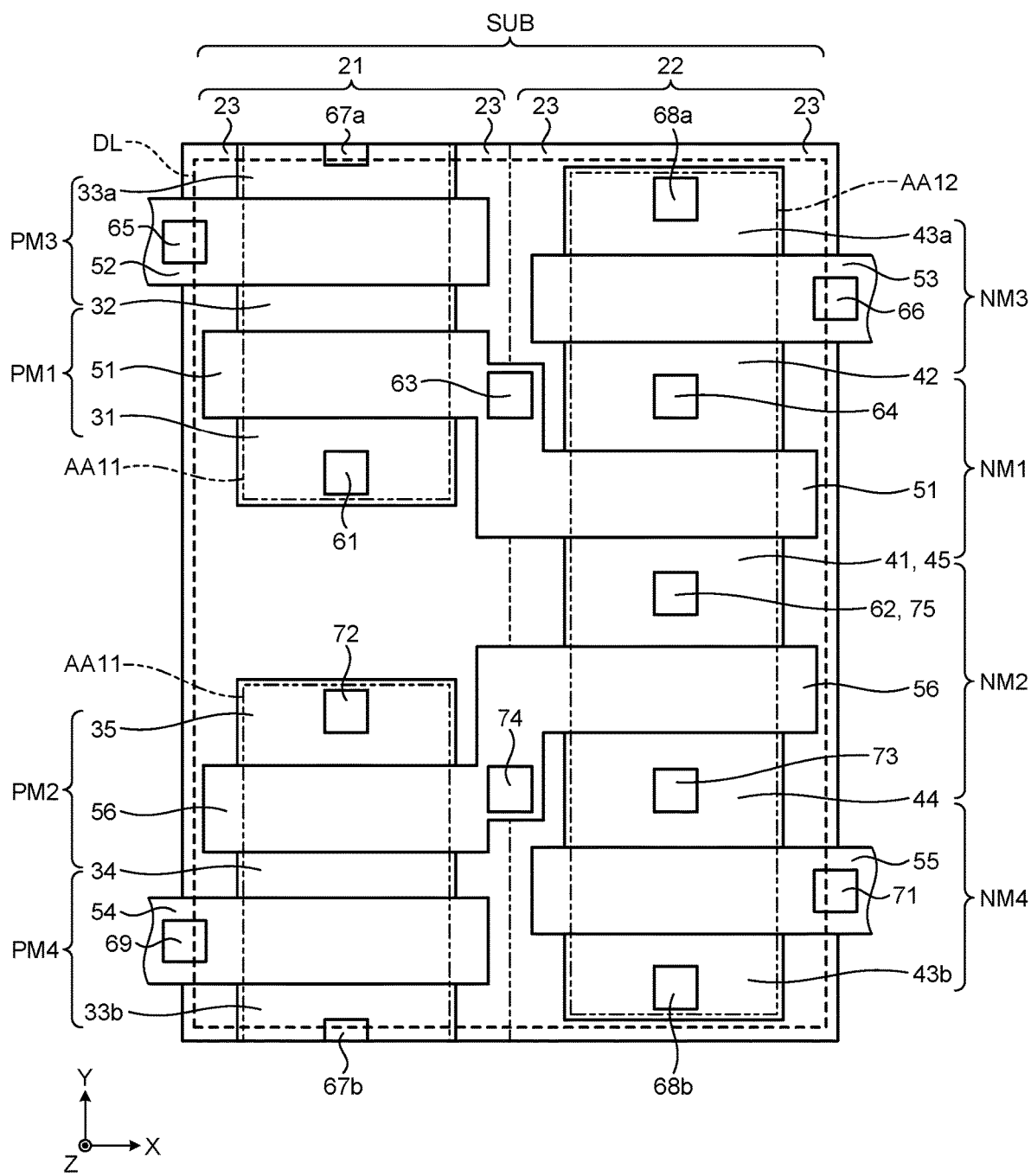
FIG. 11 is a plan view illustrating the layout configuration of a data latch in a third modification of the first embodiment.

While FIG. 8 illustrates, as an example, the configuration in which the gate electrodes 52 to 55 are disposed inside the commonly-connected gate electrodes 51 and 56 in the Y direction, the gate electrodes 52 to 55 may be disposed outside the commonly-connected gate electrodes 51 and 56 in the Y direction as illustrated in FIG. 11. FIG. 11 is a plan view illustrating the layout configuration of a data latch DL in a third modification of the first embodiment.

In the data latch DL, an active region AA11 is similar to the active region AA11 illustrated in FIG. 9, and an active region AA12 is similar to the active region AA12 illustrated in FIG. 9.

Compared to the configuration of FIG. 9, the positional relationship between the gate electrode 51 and the gate electrode 53 in the active region AA12 is reversed in the Y direction in the configuration of FIG. 11. The gate electrode 53 is disposed on the +Y side of the gate electrode 51. Accordingly, the configuration corresponding to the transistor NM3 is disposed on the +Y side of the configuration corresponding to the transistor NM1. That is, the semiconductor region 42, the gate electrode 51, and the semiconductor region 41 corresponding to the drain, the gate, and the source of the transistor NM1 are arranged from the +Y side to the −Y side. The semiconductor region 43a, the gate electrode 53, and the semiconductor region 42 corresponding to the drain, the gate, and the source of the transistor NM3 are arranged from the +Y side to the −Y side.

Compared to the configuration of FIG. 9, the positional relationship between the gate electrode 55 and the gate electrode 56 in the active region AA12 is reversed in the Y direction in the configuration of FIG. 11. The gate electrode 55 is disposed on the −Y side of the gate electrode 56. Accordingly, the configuration corresponding to the transistor NM4 is disposed on the −Y side of the configuration corresponding to the transistor NM2. That is, the semiconductor region 44, the gate electrode 56, and the semiconductor region 45 corresponding to the drain, the gate, and the source of the transistor NM2 are arranged from the −Y side to the +Y side. The semiconductor region 43b, the gate electrode 55, and the semiconductor region 44 corresponding to the drain, the gate, and the source of the transistor NM4 are arranged from the −Y side to the +Y side.

In the data latch DL, the transistors PM1 to PM4, each of which is, for example, a PMOS transistor, are disposed in the order of the transistor PM3, the transistor PM1, the transistor PM2, and the transistor PM4 in the −Y direction. The transistors NM1 to NM4, each of which is, for example, an NMOS transistor, are disposed in the order of the transistor NM3, the transistor NM1, the transistor NM2, and the transistor NM4 in the −Y direction.

Although not illustrated, the positional relationship between the plural transistors PM1 to PM4 and the plural transistors NM1 to NM4 is similar between the two data latches DL disposed adjacent to each other in the Y direction.

Note that, in the configuration illustrated in FIG. 11, the semiconductor regions 41 and 45 are configured as a common semiconductor region, and the contact plugs 62 and 75 are configured as a common contact plug. The semiconductor region 43 is divided into the semiconductor region 43a and the semiconductor region 43b, and the contact plug 68 is divided into the contact plug 68a and the contact plug 68b.

In the data latch DL, the transistors PM1 to PM4, each of which is, for example, a PMOS transistor, are disposed in the order of the transistor PM3, the transistor PM1, the transistor PM2, and the transistor PM4 in the −Y direction. The transistors NM1 to NM4, each of which is, for example, an NMOS transistor, are disposed in the order of the transistor NM3, the transistor NM1, the transistor NM2, and the transistor NM4 in the −Y direction.

Although not illustrated, the positional relationship between the plural transistors PM1 to PM4 and the plural transistors NM1 to NM4 is similar between the two data latches DL disposed adjacent to each other in the Y direction.

The configuration of FIG. 11 is similar to the configuration of FIG. 9 in that the contact plugs 63, 65, 66, 69, 71, and 74 to the gate electrodes 51, 52, 53, 54, 55, and 56 are disposed in the region overlapping the isolation portion 23 when viewed in the Z direction.

Note that each shape of gate electrodes 51, 56 may be a shape of a crank with eight vertices as illustrated in FIG. 8.

The configuration illustrated in FIG. 11 also enables an efficient layout by using the region between the active regions AA11 and AA12. Thus, the layout area of the data latch DL can be reduced.

Figure 12:
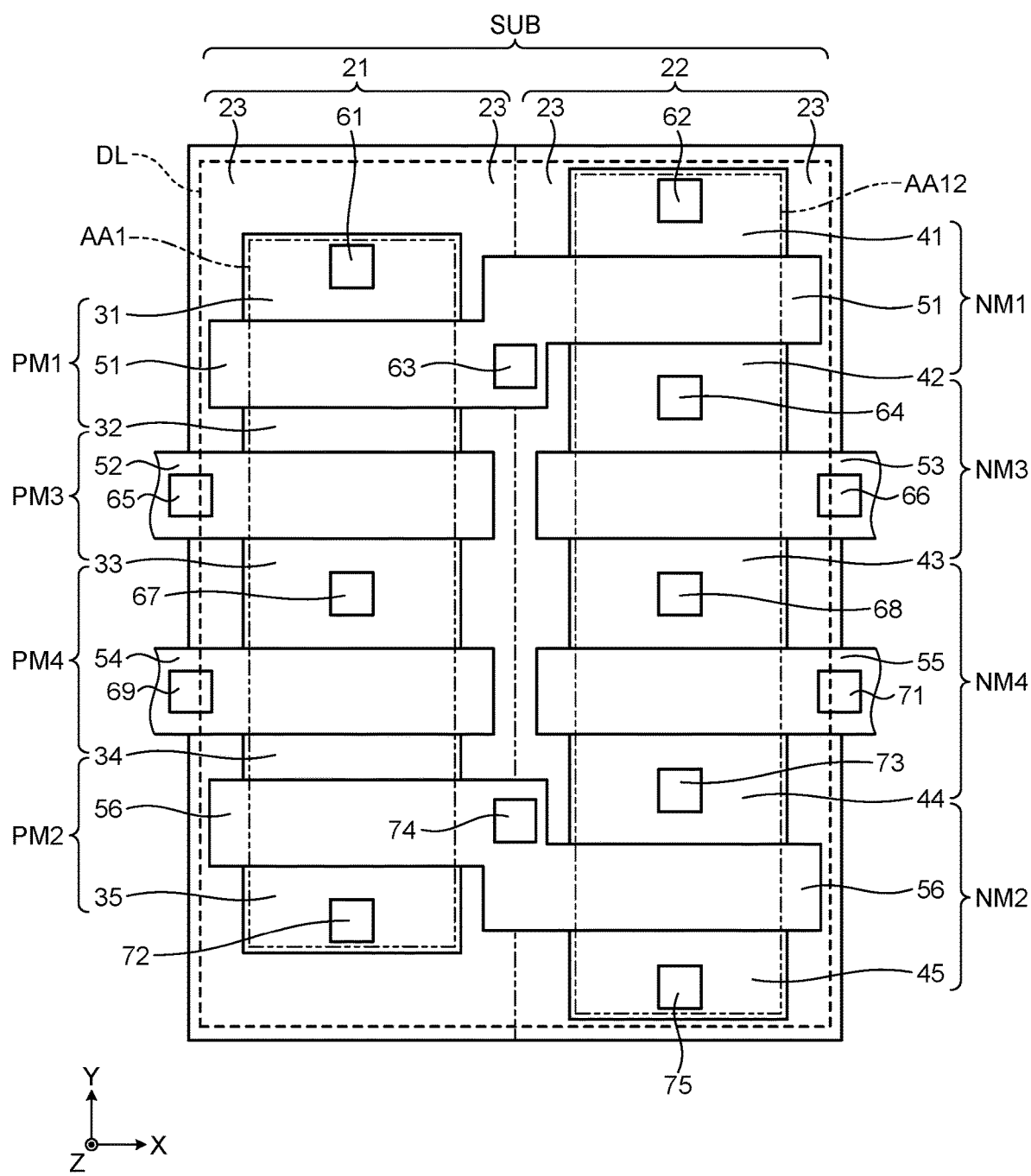
FIG. 12 is a plan view illustrating the layout configuration of a data latch in a fourth modification of the first embodiment.

While FIG. 8 illustrates, as an example, the configuration in which the active region AA2 is contiguous between the data latches DL adjacent to each other in the Y direction, the active region AA12 may be separated for each data latch DL as illustrated in FIG. 12. FIG. 12 is a plan view illustrating the layout configuration of a data latch DL in a third modification of the first embodiment.

A configuration in an active region AA1 is similar to the configuration in the active region AA1 illustrated in FIG. 8. A configuration in an active region AA12 is similar to the active region AA12 illustrated in FIG. 9.

In the data latch DL illustrated in FIG. 12, the transistors PM1 to PM4, each of which is, for example, a PMOS transistor, are disposed in the order of the transistor PM1, the transistor PM3, the transistor PM4, and the transistor PM2 in the −Y direction. The transistors NM1 to NM4, each of which is, for example, an NMOS transistor, are disposed in the order of the transistor NM1, the transistor NM3, the transistor NM4, and the transistor NM2 in the −Y direction.

Although not illustrated, the positional relationship between the plural transistors PM1 to PM4 and the plural transistors NM1 to NM4 is similar between the two data latches DL disposed adjacent to each other in the Y direction.

The configuration of FIG. 12 is similar to the configuration of FIG. 8 in that the contact plugs 63, 65, 66, 69, 71, and 74 to the gate electrodes 51, 52, 53, 54, 55, and 56 are disposed in the region overlapping the isolation portion 23 when viewed in the Z direction.

The configuration illustrated in FIG. 12 also enables an efficient layout by using the region between the active regions AA1 and AA12. Thus, the layout area of the data latch DL can be reduced.

Figure 13:
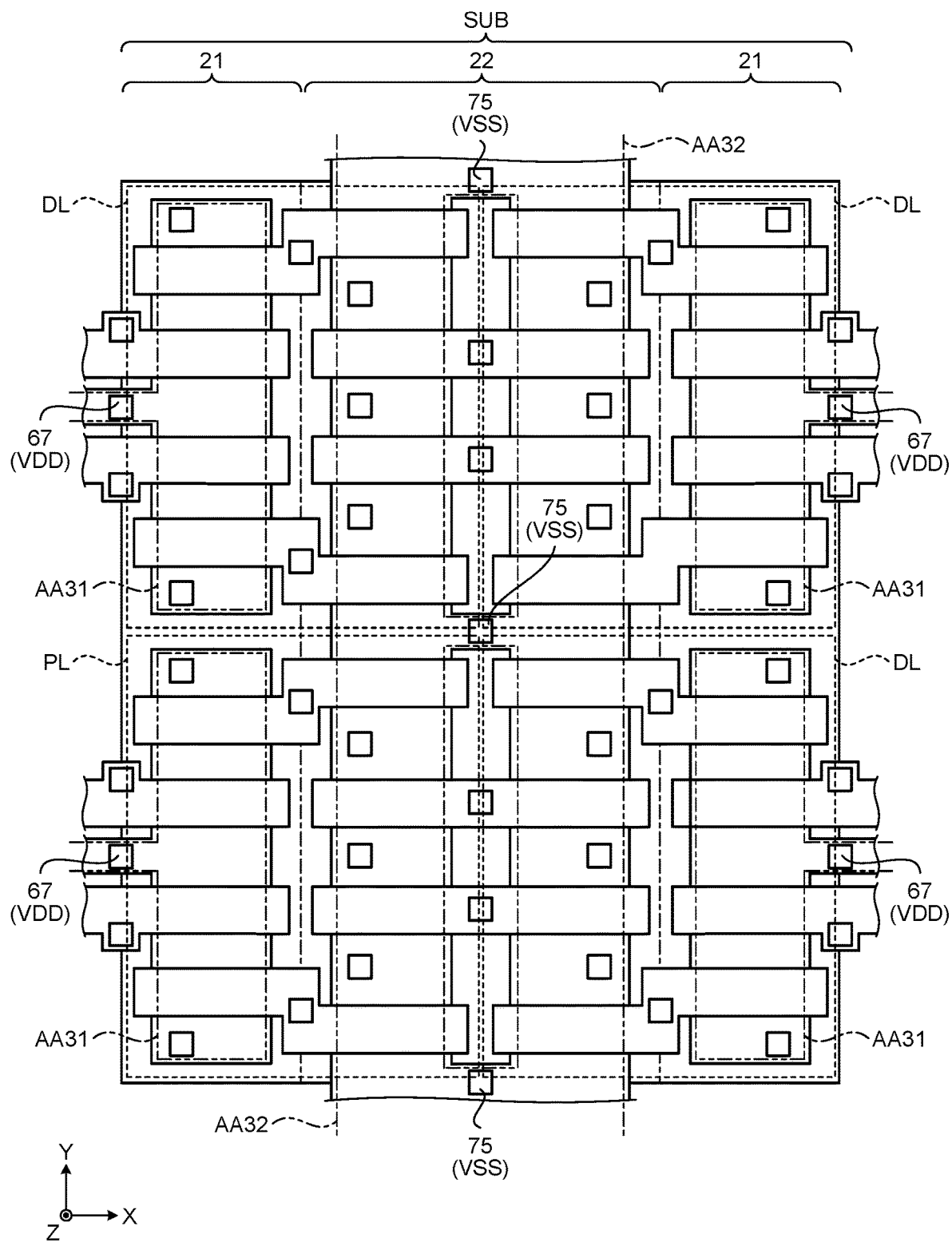
FIG. 13 is a plan view illustrating the layout configuration of a data latch in a fifth modification of the first embodiment.

While FIG. 8 illustrates, as an example, the configuration in which the contact plug 75 is shared between the data latches DL adjacent to each other in the Y direction, the data latch DL may have a layout in which the contact plugs 67 and 75 are shared between the data latches DL adjacent to each other in the X direction as illustrated in FIG. 13. FIG. 13 is a plan view illustrating the layout configuration of a data latch DL in a fifth modification of the first embodiment.

FIG. 13 illustrates, as an example, a case where the layout of the data latches DL adjacent to each other in the Y direction is translational arrangement, and the layout of the data latches DL adjacent to each other in the X direction is inverted arrangement. In this layout configuration, each data latch DL has an active region AA31 of the first conductive type commonly connected to the active region AA31 of the data latch DL adjacent thereto on the −X side and an active region AA32 of the second conductive type commonly connected to the active region AA32 of the data latch DL adjacent thereto on the +X side.

In each data latch DL, the active region AA31 of the first conductive type partly extends in the −X direction at a Y position corresponding to the contact plug 67 (refer to FIG. 8) and is connected to the active region AA31 of the data latch DL adjacent thereto on the −X side. Accordingly, the contact plug 67 is located at an X position near the boundary with the data latch DL adjacent thereto on the −X side and shared with the data latch DL adjacent thereto on the −X side.

In each data latch DL, the active region AA32 of the second conductive type partly extends in the +X direction at a Y position corresponding to the contact plug 61 (refer to FIG. 8) and is connected to the active region AA32 of the data latch DL adjacent thereto on the +X side. Accordingly, the contact plug 61 is located at an X position near the boundary with the data latch DL adjacent thereto on the +X side and shared with the data latch DL adjacent thereto on the +X side.

In each data latch DL, the active region AA32 of the second conductive type partly extends in the +X direction at a Y position corresponding to the contact plug 75 (refer to FIG. 8) and is connected to the active region AA32 of the data latch DL adjacent thereto on the +X side. Accordingly, the contact plug 75 is located at an X position near the boundary with the data latch DL adjacent thereto on the +X side and shared with the data latch DL adjacent thereto on the +X side.

Compared to the configuration of FIG. 8, in the configuration of FIG. 13, the contact plugs 61, 67, and 75 are disposed in the region where the active regions AA31 and AA32 are commonly connected between the adjacent data latches DL. Accordingly, the contact plugs 61, 67, and 75 are shared between the adjacent data latches DL.

The configuration illustrated in FIG. 13 enables an efficient layout by using the region between the adjacent data latches DL. Thus, the layout area of the data latch DL can be reduced.

Second Embodiment

A semiconductor memory device 100 according to a second embodiment will be described. Hereinbelow, differences from the first embodiment will be mainly described.

While the layout of the active regions and the layout of the gate electrodes in the data latch DL are described, as an example, in the first embodiment, the layout of upper layer wiring in the data latch DL is further described, as an example, in the second embodiment.

Figure 14:
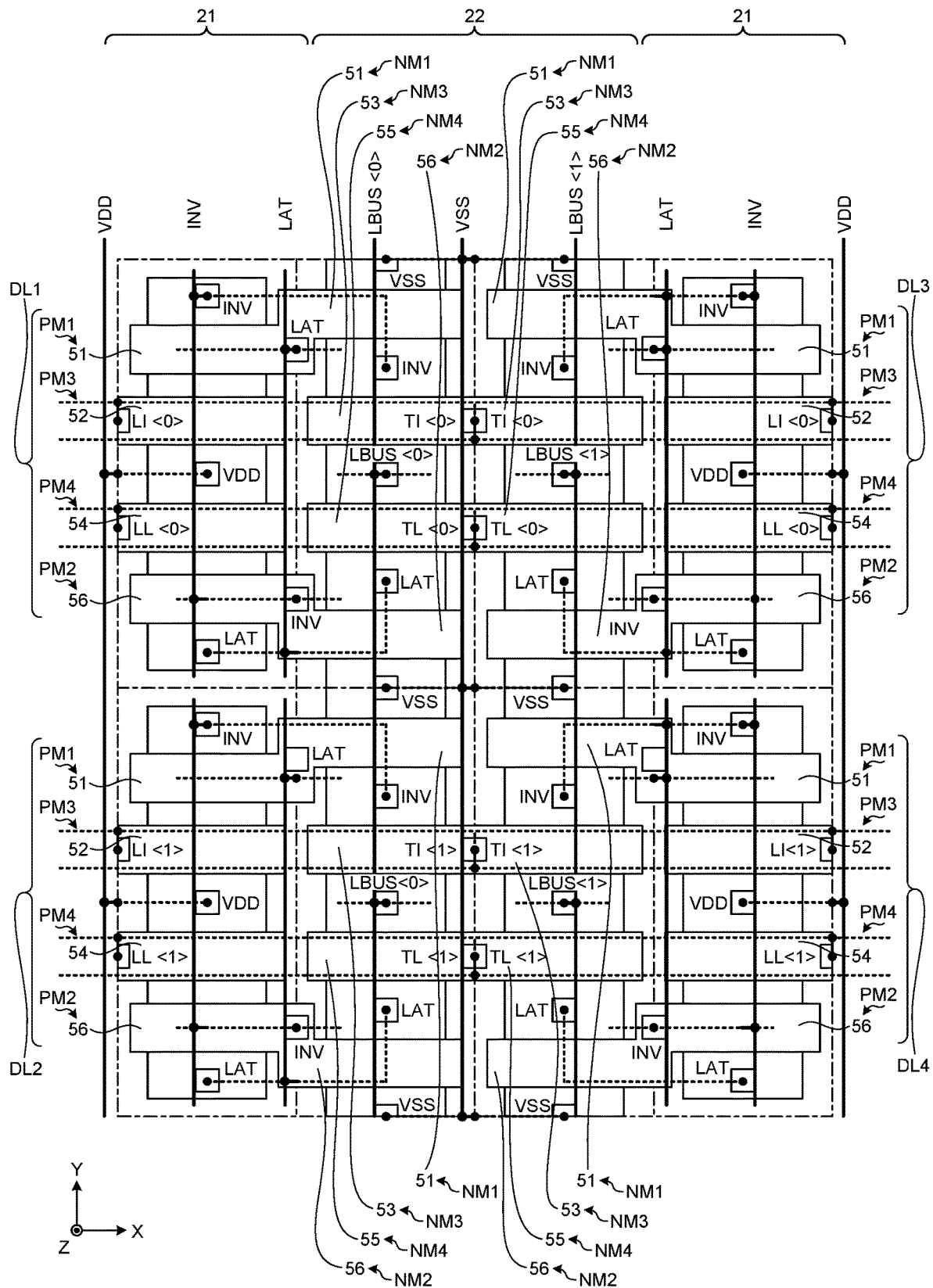
FIG. 14 is a plan view illustrating the layout configuration of a data latch in a second embodiment.

Specifically, the data latch DL illustrated in FIG. 7 can be laid out as illustrated in FIG. 14. FIG. 14 is a plan view illustrating the layout configuration of the data latch DL. FIG. 14 illustrates, as an example, four data latches DL adjacent to each other in the XY direction.

When the four data latches DL are distinguished from each other, the data latch on the −X/+Y side is referred to as the data latch DL1, the data latch on the −X/−Y side is referred to as the data latch DL2, the data latch on the +X/+Y side is referred to as the data latch DL3, and the data latch on the +X/−Y side is referred to as the data latch DL4.

In the upper layer wiring, wiring layers are referred to as the first wiring layer, the second wiring layer, and the third wiring layer in this order from the wiring layer closest to the substrate SUB.

Figure 15:
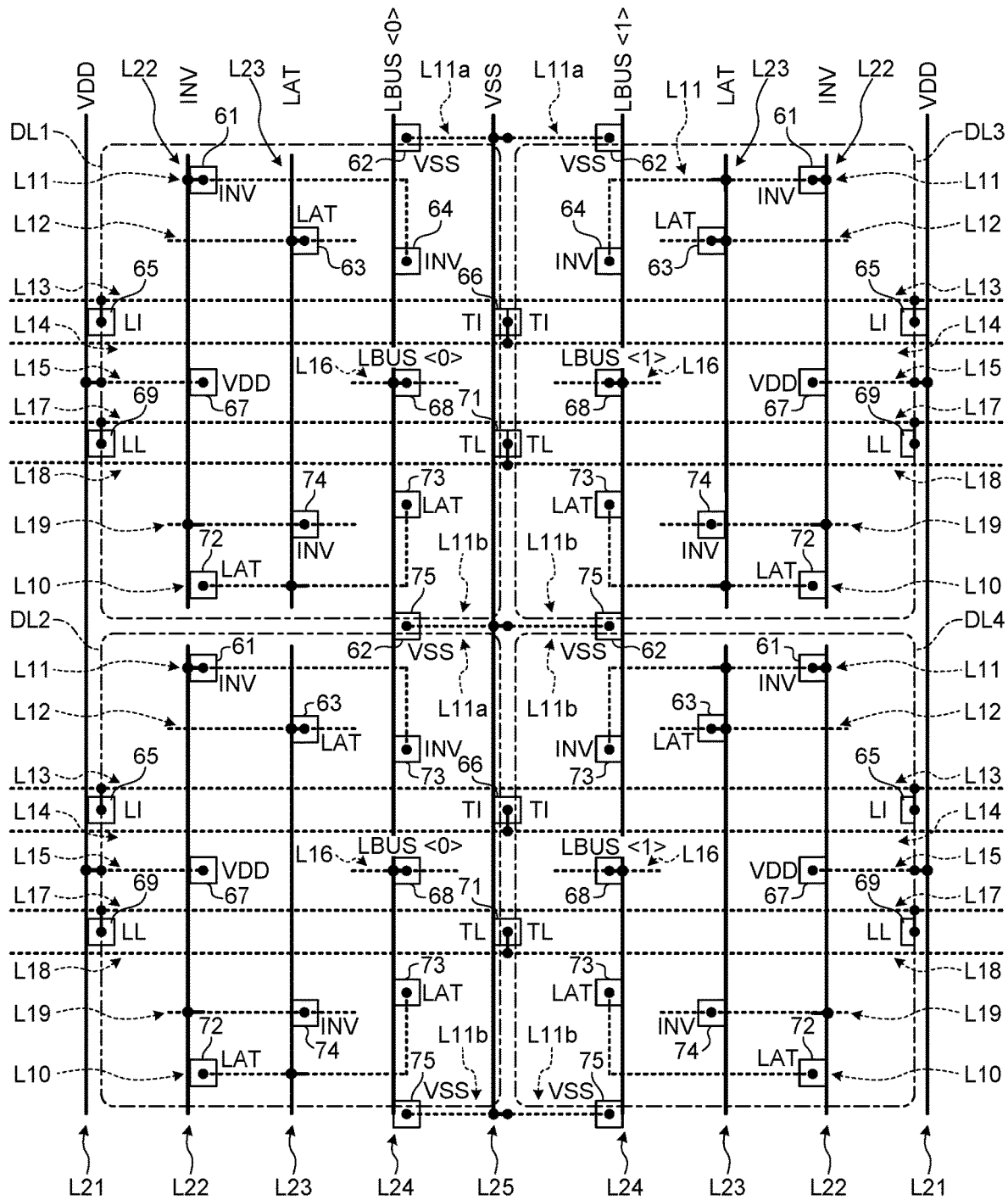
FIG. 15 is a plan view illustrating the schematic layout configuration of upper layer wiring in the second embodiment.

The layout of the upper layer wiring extracted from the layout configuration illustrated in FIG. 14 is as illustrated in FIG. 15. FIG. 15 is a plan view illustrating the schematic layout configuration of the upper layer wiring. FIG. 15 illustrates, as an example, the schematic layout configuration of the upper layer wiring corresponding to the data latches DL1 to DL4. Note that, in FIGS. 14 and 15, each line in the upper layer wiring represents the connection relationship between nodes (contact plugs) to illustrate the schematic layout configuration, and the layout in the drawings may differ from the actual layout (width and pattern) of the lines.

Lines L10 to L19 of the first layer mainly extend in the X direction as indicated by dotted lines in FIG. 15. Lines L21 to L25 of the second layer mainly extend in the Y direction as indicated by solid lines in FIG. 15.

When focusing attention on the data laches DL1 and DL2 adjacent to each other in the Y direction, the line L21 of the second layer is shared between the data latches DL1 and DL2 and extends in the Y direction near the −X-side boundaries of the data latches DL1 and DL2. The line L21 is a power supply line VDD and connected to the contact plug 67 corresponding to the power supply node VDD (refer to FIG. 7) of each of the data latches DL1 and DL2 via the line L15 of the first layer.

The line L15 of the first layer extends, at a Y position corresponding to the contact plug 67, in the +X direction from the X position of the line L21 to the X position of the contact plug 67.

The line L22 of the second layer is provided in each of the data latches DL1 and DL2 and functions as a local wiring line inside each of the data latches DL1 and DL2. The line L22 extends in the Y direction near the X-direction center of the well region 21 of each of the data latches DL1 and DL2. The line L22 is a signal line INV and connected to the contact plugs 61, 64 and 74 corresponding to the node INV (refer to FIG. 7) of each of the data latches DL1 and DL2 via the line L19 of the first layer.

The line L11 of the first layer extends, at a Y position corresponding to the contact plug 61, in the +X direction from the X position of the line L22 to pass through the X position of the contact plug 61, extends to the X position of the contact plug 64, and extends in the −Y direction from the X position of the contact plug 64 to the Y position of the contact plug 64.

The line L19 of the first layer extends, at a Y position corresponding to the contact plug 74, in the +X direction from the X position of the line L22 to the X position of the contact plug 74.

The line L23 of the second layer is provided in each of the data latches DL1 and DL2 and functions as a local wiring line inside each of the data latches DL1 and DL2. The line L23 extends in the Y direction near the boundary between the well region 21 and the well region 22 of each of the data latches DL1 and DL2. The line L23 is a signal line LAT and connected to the contact plugs 63, 72 and 73 corresponding to the node LAT (refer to FIG. 7) of each of the data latches DL1 and DL2 via the line L12 of the first layer.

The line L10 of the first layer extends, at a Y position corresponding to the contact plug 72, in the −X direction from the X position of the line L23 to the X position of the contact plug 72. The line L10 extends, at the Y position corresponding to the contact plug 72, in the +X direction from the X position of the line L23 to the X position of the contact plug 73, and extends in the +Y direction from the X position of the contact plug 73 to the Y position of the contact plug 73.

The line L12 of the first layer extends, at a Y position corresponding to the contact plug 63, in the +X direction from the X position of the line L23 to the X position of the contact plug 63.

The line L24 of the second layer is shared between the data laches DL1 and DL2 and extends in the Y direction near the X-direction center of the active region AA2 (refer to FIG. 8) of each of the data latches DL1 and DL2. The line L24 is a signal line LBUS and connected to the contact plug 68 corresponding to the node LBUS (refer to FIG. 7) of each of the data latches DL1 and DL2 via the line L16 of the first layer.

The line L16 of the first layer extends, at a Y position corresponding to the contact plug 68, in the +X direction from the X position of the line L24 to the X position of the contact plug 68.

The line L25 of the second layer is shared between the data laches DL1 and DL2 and extends in the Y direction near the +X-side boundaries of the data latches DL1 and DL2. The line L25 is a ground line VSS and connected to the contact plugs 62 and 75 corresponding to the ground node VSS (refer to FIG. 7) of each of the data latches DL1 and DL2 via the lines L11a and L11b of the first layer.

The line L11a of the first layer extends, at a Y position corresponding to the contact plug 62, in the +X direction from the X position of the line L25 to the X position of the contact plug 62.

The line L11b of the first layer extends, at a Y position corresponding to the contact plug 75, in the +X direction from the X position of the line L25 to the X position of the contact plug 75.

The line L11a and the contact plug 62 are respectively common with the line L11b and the contact plug 62 of the data latch DL (not illustrated) adjacent thereto in the +Y direction. The line L11b and the contact plug 75 are respectively common with the line L11a and the contact plug 62 of the data latch DL2 adjacent thereto in the −Y direction.

The line L13 of the first layer is a signal line LI and connected to the contact plug 65 corresponding to the control node LI (refer to FIG. 7) of each of the data latches DL1 and DL2. Inside each of the data latched DL1 and the DL2, the line L13 extends in the X direction near the +Y-side ends of the gate electrodes 52 and 53 and partly extends, at the X position of the contact plug 65, in the −Y direction to the Y position of the contact plug 65.

The line L14 of the first layer is a signal line TI and connected to the contact plug 66 corresponding to the control node TI (refer to FIG. 7) of each of the data latches DL1 and DL2. Inside each of the data latched DL1 and the DL2, the line L14 extends in the X direction near the −Y-side ends of the gate electrodes 52 and 53 and partly extends, at the X position of the contact plug 66, in the +Y direction to the Y position of the contact plug 65.

The line L17 of the first layer is a signal line LL and connected to the contact plug 69 corresponding to the control node LL (refer to FIG. 7) of each of the data latches DL1 and DL2. Inside each of the data latched DL1 and the DL2, the line L17 extends in the X direction near the +Y-side ends of the gate electrodes 54 and 55 and partly extends, at the X position of the contact plug 69, in the −Y direction to the Y position of the contact plug 69.

The line L18 of the first layer is a signal line TL and connected to the contact plug 71 corresponding to the control node TL (refer to FIG. 7) of each of the data latches DL1 and DL2. Inside each of the data latched DL1 and the DL2, the line L18 extends in the X direction near the −Y-side ends of the gate electrodes 54 and 55 and partly extends, at the X position of the contact plug 71, in the +Y direction to the Y position of the contact plug 71.

As illustrated in FIG. 14, the well region 22 is configured as a semiconductor region of the second conductive type contiguous across the boundary between the two data latches DL1 and DL3 adjacent each other in the X direction. The well region 21 is configured as a semiconductor region of the first conductive type disposed on each side of the well region 22 in the X direction. The X-direction width of the well region 22 is approximately twice the X-direction width of the well region 21.

As described in FIGS. 14 and 15, the layout of the active regions, the gate electrodes, and the upper layer wiring is in a translational arrangement relationship in the Y direction between the two data latches DL1 and DL2 adjacent to each other in the Y direction. That is, the layout of the data latch DL1 moved in the −Y direction at the Y-direction width of one data latch DL1 substantially overlaps the layout of the data latch DL2.

Accordingly, the positional relationship between the plural transistors PM1 to PM4 and the plural transistors NM1 to NM4 is the same between the two data laches DL1 and DL2 disposed adjacent to each other in the Y direction. In the data latch DL1, the plural transistors NM1 to NM4 is disposed on the +X side of the plural transistors PM1 to PM4. In the data latch DL2, the plural transistors NM1 to NM4 is disposed on the +X side of the plural transistors PM1 to PM4.

On the other hand, the layout of the active regions, the gate electrodes, and the upper layer wiring is in an inverted arrangement relationship in the X direction between the two data latches DL1 and DL3 adjacent to each other in the X direction. That is, the layout of the data latch DL1 turned around, that is, linearly symmetrically moved with respect to the +X-side boundary substantially overlaps the layout of the data latch DL3.

Accordingly, the positional relationship between the plural transistors PM1 to PM4 and the plural transistors NM1 to NM4 is inverted in the X direction between the two data laches DL1 and DL3 disposed adjacent to each other in the X direction. In the data latch DL1, the plural transistors NM1 to NM4 is disposed on the +X side of the plural transistors PM1 to PM4. In the data latch DL3, the plural transistors NM1 to NM4 is disposed on the −X side of the plural transistors PM1 to PM4.

The positional relationship between the plural transistors PM1 to PM4 and the plural transistors NM1 to NM4 is the same between the two data laches DL3 and DL4 disposed adjacent to each other in the Y direction. In the data latch DL4, the plural transistors NM1 to NM4 is disposed on the −X side of the plural transistors PM1 to PM4.

In the data latch DL1, the line of the first layer is connected to the gate electrode of each of the transistors NM3, NM4, PM3, and PM4. The line L14 of the first layer is connected to the gate electrode 53 of the transistor NM3. The line L18 of the first layer is connected to the gate electrode 55 of the transistor NM4. The line L13 of the first layer is connected to the gate electrode 52 of the transistor PM3. The line L17 of the first layer is connected to the gate electrode 54 of the transistor PM4.

The transistors NM1, NM2, PM1, and PM2 are connected to each other via the lines of the first layer and the lines of the second layer. For the node INV (refer to FIG. 7), the transistors NM1, NM2, PM1, and PM2 are connected to each other via the line L11 of the first layer, the line L22 of the second layer, and the line L19 of the first layer. For the node LAT (refer to FIG. 7), the transistors NM1, NM2, PM1, and PM2 are connected to each other via the line L12 of the first layer, the line L23 of the second layer, and the line L10 of the first layer.

As described above, in the second embodiment, the data latch DL has the layout in which the lines L10 to L19 included in the first wiring layer mainly extend in the X direction and the lines L21 to L25 included in the second wiring layer mainly extend in the Y direction. Accordingly, each of the lines L10 to L19 in the first wiring layer and each of the lines L21 to L25 in the second wiring layer can be easily connected at the intersection point thereof. That is, the upper layer wiring can be efficiently laid out.

Note that, while the data latch control lines (the control line TI, the control line TL, the control line LI, and the control line LL) are the wiring lines of the first layer in the second embodiment, lines of the third layer, which is an upper layer relative to the first layer, may be used in combination. In this case, the sense amplifier control lines may be lines of the first layer or may be a combination of wiring lines of the first layer and wiring lines of the third layer.

Also, wire connection inside the data latch (wire connection of the node INV and wire connection of the node LAT)

is performed using wiring lines of the first layer in the second embodiment, the wire connection may be performed using both wiring lines of the first layer and wiring lines of the second layer.

While FIGS. 14 and 15 illustrate, as an example, the data latch DL1 having the layout configuration of the data latch DL of FIG. 8, for example, the data latch DL1 may have the layout configuration of the data latch DL of FIG. 9. In this case, the layout configuration of the data latch DL of FIG. 9 is translationally arranged at the Y-direction width of the data latch DL in the Y direction and invertedly arranged at the X-direction width of the data latch DL in the X direction. Accordingly, based on the layout configuration of the data latch DL of FIG. 9, the layout configuration for four data latches DL corresponding to FIG. 14 can be achieved.

The data latch DL1 may have the layout configuration of the data latch DL of FIG. 10. In this case, the layout configuration of the data latch DL of FIG. 10 is translationally arranged at the Y-direction width of the data latch DL in the Y direction and invertedly arranged at the X-direction width of the data latch DL in the X direction. Accordingly, based on the layout configuration of the data latch DL of FIG. 10, the layout configuration for four data latches DL corresponding to FIG. 14 can be achieved.

The data latch DL1 may have the layout configuration of the data latch DL of FIG. 11. In this case, the layout configuration of the data latch DL of FIG. 11 is translationally arranged at the Y-direction width of the data latch DL in the Y direction and invertedly arranged at the X-direction width of the data latch DL in the X direction. Accordingly, based on the layout configuration of the data latch DL of FIG. 11, the layout configuration for four data latches DL corresponding to FIG. 14 can be achieved.

Figure 16:
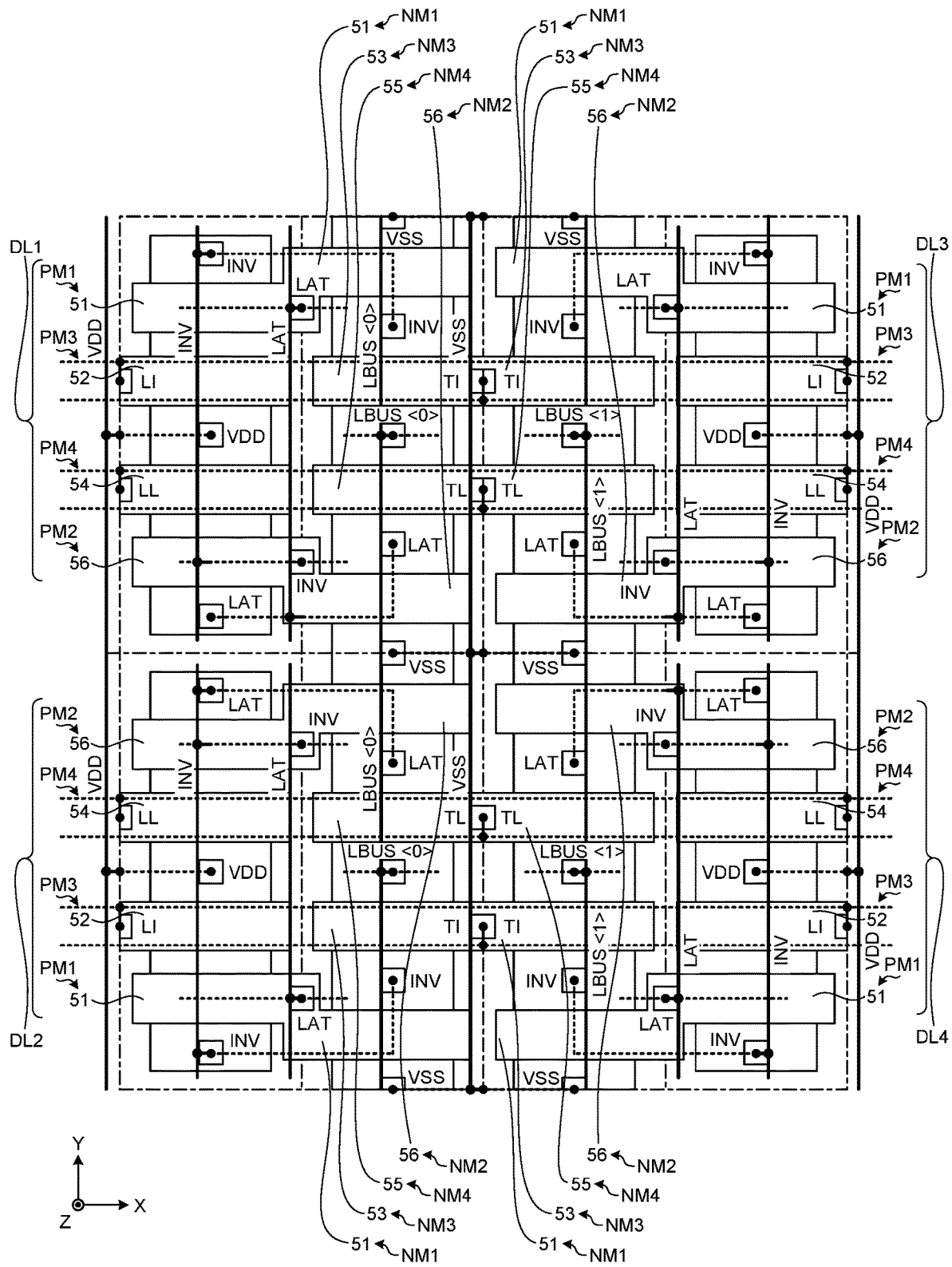
FIG. 16 is a plan view illustrating the layout configuration of a data latch in a first modification of the second embodiment.
Figure 17:
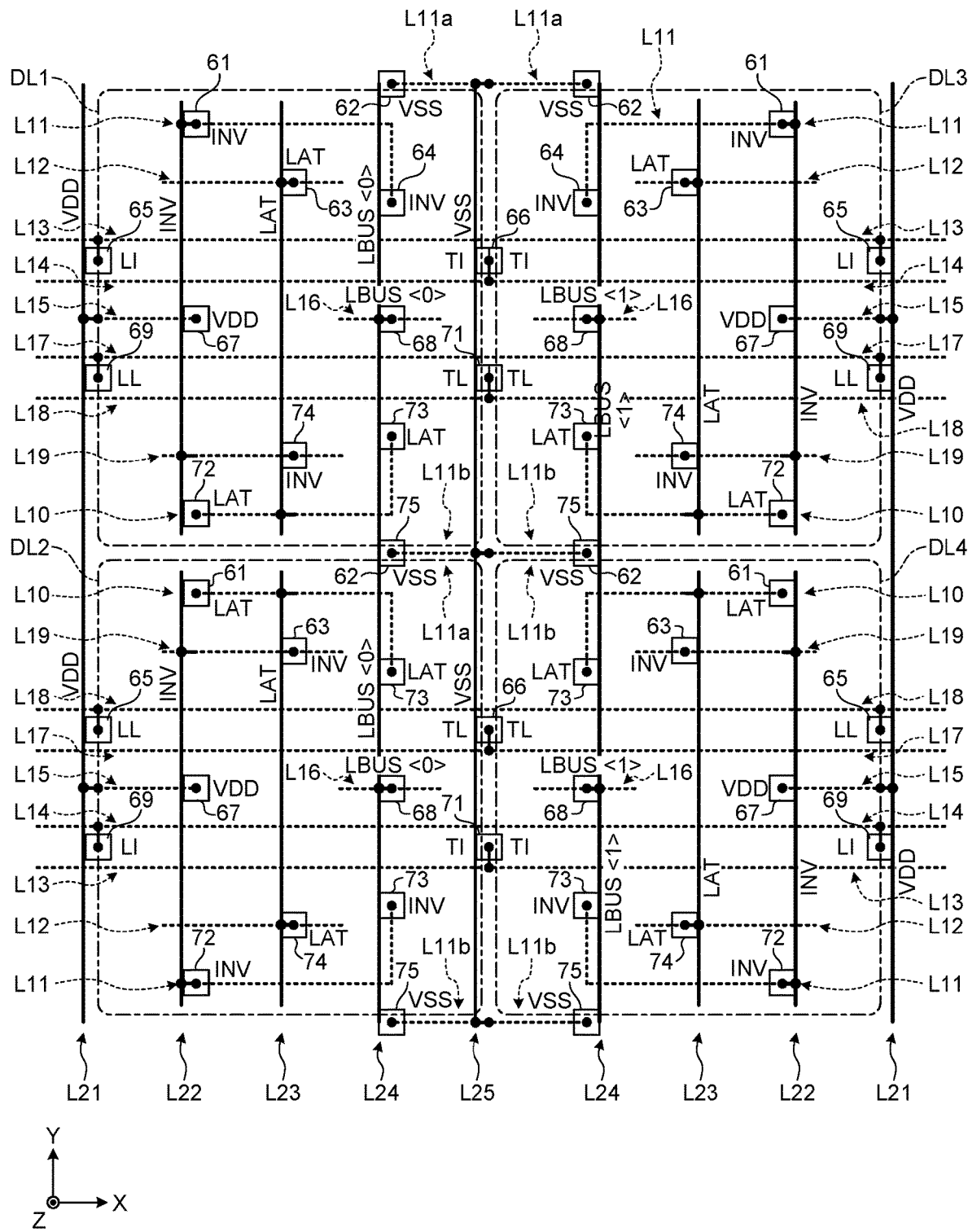
FIG. 17 is a plan view illustrating the schematic layout configuration of upper layer wiring in a first modification of the second embodiment.

Alternatively, the layout of the data latches DL1 and DL2 adjacent to each other in the Y direction may be an inverted arrangement in the Y direction as illustrated in FIGS. 16 and 17 instead of the translational arrangement in the Y direction as illustrated in FIG. 14. FIG. 16 is a plan view illustrating the layout configuration of data latches DL. FIG. 17 is a plan view illustrating the schematic layout configuration of upper layer wiring. Note that, in FIGS. 16 and 17, each line in the upper layer wiring represents the connection relationship between nodes (contact plugs) to illustrate the schematic layout configuration, and the layout in the drawings may differ from the actual layout (width and pattern) of the lines.

In the layout configuration illustrated in FIGS. 16 and 17, the layout of the active regions, the gate electrodes, and the upper layer wiring is in an inverted arrangement relationship in the Y direction between the two data latches DL1 and DL2 adjacent to each other in the Y direction. That is, the layout of the data latch DL1 turned around, that is, linearly symmetrically moved with respect to the −Y-side boundary substantially overlaps the layout of the data latch DL2.

Note that the layout of the active regions, the gate electrodes, and the upper layer wiring in the two data latches DL1 and DL3 adjacent to each other in the X direction is similar to the layout configuration of FIG. 14 in that the layout is in an inverted arrangement relationship in the X direction. The layout configuration is similar to the layout configuration of FIG. 15 in that, in the data latch DL1, the line of the first layer is connected to the gate electrode of each of the transistors NM3, NM4, PM3, and PM4, and the transistors NM1, NM2, PM1, and PM2 are connected to each other via the lines of the first layer and the lines of the second layer.

Also in the layout configuration illustrated in FIGS. 16 and 17, the lines L10 to L19 included in the first wiring layer mainly extend in the X direction and the lines L21 to L25 included in the second wiring layer mainly extend in the Y direction. Accordingly, each of the lines L10 to L19 in the first wiring layer and each of the lines L21 to L25 in the second wiring layer can be easily connected at the intersection point thereof. That is, the upper layer wiring can be efficiently laid out.

Figures 18, 19:
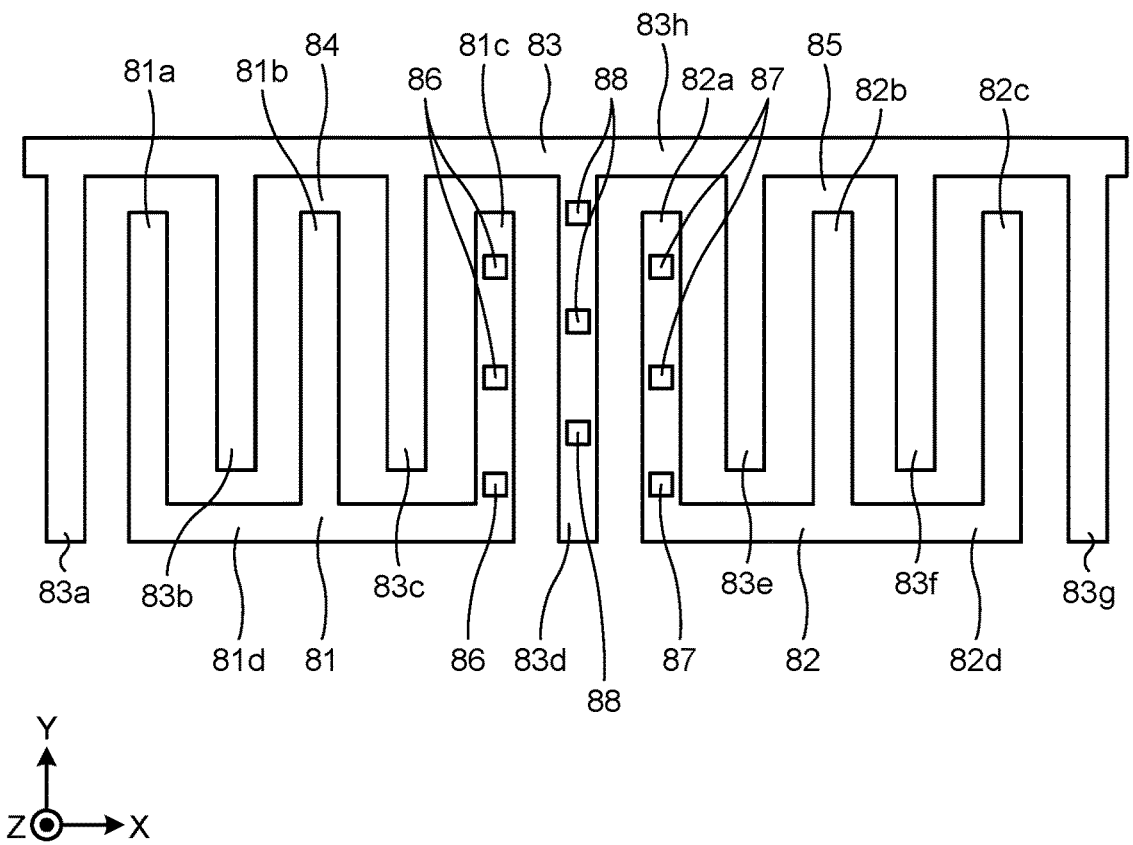
FIG. 18 is a diagram illustrating upper layer wiring of a sense amplifier and a data latch in a second modification of the second embodiment.
FIG. 19 is a plan view illustrating the layout configuration of a capacitive element of the sense amplifier in the second modification of the second embodiment.

Furthermore, the upper layer wiring in the data latch DL illustrated in FIGS. 16 and 17 may be three-layer wiring as illustrated in FIG. 18. FIG. 18 is a diagram illustrating upper layer wiring of a sense amplifier and a data latch in a second modification of the second embodiment. A wiring line of the third layer may be formed of an X-direction wiring line in addition to a wiring line of the first layer formed of an X-direction wiring line and a wiring line of the second layer formed of a Y-direction wiring line. The wiring line of the first layer may be a local control line. For example, the lines L12, L13, L14, L17, L18, and L19 of the first layer illustrated in FIG. 15 or 17 are the local control lines respectively connected to the gate electrodes 51, 52, 53, 54, 55, and 56. The wiring line of the third layer may be a global control line. For example, the control line extending from the control unit 112 or the column decoder 118 to the sense amplifier block 120 illustrated in FIG. 1 is the global control line.

At this time, as illustrated in FIG. 18, the upper layer wiring in the sense amplifier SA (refer to FIG. 6) may be three-layer wiring corresponding to the upper layer wiring in the data latch DL. A wiring line of the third layer may be formed of an MIM wiring line in addition to a wiring line of the first layer formed of an X-direction wiring line and a wiring line of the second layer formed of a Y-direction wiring line. The wiring line of the first layer may be a global control line. For example, the control line extending from the control unit 112 or the column decoder 118 to the sense amplifier block 120 illustrated in FIG. 1 is the global control line. That is, the global control line of the sense amplifier SA and the global control line of the data latch DL are formed in the different wiring layers, which makes it possible to easily improve the flexibility in each wiring layout.

In the sense amplifier SA, when the control line is the wiring line of the first layer, the wiring line of the third layer may be an MIM wiring capacitor. The capacitive element C1 illustrated in FIG. 6 may be formed of an MIM wiring line such as an MIM wiring capacitor. When the capacitive element C1 is formed of an MIM wiring line such as an MIM wiring capacitor, two sets of patterns including wiring lines arranged in a comb-like shape are laid out so that comb teeth are meshed with each other with a space therebetween. That is, the capacitive element is formed of an inter-wire capacitance, and the capacitive element is formed on top of other components in the sense amplifier. This makes it possible to reduce the layout area compared to a case where the capacitive element is configured using electrodes opposed between different wiring layers or a case where the capacitive element is configured using the gate capacitance of the transistor.

For example, the capacitive element C1 has a layout as illustrated in FIG. 19 in which patterns 81 and 82 are meshed with a pattern 83 in the Y direction with insulating films 84 and 85 interposed therebetween. FIG. 19 is a plan view illustrating the layout configuration of the capacitive element C1 of the sense amplifier SA.

The pattern 81 includes plural lines 81a to 81c and a line 81d. The lines 81a to 81c are arranged in the X direction at a predetermined pitch and extend in the Y direction. The line 81*d* connects the lines 81*a* to 81*c* to each other. The line 81*d* is connected to the −Y-side end of each of the lines 81*a* to 81*c*.

The pattern 82 is disposed on the +X side of the pattern 81 with a space therebetween. The pattern 82 includes plural lines 82*a* to 82*c* and a line 82*d*. The lines 82*a* to 82*c* are arranged in the X direction at a predetermined pitch and extend in the Y direction. The line 82*d* connects the lines 82*a* to 82*c* to each other. The line 82*d* is connected to the −Y-side end of each of the lines 82*a* to 82*c*.

The pattern 83 includes plural lines 83*a* to 83*g* and a line 81*h*. The lines 83*a* to 83*g* are arranged in the X direction at a predetermined pitch and extend in the Y direction. The line 83*h* connects the lines 83*a* to 83*g* to each other. The line 83*h* is connected to the +Y-side end of each of the lines 83*a* to 83*g*.

The lines 81*a* to 81*c* are disposed between the lines 83*a* to 83*d*, and the lines 82*a* to 82*c* are disposed between the lines 83*d* to 83*g*. The lines 83*a* to 83*d* are spaced from the lines 81*a* to 81*c* in the X direction with the insulating film 84 interposed therebetween. The lines 83*d* to 83*g* are spaced from the lines 82*a* to 82*c* in the X direction with the insulating film 85 interposed therebetween.

The clock signal SACLK for the sense amplifier is fed to the pattern 81 via a contact plug 86 and the line of the second layer. The clock signal SACLK for the sense amplifier is fed to the pattern 82 via a contact plug 87 and the line of the second layer. The pattern 83 is connected to the sense node SEN (refer to FIG. 6) via a contact plug 88 and the line of the second layer.

Alternatively, the pattern 81 is connected to the sense node SEN (refer to FIG. 6) via the contact plug 86 and the line of the second layer. The pattern 82 is connected to the sense node SEN via the contact plug 87 and the line of the second layer. The clock signal SACLK for the sense amplifier is fed to the pattern 83 via the contact plug 88 and the line of the second layer.

While FIG. 19 illustrates, as an example, the configuration in which the contact plug 86 is connected to the line 81*c* of the pattern 81, the contact plug 86 may be connected to another location in the pattern 81. While the configuration in which the contact plug 87 is connected to the line 82*a* of the pattern 82 is illustrated as an example, the contact plug 87 may be connected to another location in the pattern 82. While the configuration in which the contact plug 88 is connected to the line 83*d* of the pattern 83 is illustrated as an example, the contact plug 88 may be connected to another location in the pattern 83. The number of contact plugs 86, the number of contact plugs 87, and the number of contact plugs 88 are not limited to the numbers illustrated in FIG. 19.

In this manner, the capacitive element C1 can be constituted by the layout in which the patterns 81 and 82 are meshed with the pattern 83 in the Y direction with the insulating films 84 and 85 interposed therebetween inside the third layer wiring.

Figure 20:
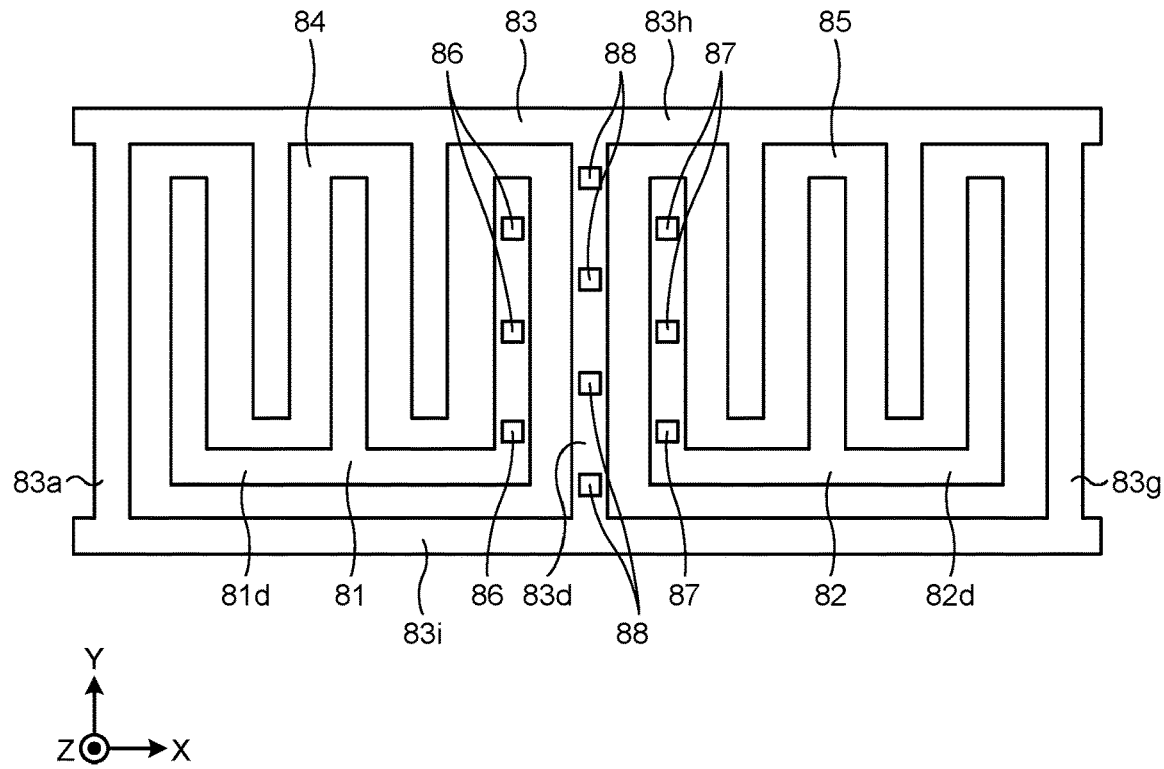
FIG. 20 is a plan view illustrating the layout configuration of the capacitive element of the sense amplifier in the second modification of the second embodiment.

Alternatively, the capacitive element C1 may have a layout as illustrated in FIG. 20 in which the pattern 83 surrounds the patterns 81 and 82, and the patterns 81 and 82 are meshed with the pattern 83 in the Y direction with the insulating films 84 and 85 interposed therebetween. FIG. 20 is a plan view illustrating the layout configuration of the capacitive element C1 of the sense amplifier SA.

A line 83*i* is additionally included in the pattern 83 in the layout configuration illustrated in FIG. 19 to obtain the layout configuration illustrated in FIG. 20.

The line 83*i* is connected to the −Y-side end of each of the lines 83*a*, 83*d*, and 83*g*. The line 83*i* faces the line 81*d* and the line 82*d*. The line 83*i* and the line 81*d* are spaced from each other in the Y direction with the insulating film 84 interposed therebetween. The line 83*i* and the line 82*d* are spaced from each other in the Y direction with the insulating film 85 interposed therebetween. Note that the number of contact plugs 86, the number of contact plugs 87, and the number of contact plugs 88 are not limited to the numbers illustrated in FIG. 20.

In this manner, the capacitive element C1 can be constituted by the layout in which the pattern 83 surrounds the patterns 81 and 82, and the patterns 81 and 82 are meshed with the pattern 83 in the Y direction with the insulating films 84 and 85 interposed therebetween inside the third layer wiring.

Figure 21:
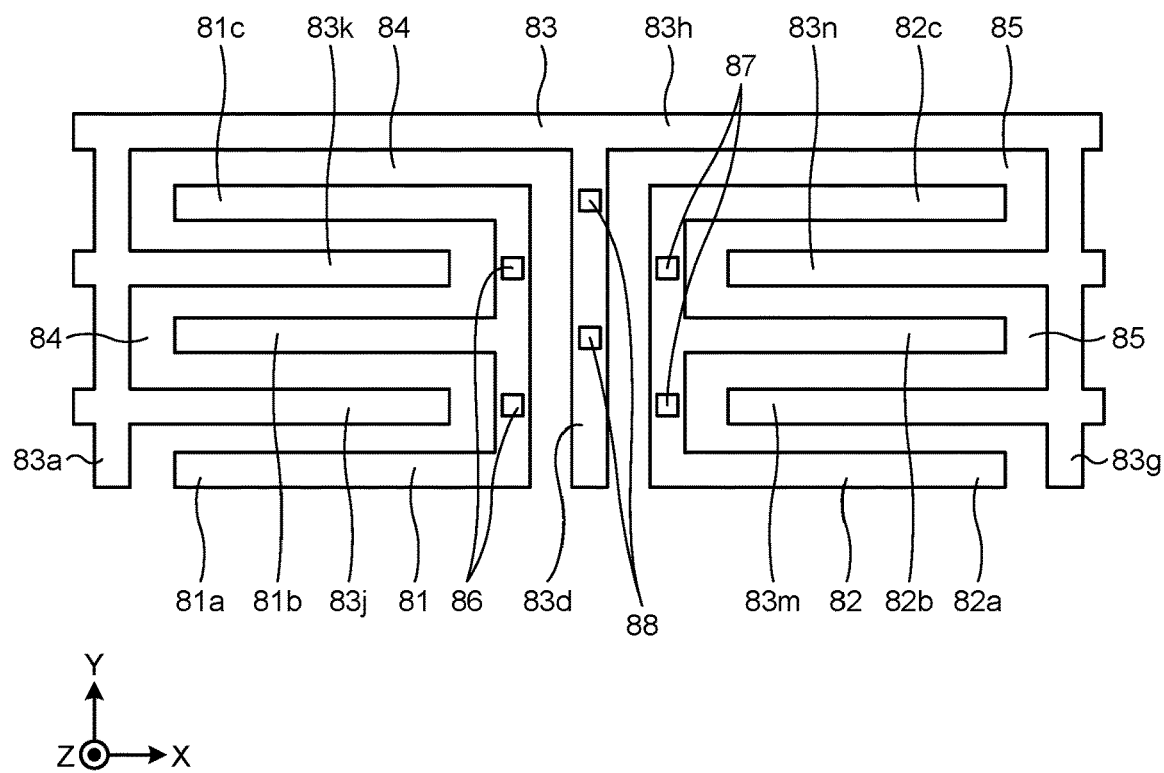
FIG. 21 is a plan view illustrating the layout configuration of the capacitive element of the sense amplifier in the second modification of the second embodiment.

Alternatively, the capacitive element C1 may have a layout as illustrated in FIG. 21 in which the patterns 81 and 82 are meshed with the pattern 83 in the X direction with the insulating films 84 and 85 interposed therebetween. FIG. 21 is a plan view illustrating the layout configuration of the capacitive element C1 of the sense amplifier SA.

The lines 83*b*, 83*c*, 83*e*, and 83*f* are eliminated from the pattern 83 and lines 83*j*, 83*k*, 83*m*, and 83*n* are additionally included in the pattern 83 in the layout configuration illustrated in FIG. 19 to obtain the layout configuration illustrated in FIG. 21.

The lines 83*j* and 83*k* are arranged in the Y direction at a predetermined pitch and extend in the X direction. The line 83*a* connects the lines 83*j*, 83*k*, and 83*h* to each other. The line 83*a* is connected to the −X-side end of each of the lines 83*j*, 83*k* and 83*h*.

The lines 83*m* and 83*n* are arranged in the Y direction at a predetermined pitch and extend in the X direction. The line 83*g* connects the lines 83*m*, 83*n*, and 83*h* to each other. The line 83*g* is connected to the +X-side end of each of the lines 83*m*, 83*n* and 83*h*.

The lines 83*j* and 83*k* are disposed between the lines 81*a* to 81*c*. The lines 81*b* and 81*c* are disposed between the lines 83*j*, 83*k*, and 83*h*. The lines 83*m* and 839*n* are disposed between the lines 82*a* to 82*c*. The lines 82*b* and 82*c* are disposed between the lines 83*m*, 83*n*, and 83*h*. The lines 83*j*, 83*k*, and 83*h* are spaced from the lines 81*a* to 81*c* in the Y direction with the insulating film 84 interposed therebetween. The lines 83*m*, 83*n*, and 83*h* are spaced from the lines 82*a* to 82*c* in the Y direction with the insulating film 85 interposed therebetween. Note that the number of contact plugs 86, the number of contact plugs 87, and the number of contact plugs 88 are not limited to the numbers illustrated in FIG. 21.

In this manner, the capacitive element C1 can be constituted by the layout in which the patterns 81 and 82 are meshed with the pattern 83 in the X direction with the insulating films 84 and 85 interposed therebetween inside the third layer wiring.

Figure 22:
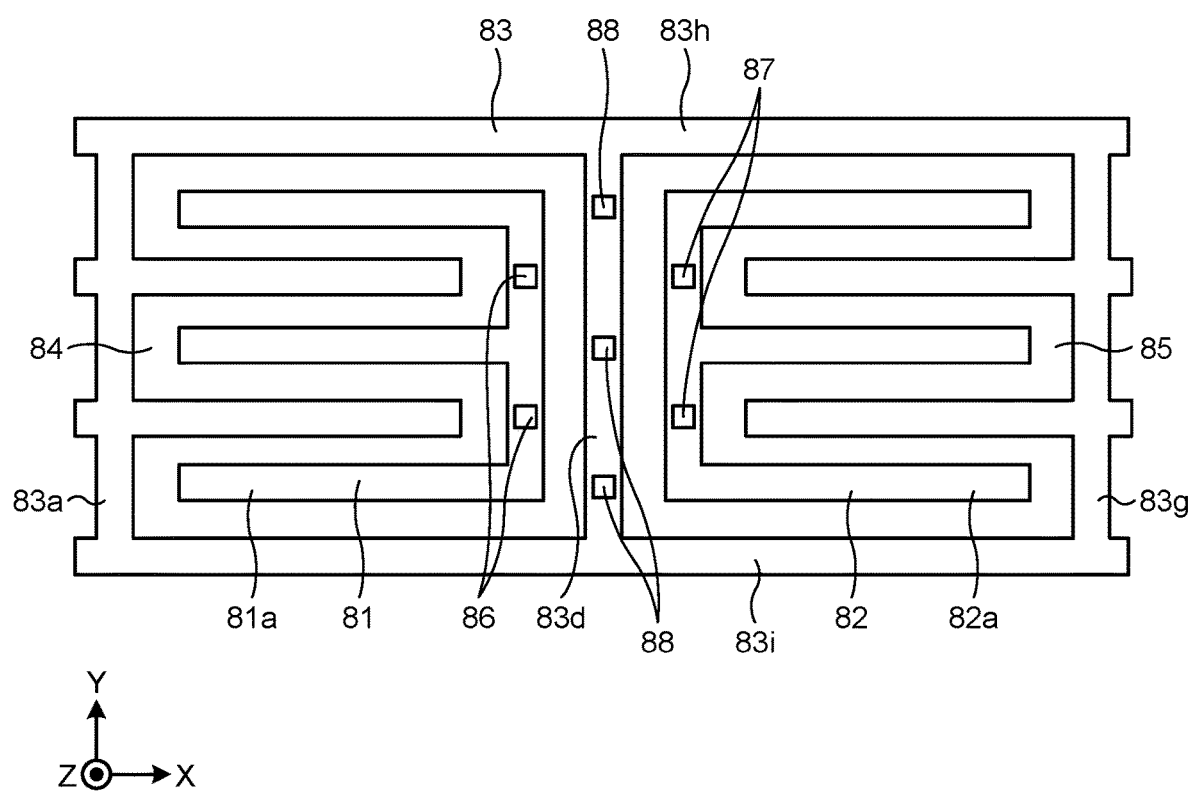
FIG. 22 is a plan view illustrating the layout configuration of the capacitive element of the sense amplifier in the second modification of the second embodiment.

Alternatively, the capacitive element C1 may have a layout as illustrated in FIG. 22 in which the pattern 83 surrounds the patterns 81 and 82, and the patterns 81 and 82 are meshed with the pattern 83 in the X direction with the insulating films 84 and 85 interposed therebetween. FIG. 22 is a plan view illustrating the layout configuration of the capacitive element C1 of the sense amplifier SA.

A line 83*i* is additionally included in the pattern 83 in the layout configuration illustrated in FIG. 21 to obtain the layout configuration illustrated in FIG. 22.

The line 83*i* is connected to the −Y-side end of each of the lines 83*a*, 83*d*, and 83*g*. The line 83*i* faces the line 81*a* and the line 82a. The line 83i and the line 81a are spaced from each other in the Y direction with the insulating film 84 interposed therebetween. The line 83i and the line 82a are spaced from each other in the Y direction with the insulating film 85 interposed therebetween. Note that the number of contact plugs 86, the number of contact plugs 87, and the number of contact plugs 88 are not limited to the numbers illustrated in FIG. 22.

In this manner, the capacitive element C1 can be constituted by the layout in which the pattern 83 surrounds the patterns 81 and 82, and the patterns 81 and 82 are meshed with the pattern 83 in the X direction with the insulating films 84 and 85 interposed therebetween inside the third layer wiring.

Figure 23:
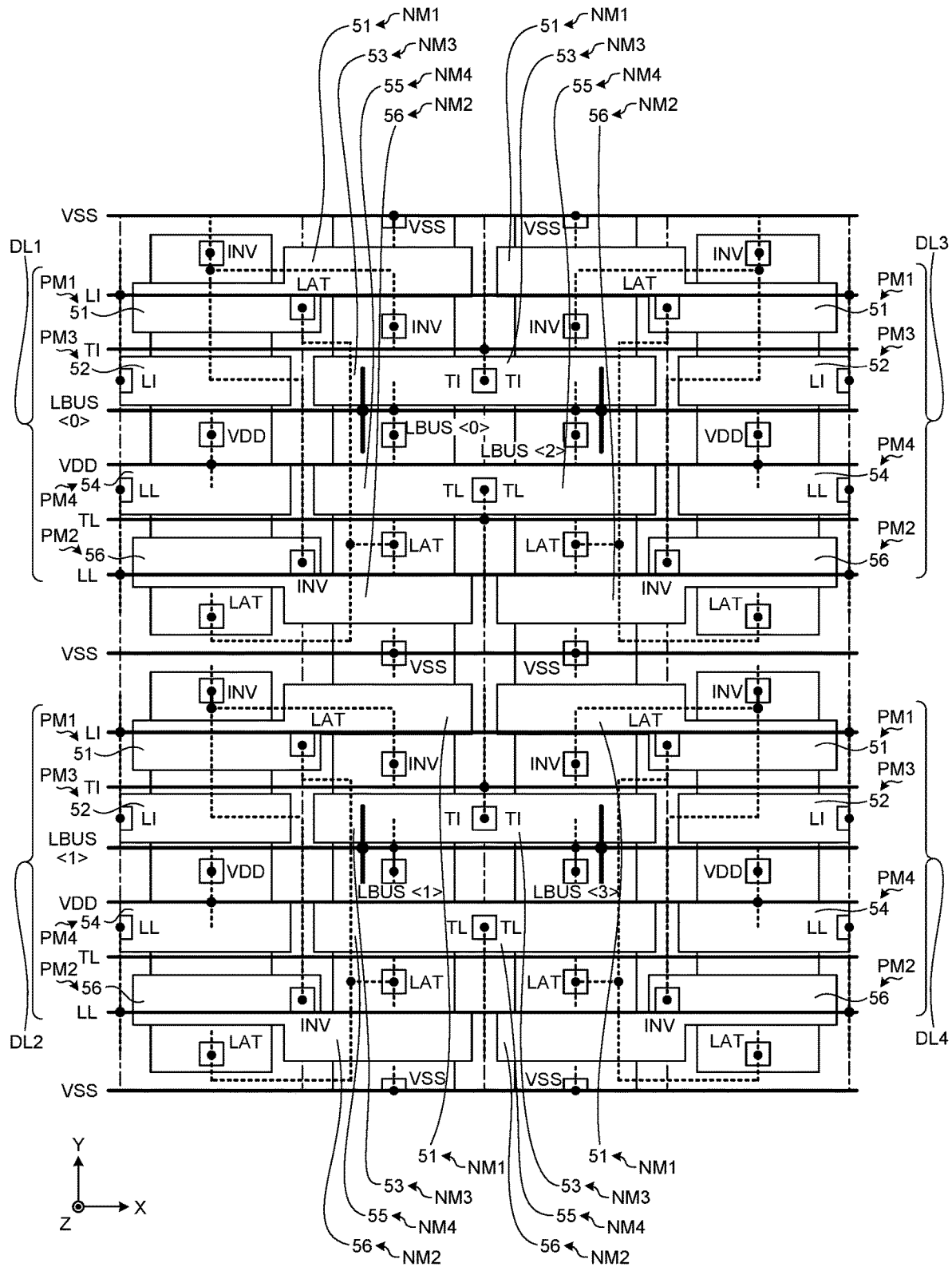
FIG. 23 is a plan view illustrating the layout configuration of a data latch in a third modification of the second embodiment.
Figure 24:
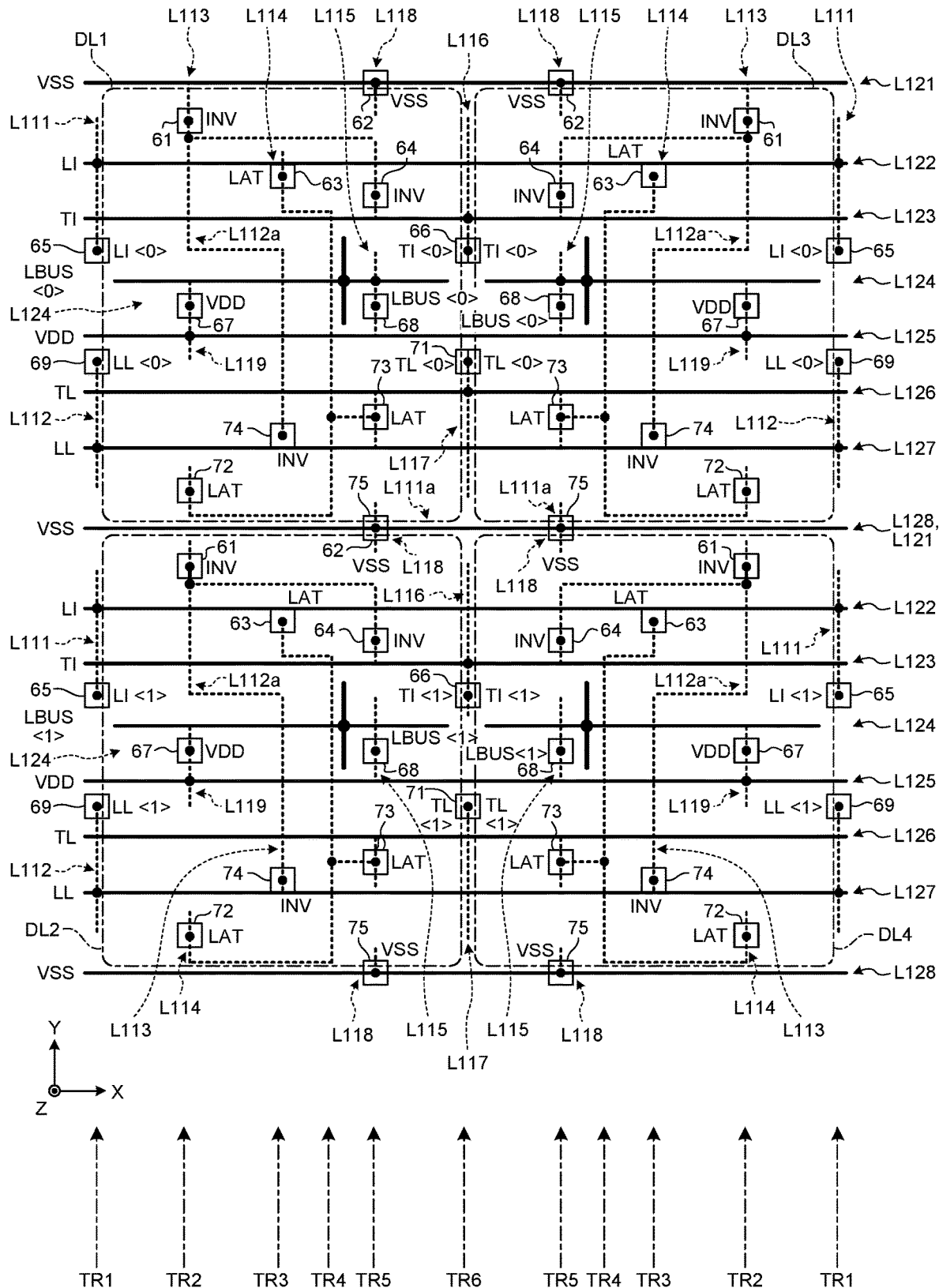
FIG. 24 is a plan view illustrating the schematic layout configuration of upper layer wiring in the third modification of the second embodiment.

Alternatively, the upper layer wiring of the data latch DL may have a layout in which lines of the first layer mainly extend in the Y direction and lines of the second layer mainly extend in the X direction as illustrated in FIGS. 23 and 24. FIG. 23 is a plan view illustrating the layout configuration of a data latch in a third modification of the second embodiment. FIG. 24 is a plan view illustrating the schematic layout configuration of upper layer wiring in the third modification of the second embodiment. Note that, in FIGS. 23 and 24, each line in the upper layer wiring represents the connection relationship between nodes (contact plugs) for the sake of simplification, and the layout in the drawings may differ from the actual layout (width and pattern) of the lines.

The layout of the upper layer wiring extracted from the layout configuration illustrated in FIG. 23 is as illustrated in FIG. 24.

Lines L110 to L119 of the first layer mainly extend in the Y direction as indicated by dotted lines in FIG. 24. Lines L121 to L128 of the second layer mainly extend in the X direction as indicated by solid lines in FIG. 24.

When focusing attention on the data laches DL1 and DL3 adjacent to each other in the X direction, the line L121 of the second layer is shared between the data latches DL1 and DL3 and extends in the X direction near the +Y-side boundaries of the data latches DL1 and DL3. The line L121 is a ground line VSS and connected to the contact plug 62 corresponding to the ground node VSS (refer to FIG. 7) of each of the data latches DL1 and DL3 via the line L118 of the first layer.

The line L118 of the first layer extends, at an X position corresponding to the contact plug 62, in the Y direction from the Y position of the line L121 to the Y position of the contact plug 62.

The line L122 of the second layer is shared between the data laches DL1 and DL3 and extends in the X direction at a Y position adjacent to the L121 on the −Y side. The line L122 is a signal line LI and connected to the contact plug 65 corresponding to the control node LI (refer to FIG. 7) of each of the data latches DL1 and DL3 via the line L111 of the first layer.

The line L111 of the first layer extends, at an X position corresponding to the contact plug 65, in the −Y direction from the Y position of the line L122 to the Y position of the contact plug 65.

The line L123 of the second layer is shared between the data laches DL1 and DL3 and extends in the X direction at a Y position adjacent to the L122 on the −Y side. The line L123 is a signal line TI and connected to the contact plug 65 corresponding to the control node TI (refer to FIG. 7) of each of the data latches DL1 and DL2 via the line L116 of the first layer.

The line L124 of the second layer is shared between the data laches DL1 and DL3 and extends in the X direction near the Y-direction centers of the data latches DL1 and DL3. The line L124 is a signal line LBUS and connected to the contact plug 68 corresponding to the node LBUS (refer to FIG. 7) of each of the data latches DL1 and DL3 via the line L115 of the first layer.

The line L115 of the first layer extends, at an X position corresponding to the contact plug 68, in the −Y direction from the Y position of the line L124 to the Y position of the contact plug 68.

The line L125 of the second layer is shared between the data laches DL1 and DL3 and extends in the X direction at a Y position adjacent to the L124 on the −Y side. The line L125 is a power supply line VDD and connected to the contact plug 67 corresponding to the power supply node VDD (refer to FIG. 7) of each of the data latches DL1 and DL3 via the line L119 of the first layer.

The line L126 of the second layer is shared between the data laches DL1 and DL3 and extends in the X direction at a Y position adjacent to the line L125 on the −Y side. The line L126 is a signal line TL and connected to the contact plug 71 corresponding to the control node TL (refer to FIG. 7) of each of the data latches DL1 and DL3 via the line L117 of the first layer.

The line L117 of the first layer extends, at an X position corresponding to the contact plug 71, in the +Y direction from the Y position of the line L126 to the Y position of the contact plug 71.

The line L127 of the second layer is shared between the data laches DL1 and DL3 and extends in the X direction at a Y position adjacent to the L125 on the −Y side. The line L126 is a signal line TL and connected to the contact plug 71 corresponding to the control node TL (refer to FIG. 7) of each of the data latches DL1 and DL3 via the line L117 of the first layer.

The line L117 of the first layer extends, at an X position corresponding to the contact plug 71, in the +Y direction from the Y position of the line L126 to the Y position of the contact plug 71.

The line L128 of the second layer is shared between the data laches DL1 and DL3 and extends in the X direction near the −Y-side boundaries of the data latches DL1 and DL3. The line L128 is a ground line VSS and connected to the contact plug 75 corresponding to the ground node VSS (refer to FIG. 7) of each of the data latches DL1 and DL3 via the line L111a of the first layer.

The line L111a of the first layer extends, at an X position corresponding to the contact plug 75, in the Y direction from the Y position of the line L128 to the Y position of the contact plug 75.

The line L121 and the contact plug 62 are respectively common with the line L128 and the contact plug 75 of the data latch DL (not illustrated) adjacent thereto in the +Y direction. The line L128 and the contact plug 75 are respectively common with the line L121 and the contact plug 62 of the data latch DL2 adjacent thereto in the −Y direction.

The line L113 of the first layer is provided in each of the data latches DL1 and DL2 and functions as a local wiring line inside each of the data latches DL1 and DL2. The line L113 extends in the −Y direction from an XY position corresponding to the contact plug 61, shifts in the +X direction to the X position of the contact plug 74, and extends in the −Y direction to the Y position of the contact plug 74. Also, the line L113 shifts in the +X direction from the XY position corresponding to the contact plug 61 to the X position of the contact plug 69 and extends in the −Y direction to the Y position of the contact plug 64.

The line L114 of the first layer is provided in each of the data latches DL1 and DL2 and functions as a local wiring line inside each of the data latches DL1 and DL2. The line L114 extends in the −Y direction from an XY position corresponding to the contact plug 63, shifts in the +X direction to an X position between the contact plugs 72 and 73, extends in the −Y direction to the Y position of the contact plug 73, and extends in the +X direction to the X position of the contact plug 73. Also, the line L114 extends in the −Y direction, shifts in the +X direction to the X position between the contact plugs 72 and 73, extends in the −Y direction to a position near the Y position of the contact plug 72, extends in the −X direction to the X position of the contact plug 72, and extends in the +Y direction to the Y position of the contact plug 72.

The line L112a of the first layer shifts in the +X direction from an XY position corresponding to the contact plug 75 to an X position between the contact plugs 63 and 73, extends in the +Y direction, and shifts, at the Y position of the contact plug 73, in the +X direction to the X position of the contact plug 74. Also, the line L112a of the first layer shifts in the +X direction from the XY position corresponding to the contact plug 75 to the X position between the contact plugs 63 and 73, extends in the +Y direction, shifts in the −X direction to the X position of the contact plug 63, and extends in the +Y direction to the Y position of the contact plug 63.

As illustrated in FIGS. 23 and 24, the layout of the active regions, the gate electrodes, and the upper layer wiring is in a translational arrangement relationship in the Y direction between the two data latches DL1 and DL2 adjacent to each other in the Y direction. That is, the layout of the data latch DL1 moved in the −Y direction at the Y-direction width of one data latch DL1 substantially overlaps the layout of the data latch DL2.

Accordingly, the positional relationship between the plural transistors PM1 to PM4 and the plural transistors NM1 to NM4 is similar between the two data laches DL1 and DL2 disposed adjacent to each other in the Y direction. In the data latch DL1, the plural transistors NM1 to NM4 is disposed on the +X side of the plural transistors PM1 to PM4. In the data latch DL2, the plural transistors NM1 to NM4 is disposed on the +X side of the plural transistors PM1 to PM4.

On the other hand, the layout of the active regions, the gate electrodes, and the upper layer wiring is in an inverted arrangement relationship in the X direction between the two data latches DL1 and DL3 adjacent to each other in the X direction. That is, the layout of the data latch DL1 turned around, that is, linearly symmetrically moved with respect to the +X-side boundary substantially overlaps the layout of the data latch DL3.

Accordingly, the positional relationship between the plural transistors PM1 to PM4 and the plural transistors NM1 to NM4 is inverted in the X direction between the two data laches DL1 and DL3 disposed adjacent to each other in the X direction. In the data latch DL1, the plural transistors NM1 to NM4 is disposed on the +X side of the plural transistors PM1 to PM4. In the data latch DL3, the plural transistors NM1 to NM4 is disposed on the −X side of the plural transistors PM1 to PM4.

The positional relationship between the plural transistors PM1 to PM4 and the plural transistors NM1 to NM4 is the same between the two data laches DL3 and DL4 disposed adjacent to each other in the Y direction. In the data latch DL4, the plural transistors NM1 to NM4 is disposed on the −X side of the plural transistors PM1 to PM4.

In the data latch DL1, the line of the first layer is connected to the gate electrode of each of the transistors NM3, NM4, PM3, and PM4. The line L116 of the first layer is connected to the gate electrode 53 of the transistor NM3. The line L117 of the first layer is connected to the gate electrode 55 of the transistor NM4. The line L111 of the first layer is connected to the gate electrode 52 of the transistor PM3. The line L112 of the first layer is connected to the gate electrode 54 of the transistor PM4.

The transistors NM1, NM2, PM1, and PM2 are connected to each other via the lines of the first layer and the lines of the second layer. For the node INV (refer to FIG. 7), the transistors NM1, NM2, PM1, and PM2 are connected to each other via the line L113 of the first layer, the line L22 of the second layer, and the line L19 of the first layer. For the node LAT (refer to FIG. 7), the transistors NM1, NM2, PM1, and PM2 are connected to each other via the line L12 of the first layer, the line L23 of the second layer, and the line L10 of the first layer.

Also in the layout configuration illustrated in FIGS. 23 and 24, the lines L10 to L19 included in the first wiring layer mainly extend in the X direction and the lines L21 to L25 included in the second wiring layer mainly extend in the Y direction. Accordingly, each of the lines L110 to L119 in the first wiring layer and each of the lines L121 to L128 in the second wiring layer can be easily connected at the intersection point thereof. That is, the upper layer wiring can be efficiently laid out.

Figure 25:
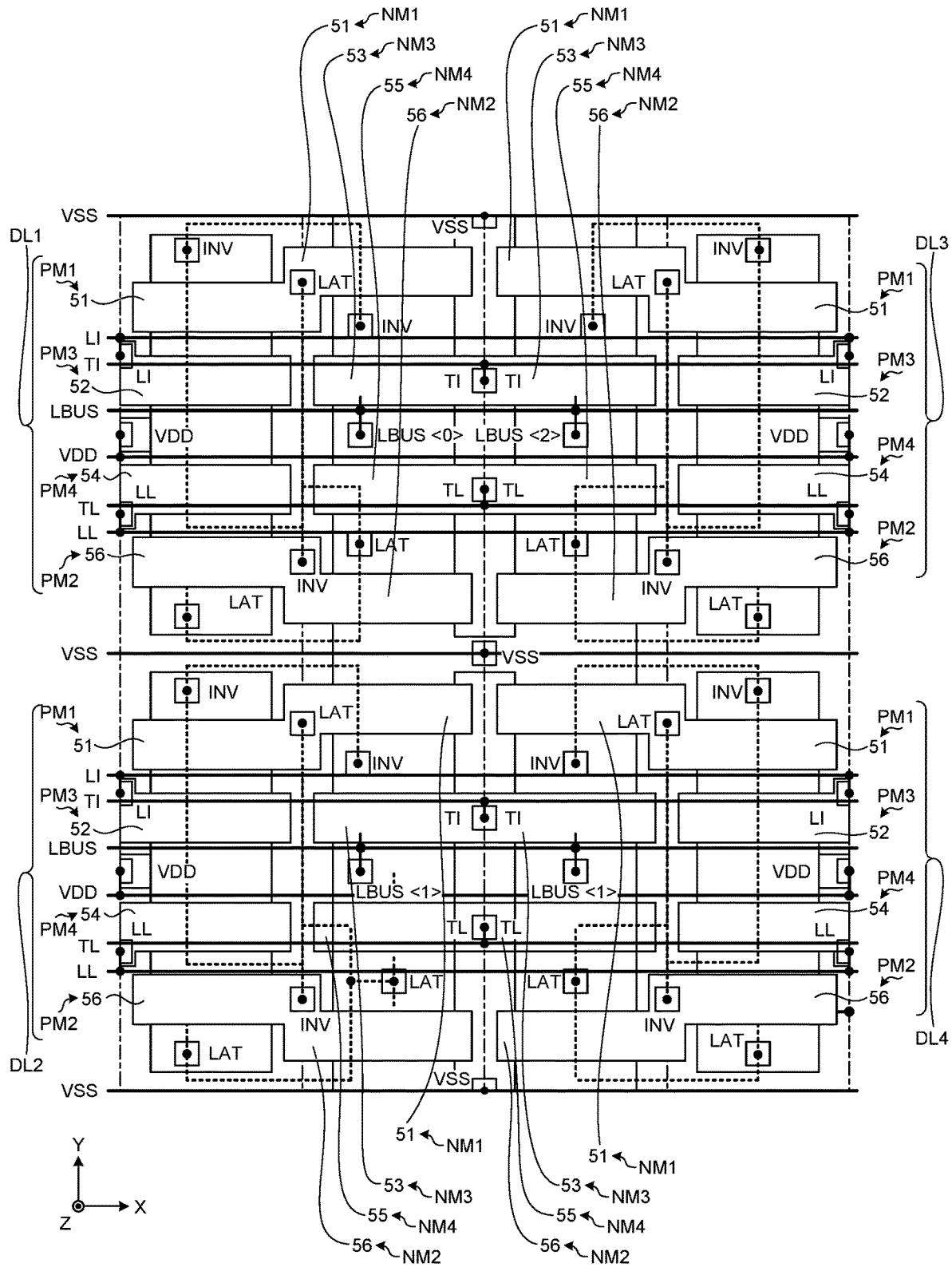
FIG. 25 is a plan view illustrating the layout configuration of a data latch in a fourth modification of the second embodiment.
Figure 26:
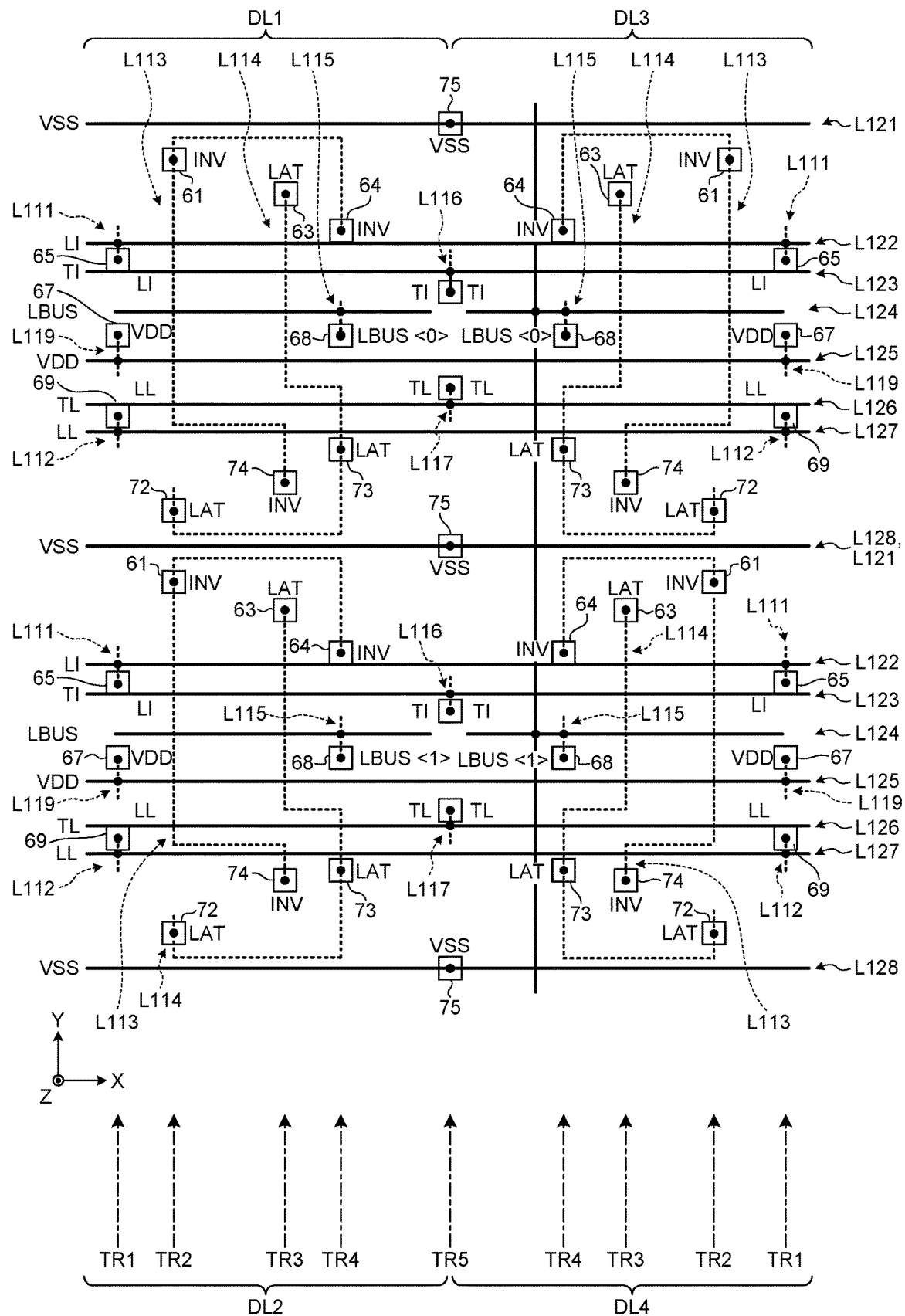
FIG. 26 is a plan view illustrating the schematic layout configuration of upper layer wiring in the fourth modification of the second embodiment.

Alternatively, the upper layer wiring of the data latch DL may have a layout as illustrated in FIGS. 25 and 26 in which the contact plugs 67 and 75 are shared between the data latches DL adjacent to each other in the X direction, and lines of the first layer mainly extend in the Y direction and lines of the second layer mainly extend in the X direction. FIG. 25 is a plan view illustrating the layout configuration of a data latch in a fourth modification of the second embodiment. FIG. 26 is a plan view illustrating the schematic layout configuration of upper layer wiring in the fourth modification of the second embodiment. Note that, in FIGS. 25 and 26, each line in the upper layer wiring represents the connection relationship between nodes (contact plugs) for the sake of simplification, and the layout in the drawings may differ from the actual layout (width and pattern) of the lines.

The configuration of FIG. 25 is similar to the layout configuration illustrated in FIG. 13 in that the contact plugs 61, 67, and 75 are disposed in the region in which the active regions are commonly connected between the adjacent data latches DL and shared between the adjacent data latches DL to enable an efficient layout using the region between the adjacent data latches DL.

Also, since the contact plugs 61, 67, and 75 are disposed in the region between the adjacent data latches DL, the number of wiring tracks in the first wiring layer can be reduced. Thus, the upper layer wiring can also be efficiently laid out. The number of wiring tracks means the number of lanes in which a wiring line can be laid straight. In the case of FIG. 25, since the wiring lines of the first layer mainly extend in the Y direction, each wiring track also extends in the Y direction.

For example, the layout of the upper layer wiring extracted from the layout configuration illustrated in FIG. 25 is as illustrated in FIG. 26. FIG. 26 illustrates, as an example, the layout configuration in which the number of wiring tracks of each data latch DL is four. When focusing attention on the data latch DL1, a wiring track TR1 is shared with the data latch adjacent thereto on the −X side and thus counted as 0.5 tracks. Wiring tracks TR2 to TR4 are counted as 3 tracks. A wiring track TR5 is shared with the data latch DL3 adjacent thereto on the +X side and thus counted as 0.5 tracks. The number of wiring tracks of the data latch DL1 is 0.5+3+0.5=4.

On the other hand, when focusing attention on the data latch DL1 in the layout configuration of FIG. 24, a wiring track TR1 is shared with the data latch adjacent thereto on the −X side and thus counted as 0.5 tracks. Wiring tracks TR2 to TR5 are counted as 3 tracks. A wiring track TR6 is shared with the data latch DL3 adjacent thereto on the +X side and thus counted as 0.5 tracks. The number of wiring tracks of the data latch DL1 is 0.5+4+0.5=5.

Compared to the layout configuration of FIG. 24, in the layout configuration of FIG. 26, the position of the contact plug 67 (VDD) is changed from the position on the wiring track TR2 of FIG. 24 to the position on the wiring track TR1, and the position of the contact plug 62 (VSS) is changed from the position on the wiring track TR5 of FIG. 24 to the position on the wiring track TR6 (from the position on the wiring track TR4 of FIG. 26 to the position on the wiring track TR5). As a result, the necessity of the wiring track TR4 of FIG. 24 is eliminated. That is, the number of wiring tracks of each data latch DL can be reduced from five to four. Accordingly, it is possible to improve reliability by expanding the wiring pitch, reduce the wiring parasitic capacitance by expanding the wiring pitch, and reduce power consumption and increase speed by reducing the wiring resistance.

Figures 27, 28:
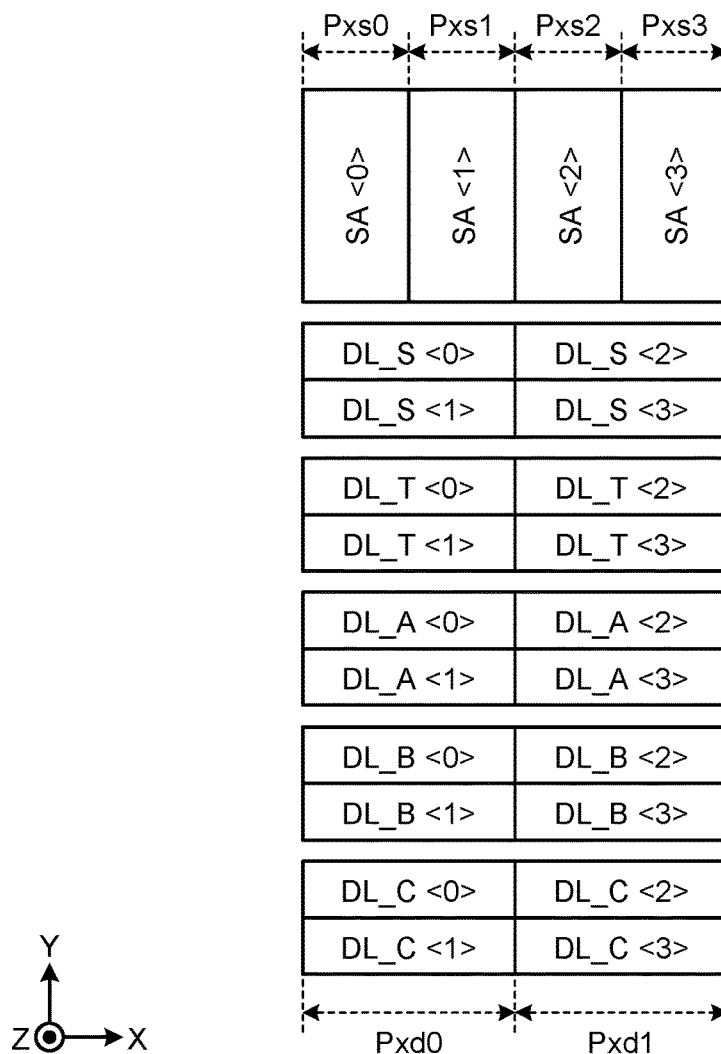
FIG. 27 is a diagram illustrating upper layer wiring of a sense amplifier and a data latch in a fifth modification of the second embodiment.
FIG. 28 is a plan view illustrating the layout configuration of plural sense amplifier circuits in a third embodiment.

Furthermore, the upper layer wiring in the data latch DL illustrated in FIGS. 23 and 24 may be three-layer wiring as illustrated in FIG. 27. FIG. 27 is a diagram illustrating the upper layer wiring of a sense amplifier and a data latch in a fifth modification of the second embodiment. A wiring line of the third layer may be formed of a Y-direction wiring line in addition to a wiring line of the first layer formed of a Y-direction wiring line and a wiring line of the second layer formed of an X-direction wiring line. The wiring line of the first layer may be a local control line. For example, the lines L114, L111, L116, L112, L117, and L113 of the first layer illustrated in FIG. 24 are the local control lines respectively connected to the gate electrodes 51, 52, 53, 54, 55, and 56. The wiring line of the third layer may be a global control line. For example, the control line extending from the control unit 112 or the column decoder 118 to the sense amplifier block 120 illustrated in FIG. 1 is the global control line.

At this time, as illustrated in FIG. 27, the upper layer wiring in the sense amplifier SA (refer to FIG. 6) may be three-layer wiring corresponding to the upper layer wiring in the data latch DL. A wiring line of the third layer may be formed of an MIM wiring line in addition to a wiring line of the first layer formed of a Y-direction wiring line and a wiring line of the second layer formed of an X-direction wiring line. The wiring line of the first layer may be a global control line. For example, the control line extending from the control unit 112 or the column decoder 118 to the sense amplifier block 120 illustrated in FIG. 1 is the global control line. That is, the global control line of the sense amplifier SA and the global control line of the data latch DL are formed in the different wiring layers, which makes it possible to easily improve the flexibility in each wiring layout.

In the sense amplifier SA, when the control line is the wiring line of the first layer, the wiring line of the third layer may be an MIM wiring capacitor. The capacitive element C1 illustrated in FIG. 6 may be formed of an MIM wiring line such as an MIM wiring capacitor. When the capacitive element C1 is formed of an MIM wiring line such as an MIM wiring capacitor, two sets of patterns including wiring lines arranged in a comb-like shape are laid out so that comb teeth are meshed with each other with a space therebetween. Accordingly, it is possible to ensure a sufficient capacitance of the capacitive element C1 while making the layout area compact. The capacitive element C1 may have the MIM structure as illustrated in FIGS. 19 to 22.

Third Embodiment

A semiconductor memory device 100 according to a third embodiment will be described. Hereinbelow, differences from the first embodiment and the second embodiment will be mainly described.

While the layout inside the data latch DL is described, as an example, in the first embodiment and the second embodiment, the layout of a sense amplifier SA and plural data latches DL is described, as an example, in the third embodiment.

Specifically, plural sense amplifier circuits SADL<0> to SADL<3> in the sense amplifier block 120 (refer to FIG. 4) can be laid out as illustrated in FIG. 28. FIG. 28 is a plan view illustrating the layout configuration of the plural sense amplifier circuits SADL<0> to SADL<3> in the third embodiment.

The sense amplifier circuit SADL<0> includes a sense amplifier SA<0>, and plural data latches DL_S<0>, DL_<0>, DL_A<0>, DL_B<0>, and DL_C<0> (refer to FIG. 5). Similarly, the sense amplifier circuit SADL<1> includes a sense amplifier SA<1>, and plural data latches DL_S<1>, DL_T<1>, DL_A<1>, DL_B<1>, and DL_C<1>. The sense amplifier circuit SADL<2> includes a sense amplifier SA<2>, and plural data latches DL_S<2>, DL_T<2>, DL_A<2>, DL_B<2>, and DL_C<2>. The sense amplifier circuit SADL<3> includes a sense amplifier SA<3>, and plural data latches DL_S<3>, DL_T<3>, DL_A<3>, DL_B<3>, and DL_C<3>. Note that an index following DL in an element number indicates the use of the data latch DL. For example, "_S" indicates that the data latch DL is for storage (S). "_T" indicates that the data latch DL is for transfer (T). "_A" indicates that the data latch DL is the first data latch for holding (A). "_B" indicates that the data latch DL is the second data latch for holding (B). "_C" indicates that the data latch DL is the third data latch for holding (C).

In the sense amplifier block 120, the sense amplifiers SA may be arranged in the X direction at a predetermined pitch, and the data latches DL may be arranged in the X direction at twice the predetermined pitch.

In the layout configuration of FIG. 28, the arrangement pitch of two sense amplifiers SA in the X direction corresponds to the arrangement pitch of one data latch DL in the X direction, and plural data latches DL corresponding to two sense amplifiers SA is arranged in the Y direction on a use by use basis.

Accordingly, the data latch control lines (the control line TI, the control line TL, the control line LI, and the control line LL) may be commonized or closely disposed on a use by use basis of the data latch DL. Thus, drivers for the data latch control lines can be efficiently disposed in the peripheral circuit 150.

For example, the sense amplifier SA<0> and the sense amplifier SA<1> are arranged side by side in the X direction with their longitudinal directions aligned with the Y direction. Relative to the −X-side end of the sense amplifier SA, an X-direction arrangement pitch Pxs0 of the sense amplifier SA<0> is substantially equal to an X-direction arrangement pitch Pxs1 of the sense amplifier SA<1>. The X-direction arrangement pitch Pxs0 of the sense amplifier SA<0>, the X-direction arrangement pitch Pxs1 of the sense amplifier SA<1>, and an X-direction arrangement pitch Pxd0 of the data latch DL have a relationship of the following Formula 1.

$$Pxd0 \cong Pxs0 + Pxs1 \cong 2 \times Pxs0 \cong 2 \times Pxs1 \qquad \text{Formula 1}$$

Similarly, the sense amplifier SA<2> and the sense amplifier SA<3> are arranged side by side in the X direction with their longitudinal directions aligned with the Y direction. Relative to the −X-side end of the sense amplifier SA, an X-direction arrangement pitch Pxs2 of the sense amplifier SA<2> is substantially equal to an X-direction arrangement pitch Pxs3 of the sense amplifier SA<3>. The X-direction arrangement pitch Pxs2 of the sense amplifier SA<2>, the X-direction arrangement pitch Pxs3 of the sense amplifier SA<3>, and an X-direction arrangement pitch Pxd1 of the data latch DL have a relationship of the following Formula 1.

$$Pxd1 \cong Pxs2 + Pxs3 \cong 2 \times Pxs2 \cong 2 \times Pxs3 \qquad \text{Formula 2}$$

Although not illustrated, the sense amplifier SA<0> is connected to the plural memory cells MT (refer to FIG. 3) via the bit line BL<0>. The sense amplifier SA<1> is connected to the plural memory cells MT via the bit line BL<1>. The sense amplifier SA<2> is connected to the plural memory cells MT via the bit line BL<2>. The sense amplifier SA<3> is connected to the plural memory cells MT via the bit line BL<3>.

Although not illustrated, the sense amplifier SA<0> is connected to each of the data latches DL_S<0> to DL_C<0> via the local bus LBUS (refer to FIG. 5). The sense amplifier SA<1> is connected to each of the data latches DL_S<1> to DL_C<1> via the local bus LBUS. The sense amplifier SA<2> is connected to each of the data latches DL_S<2> to DL_C<2> via the local bus LBUS. The sense amplifier SA<3> is connected to each of the data latches DL_S<3> to DL_C<3> via the local bus LBUS.

The plural data latches DL_S<0> to DL_C<0> and DL_S<1> to DL_C<1> is disposed on the −Y side of the sense amplifier SA<0> and the sense amplifier SA<1>. The data latches DL_S<0> to DL_C<0> and DL_S<1> to DL_C<1> are arranged side by side in the Y direction with their longitudinal directions aligned with the X direction. In the array of the data latches DL_S<0> to DL_C<0> and DL_S<1> to DL_C<1> in the Y direction, the data latches DL corresponding to the sense amplifier SA<0> and the data latches DL corresponding to the sense amplifier SA<1> are alternately arranged. The X-direction width of each data latch DL corresponds to the sum of the X-direction widths of the two sense amplifiers SA<0> and SA<1>.

This enables the lengths of the local buses LBUS connected to the plural data latches DL_S to DL_C to be equal between the sense amplifier SA<0> and the sense amplifier SA<1>.

The data latch DL_S<0> and the data latch DL_S<1> are adjacently arranged side by side in the Y direction. The data latch DL_S<0> is adjacent to the sense amplifier SA<0> and the sense amplifier SA<1> in the +Y direction. The data latch DL_S<1> is adjacent to the data latch DL_T<0> in the −Y direction.

The data latch DL_T<0> and the data latch DL_T<1> are adjacently arranged side by side in the Y direction. The data latch DL_T<0> is adjacent to the data latch DL_S<1> in the +Y direction. The data latch DL_S<1> is adjacent to the data latch DL_A<0> in the −Y direction.

The data latch DL_A<0> and the data latch DL_A<1> are adjacently arranged side by side in the Y direction. The data latch DL_A<0> is adjacent to the data latch DL_T<1> in the +Y direction. The data latch DL_S<1> is adjacent to the data latch DL_B<0> in the −Y direction.

The data latch DL_B<0> and the data latch DL_B<1> are adjacently arranged side by side in the Y direction. The data latch DL_B<0> is adjacent to the data latch DL_A<1> in the +Y direction. The data latch DL_B<1> is adjacent to the data latch DL_C<0> in the −Y direction.

The data latch DL_C<0> and the data latch DL_C<1> are adjacently arranged side by side in the Y direction. The data latch DL_C<0> is adjacent to the data latch DL_B<1> in the +Y direction.

Similarly, the plural data latches DL_S<2> to DL_C<2> and DL_S<3> to DL_C<3> is disposed on the −Y side of the sense amplifier SA<2> and the sense amplifier SA<3>. The data latches DL_S<2> to DL_C<2> and DL_S<3> to DL_C<3> are arranged side by side in the Y direction with their longitudinal directions aligned with the X direction. The X-direction width of each data latch DL corresponds to the sum of the X-direction widths of the two sense amplifiers SA<2> and SA<3>.

As described above, in the third embodiment, in the semiconductor memory device 100, the sense amplifiers SA are arranged in the X direction at the predetermined pitch, and the data latches DL are arranged in the X direction at twice the predetermined pitch. For example, the arrangement pitch of two sense amplifiers SA in the X direction corresponds to the arrangement pitch of one data latch DL in the X direction, and plural data latches DL corresponding to two sense amplifiers SA are arranged in the Y direction on a use by use basis. This makes it possible to efficiently lay out the plural data latches DL corresponding to each of the sense amplifiers SA and thus reduce the layout area of the semiconductor memory device 100.

Figure 29:
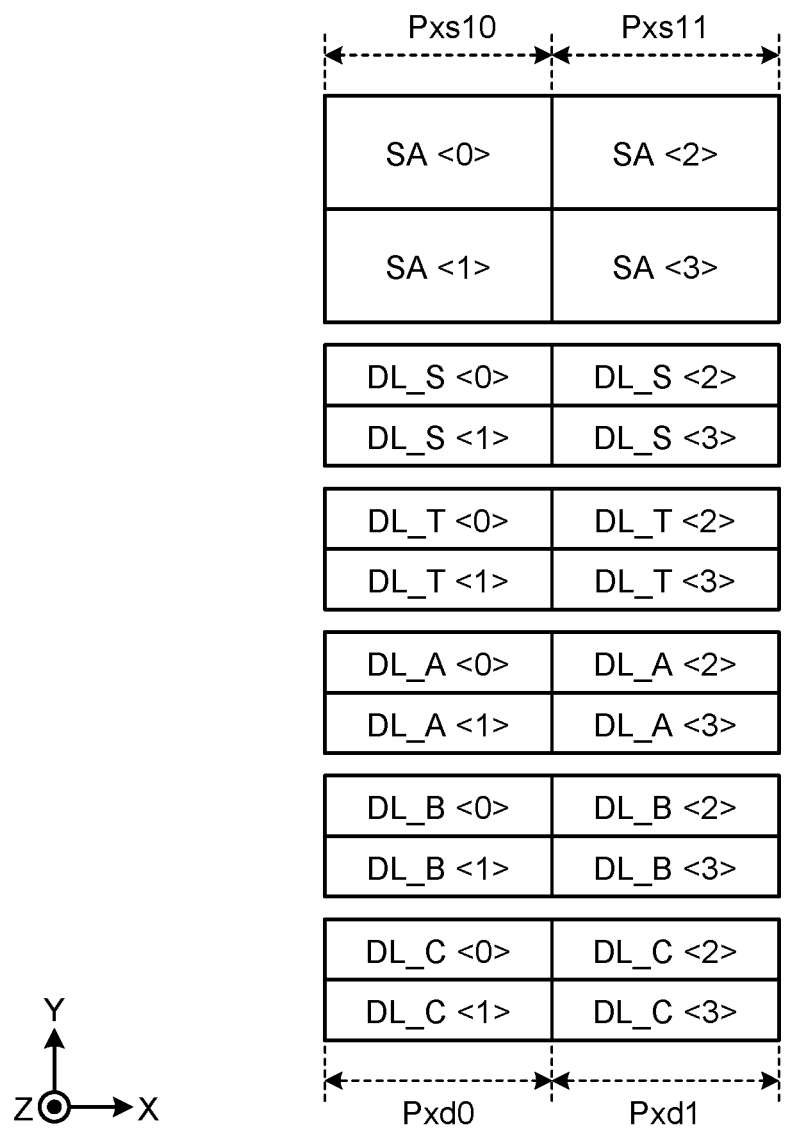
FIG. 29 is a plan view illustrating the layout configuration of plural sense amplifier circuits in a first modification of the third embodiment.

Also, the arrangement pitch of the sense amplifiers SA in the X direction and the arrangement pitch of the data latches DL in the X direction may be equal to each other as illustrated in FIG. 29. FIG. 29 is a plan view illustrating the layout configuration of plural sense amplifier circuits SADL<0> to SADL<3> in a first modification of the third embodiment. FIG. 29 illustrates, as an example, a configuration in which two sense amplifiers SA are arranged in the X direction at a pitch Pxs, and two data latches DL are arranged in the X direction at a pitch Pxd.

In the layout configuration of FIG. 29, the arrangement pitch of one sense amplifiers SA in the X direction corresponds to the arrangement pitch of one data latch DL in the X direction, and plural data latches DL corresponding to two sense amplifiers SA are arranged in the Y direction on a use by use basis.

For example, the sense amplifier SA<0> and the sense amplifier SA<1> are arranged side by side in the Y direction with their longitudinal directions aligned with the X direction. Relative to the −X-side end of the sense amplifier SA, an X-direction arrangement pitch Pxs10 of the sense amplifier SA<0> and the sense amplifier SA<1> is commonized. The X-direction arrangement pitch Pxs10 of the sense amplifier SA<0> and the sense amplifier SA<1> and an X-direction arrangement pitch Pxd0 of the data latch DL have a relationship of the following Formula 3.

$$Pxd0 \cong Pxs10 \qquad \text{Formula 3}$$

Similarly, the sense amplifier SA<2> and the sense amplifier SA<3> are arranged side by side in the Y direction with their longitudinal directions aligned with the X direction.

Relative to the −X-side end of the sense amplifier SA, an X-direction arrangement pitch Pxs11 of the sense amplifier SA<2> and the sense amplifier SA<3> is commonized. The X-direction arrangement pitch Pxs11 of the sense amplifier SA<2> and the sense amplifier SA<3> and an X-direction arrangement pitch Pxd1 of the data latch DL have a relationship of the following Formula 4.

$$Pxd1 \approx Pxs11 \qquad \text{Formula 4}$$

The plural data latches DL_S<0> to DL_C<0> and DL_S<1> to DL_C<1> is disposed on the −Y side of the sense amplifier SA<0> and the sense amplifier SA<1>. This enables the lengths of the local buses LBUS (refer to FIG. 5) connected to the plural data latches DL_S to DL_C to be equal between the sense amplifier SA<0> and the sense amplifier SA<1>.

Also, in the layout configuration of FIG. 29, the arrangement pitch of one sense amplifier SA in the X direction corresponds to the arrangement pitch of one data latch DL in the X direction, and plural data latches DL corresponding to two sense amplifiers SA are arranged in the Y direction on a use by use basis. Accordingly, the data latch control lines (the control line TI, the control line TL, the control line LI, and the control line LL) can be commonized or closely disposed on a use by use basis of the data latch DL. Thus, the drivers for the data latch control lines can be efficiently disposed in the peripheral circuit 150 (refer to FIG. 1).

In this manner, the layout configuration illustrated in FIG. 29 also makes it possible to efficiently lay out the plural data latches DL corresponding to each of the sense amplifiers SA and thus reduce the layout area of the semiconductor memory device 100.

Figure 30:
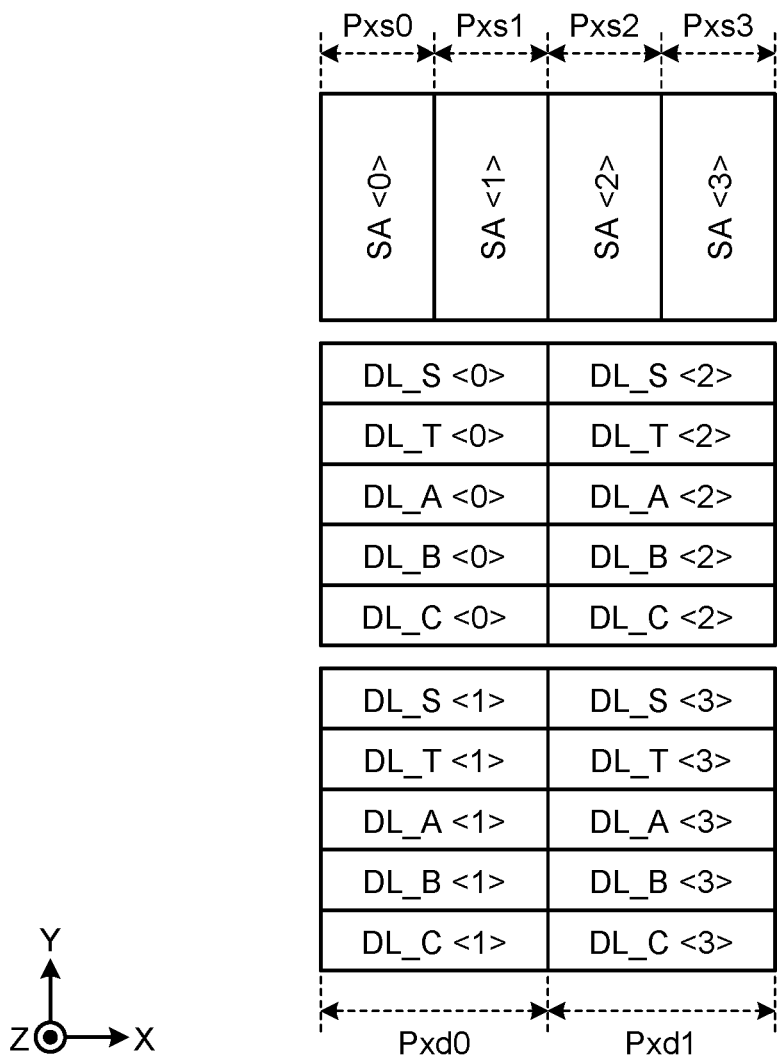
FIG. 30 is a plan view illustrating the layout configuration of plural sense amplifier circuits in a second modification of the third embodiment.

Also, plural data latches DL corresponding to plural sense amplifiers SA may be collectively arranged on a sense amplifier SA by sense amplifier SA basis as illustrated in FIG. 30. FIG. 30 is a plan view illustrating the layout configuration of plural sense amplifier circuits SADL<0> to SADL<3> in a second modification of the third embodiment.

In the layout configuration of FIG. 30, the arrangement pitch of two sense amplifiers SA in the X direction corresponds to the arrangement pitch of one data latch DL in the X direction, and plural data latches DL corresponding to two sense amplifiers SA are arranged in the Y direction on a sense amplifier SA by sense amplifier SA basis.

The data latches DL_S<0> to DL_C<0> are collectively disposed on the −Y side of the sense amplifier SA<0> and the sense amplifier SA<1>. The data latches DL_S<0> to DL_C<0> are adjacent to each other in the Y direction. The data latches DL_S<1> to DL_C<1> are collectively disposed on the −Y side of the data latches DL_S<0> to DL_C<0>. The data latches DL_S<0> to DL_C<0> are adjacent to each other in the Y direction.

The data latches DL corresponding to the sense amplifier SA<0> are arranged in the order of the data latch DL_S<0>, the data latch DL_T<0>, the data latch DL_A<0>, the data latch DL_B<0>, and the data latch DL_C<0> from the +Y side to the −Y side.

The data latches DL corresponding to the sense amplifier SA<1> are arranged in the order of the data latch DL_S<1>, the data latch DL_T<1>, the data latch DL_A<1>, the data latch DL_B<1>, and the data latch DL_C<1> from the +Y side to the −Y side.

In this manner, the layout configuration illustrated in FIG. 30 also makes it possible to efficiently lay out the plural data latches DL corresponding to each of the sense amplifiers SA and thus reduce the layout area of the semiconductor memory device 100. Furthermore, it is possible to minimize the wiring length of the local bus LBUS to which each data latch DL is connected, thereby increasing the data transfer speed of the local bus LBUS and reducing power consumption in data transfer of the local bus LBUS.

Figure 31:
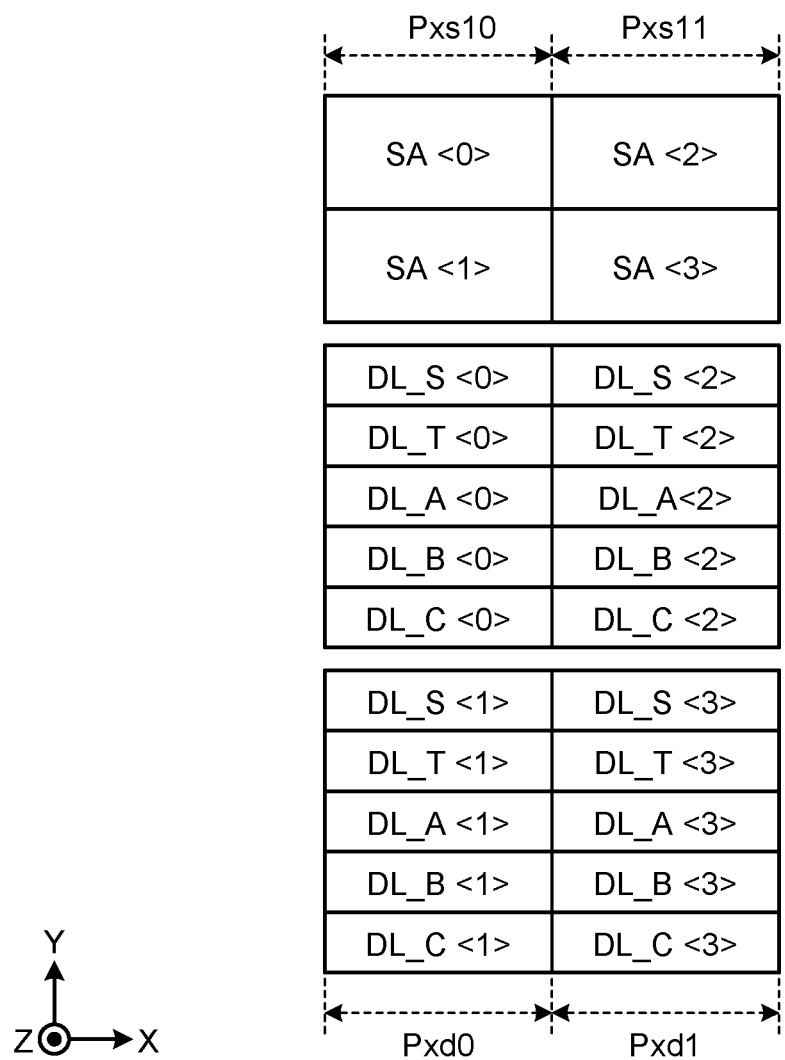
FIG. 31 is a plan view illustrating the layout configuration of plural sense amplifier circuits in a third modification of the third embodiment.

Also, the layout configuration of FIG. 29 and the layout configuration of FIG. 30 may be combined to construct a layout configuration as illustrated in FIG. 31. FIG. 31 is a plan view illustrating the layout configuration of plural sense amplifier circuits SADL<0> to SADL<3> in a third modification of the third embodiment.

The layout configuration of FIG. 31 is similar to the layout configuration of FIG. 29 in that the arrangement pitch of one sense amplifier SA in the X direction corresponds to the arrangement pitch of one data latch DL in the X direction, and plural data latches DL corresponding to two sense amplifiers SA are arranged in the Y direction on a sense amplifier SA by sense amplifier SA basis. For example, in the layout configuration of FIG. 31, the sense amplifier SA<0> and the sense amplifier SA<1> are arranged side by side in the Y direction with their longitudinal directions aligned with the X direction.

The layout configuration of FIG. 31 is similar to the layout configuration of FIG. 30 in that the data latches DL_S<0> to DL_C<0> are collectively disposed on the −Y side of the sense amplifier SA<0> and the sense amplifier SA<1> and collectively disposed on the −Y side of the of data latches DL_S<0> to DL_C<0>. For example, in the layout configuration of FIG. 31, the data latches DL_S<0> to DL_C<0> are adjacent to each other in the Y direction, and the data latches DL_S<0> to DL_C<0> are adjacent to each other in the Y direction.

In this manner, the layout configuration illustrated in FIG. 31 also makes it possible to efficiently lay out the plural data latches DL corresponding to each of the sense amplifiers SA and thus reduce the layout area of the semiconductor memory device 100.

Figure 32:
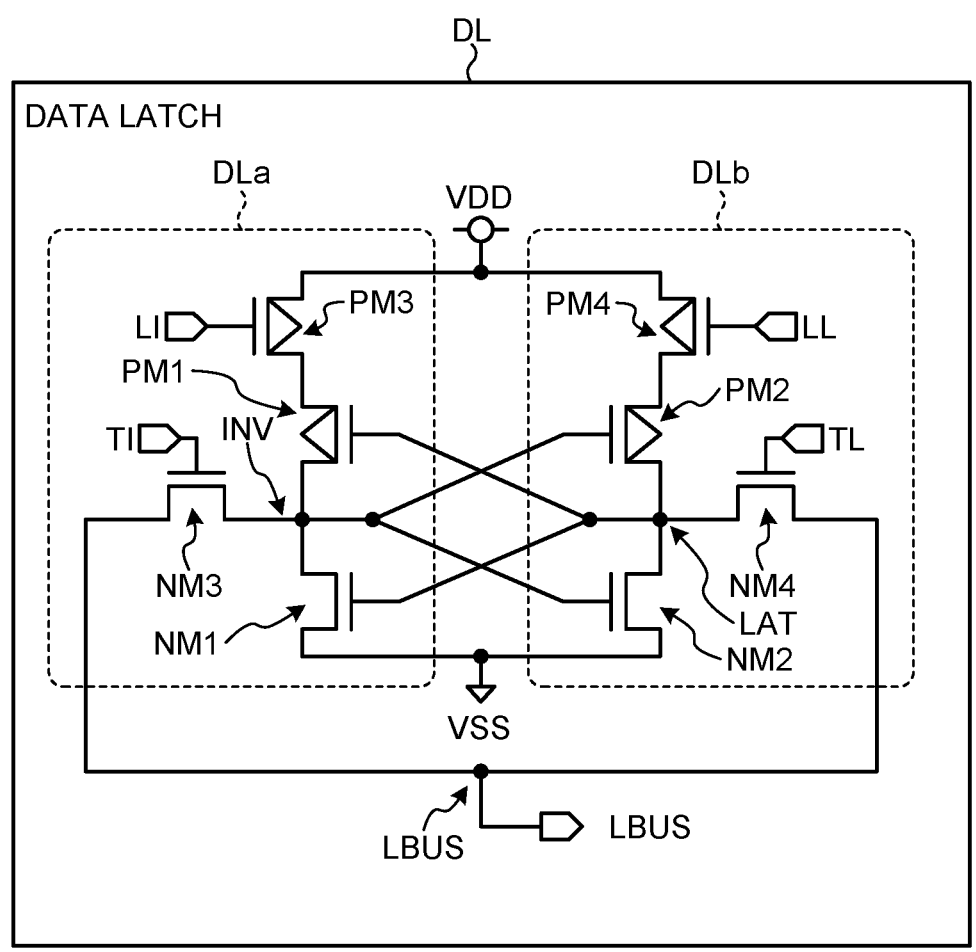
FIG. 32 is a circuit diagram illustrating the configuration of a data latch in a fourth modification of the third embodiment.

Also, the inside of the data latch DL may be divided into plural portions in accordance with control lines, and the layout configuration may be devised in each of the divided portions. For example, the data latch DL illustrated in FIG. 7 can be divided into plural portions DLa and DLb as illustrated in FIG. 32. FIG. 32 is a circuit diagram illustrating the configuration of a data latch DL in a fourth modification of the third embodiment. The portion DLa corresponds to the control line LI and the control line TI. The portion DLa includes the transistors PM1, PM3, NM1, and NM3. The portion DLb corresponds to the control line LL and the control line TL. The portion DLb includes the transistors PM2, PM4, NM2, and NM4.

Note that the function of the portion DLa and the function of the portion DLb differ from each other. The data latch DL includes a differential configuration. The portion DLa corresponds to the negative side of the differential configuration, and generates a negative-side signal in the data latch DL and outputs the signal to the local bus LBUS from the node LAT. The portion DLb corresponds to the positive side of the differential configuration, and generates a positive-side signal in the data latch DL and outputs the signal to the local bus LBUS from the node INV.

Figure 33:
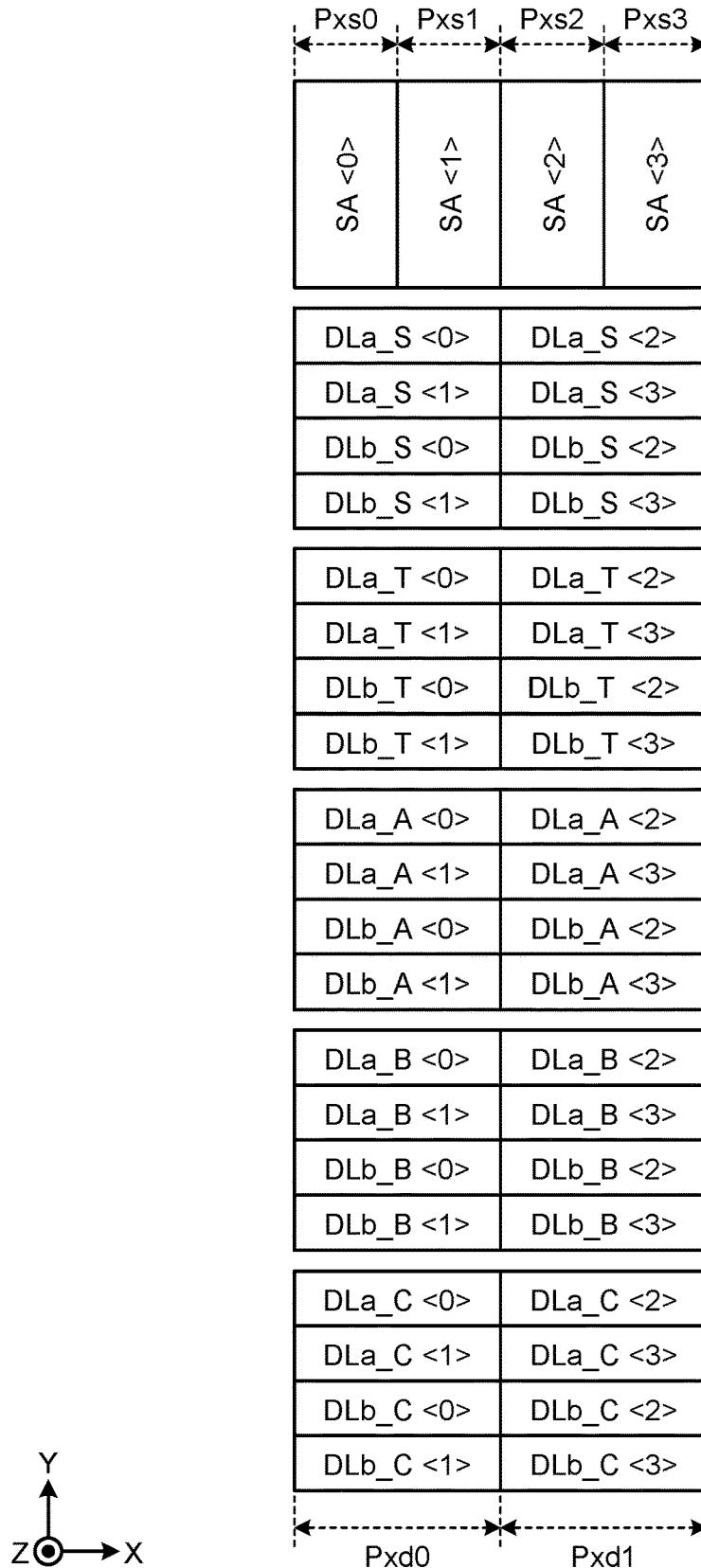
FIG. 33 is a plan view illustrating the layout configuration of plural sense amplifier circuits in a fourth modification of the third embodiment.

For example, the plural sense amplifier circuits SADL<0> to SADL<3> in the sense amplifier block 120 (refer to FIG. 4) can be laid out as illustrated in FIG. 33. FIG. 33 is a plan view illustrating the layout configuration of plural sense amplifier circuits SADL<0> to SADL<3> in a fourth modification of the third embodiment.

In the layout configuration of FIG. 33, the arrangement pitch of two sense amplifiers SA in the X direction corresponds to the arrangement pitch of one portion DLa and one portion DLb of the data latch DL in the X direction, and plural data latches DL corresponding to two sense amplifiers SA are arranged in the Y direction on a use by use basis and a function by function basis.

Accordingly, in the peripheral circuit 150 (refer to FIG. 1), the data latch control lines can be commonized or closely disposed on a use by use basis and a function by function basis of the data latch DL. That is, the data latch control lines (the control line TI and the control line LI) corresponding to the portion DLa can be commonized or closely disposed, and the data latch control lines (the control line TL and the control line LL) corresponding to the portion DLb can be commonized or closely disposed. Thus, the drivers for the data latch control lines can be more efficiently disposed in the peripheral circuit 150 than in the layout configuration of FIG. 28.

Although not illustrated, the sense amplifier SA<0> is connected to each of the data latches DLa_S<0> to DLa_C<0> and connected to each of the data latches DLb_S<0> to DLb_C<0> via the local bus LBUS (refer to FIG. 5). The sense amplifier SA<1> is connected to each of the data latches DLa_S<1> to DLa_C<1> and connected to each of the data latches DLb_S<1> to DLb_C<1> via the local bus LBUS. The sense amplifier SA<2> is connected to each of the data latches DLa_S<2> to DLa_C<2> and connected to each of the data latches DLb_S<2> to DLb_C<2> via the local bus LBUS. The sense amplifier SA<3> is connected to each of the data latches DLa_S<3> to DLa_C<3> and connected to each of the data latches DLb_S<3> to DLb_C<3> via the local bus LBUS.

In the layout configuration of FIG. 33, the portions DLa and DLb are arranged in the Y direction with their longitudinal directions aligned with the X direction. On the −Y side of the sense amplifier SA<0> and the sense amplifier SA<1>, the portion DLa corresponding to the sense amplifier SA<0>, the portion DLa corresponding to the sense amplifier SA<1>, the portion DLb corresponding to the sense amplifier SA<0>, and the portion DLb corresponding to the sense amplifier SA<1> are repeatedly arranged in this order in the Y direction. Furthermore, this repetition is performed on a use by use basis of the data latch DL.

For example, on the −Y side of the sense amplifier SA<0> and the sense amplifier SA<1>, the portions DLa_S<0>, DLa_S<1>, DLb_S<0>, DLb_S<1>, DLa_T<0>, DLa_T<1>, DLb_T<0>, DLb_T<1>, DLa_A<0>, DLa_A<1>, DLb_A<0>, DLb_A<1>, DLa_B<0>, DLa_B<1>, DLb_B<0>, DLb_B<1>, DLa_C<0>, DLa_C<1>, DLb_C<0>, and DLb_C<1> are arranged in this order in the −Y direction.

In this manner, the layout configuration illustrated in FIG. 33 makes it possible to efficiently lay out the plural data latch portions DLa and DLb corresponding to each of the sense amplifiers SA and thus reduce the layout area of the semiconductor memory device 100.

Figure 34:
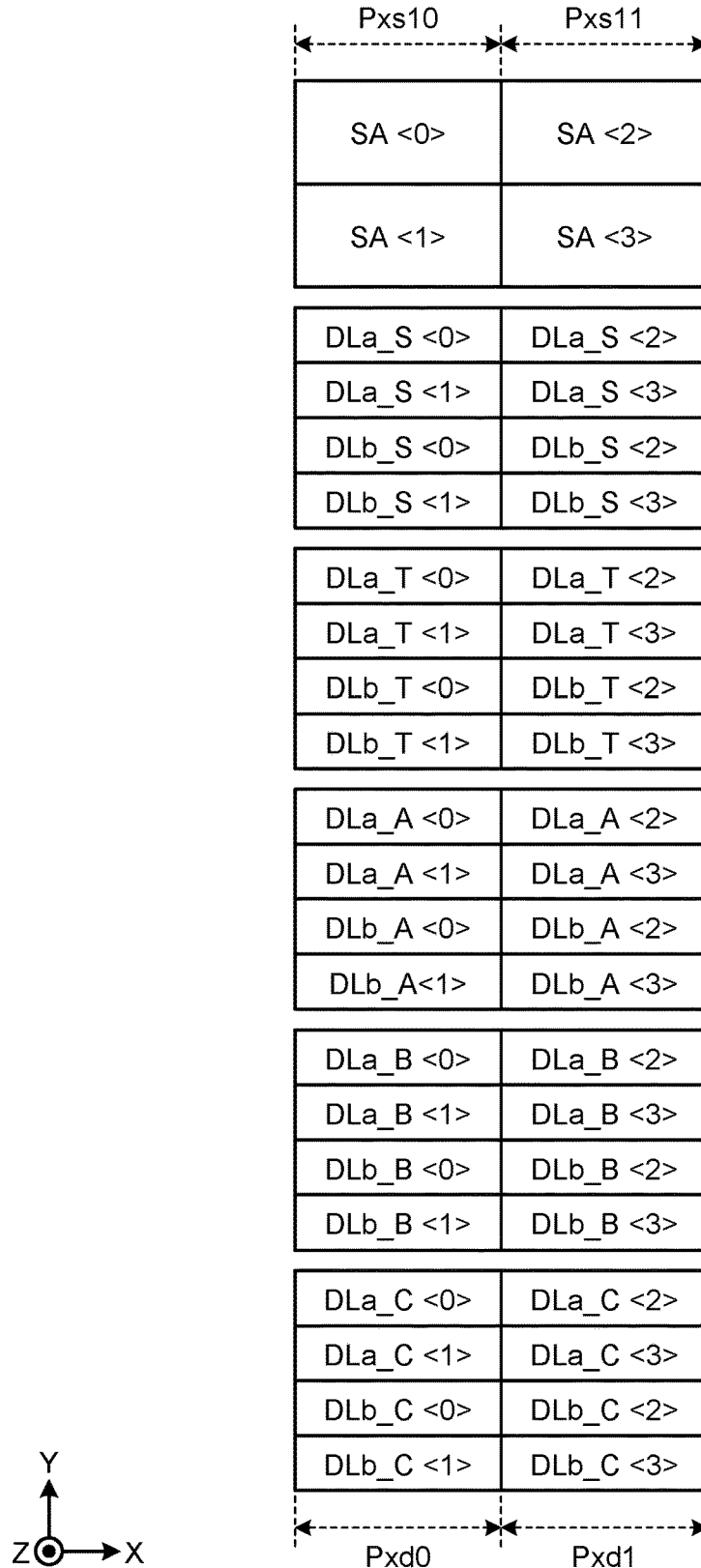
FIG. 34 is a plan view illustrating the layout configuration of plural sense amplifier circuits in a fifth modification of the third embodiment.

Alternatively, the arrangement pitch of the sense amplifiers SA in the X direction and the arrangement pitch of the data latches DL in the X direction may be equal to each other as illustrated in FIG. 34. FIG. 34 is a plan view illustrating the layout configuration of plural sense amplifier circuits SADL<0> to SADL<3> in a fifth modification of the third embodiment. FIG. 34 illustrates, as an example, a configuration in which two sense amplifiers SA are arranged in the X direction at a pitch Pxs, and two data latches DL are arranged in the X direction at a pitch Pxd.

In the layout configuration of FIG. 34, the arrangement pitch of one sense amplifiers SA in the X direction corresponds to the arrangement pitch of one data latch DL in the X direction, and plural portions DLa and DLb of data latches DL corresponding to two sense amplifiers SA are arranged in the Y direction on a use by use basis and a function by function basis. The array of the portions DLa and DLb of the data latches DL is similar to that in the layout configuration illustrated in FIG. 33.

In this manner, the layout configuration illustrated in FIG. 34 also makes it possible to efficiently lay out the plural data latch portions DLa and DLb corresponding to each of the sense amplifiers SA and thus reduce the layout area of the semiconductor memory device 100.

Figure 35:
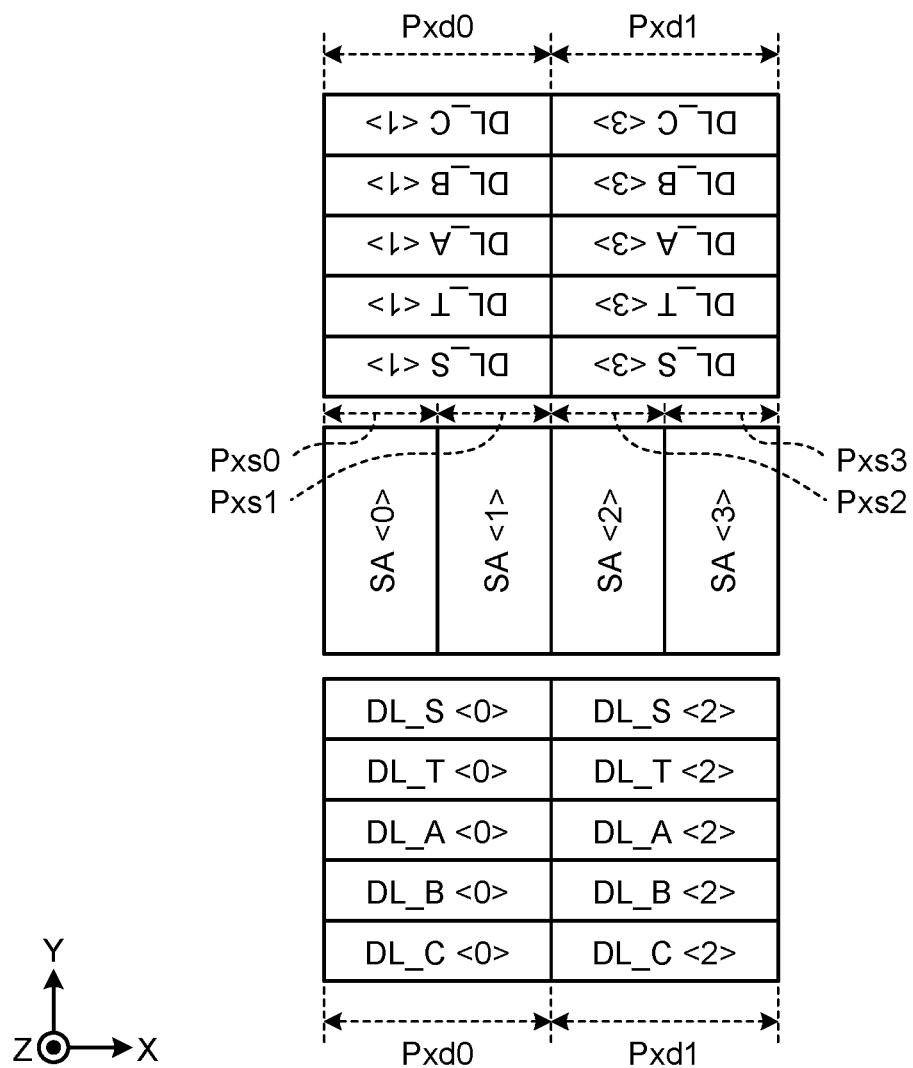
FIG. 35 is a plan view illustrating the layout configuration of plural sense amplifier circuits in a sixth modification of the third embodiment.

Alternatively, as illustrated in FIG. 35, plural sense amplifiers SA may be laid out on the Y-direction center of the array of plural data latches DL. FIG. 35 is a plan view illustrating the layout configuration of plural sense amplifier circuits in a sixth modification of the third embodiment.

In the layout configuration of FIG. 35, the arrangement pitch of two sense amplifiers SA in the X direction corresponds to the arrangement pitch of one data latch DL in the X direction, and plural data latches DL corresponding to two sense amplifiers SA are arranged on both sides in the Y direction.

For example, the data latches DL_S<0> to DL_C<0> are collectively disposed on the −Y side of the sense amplifier SA<0> and the sense amplifier SA<1>. The data latches DL_S<1> to DL_C<1> are collectively disposed on the +Y side of the sense amplifier SA<0> and the sense amplifier SA<1>.

The data latches DL corresponding to the sense amplifier SA<0> are arranged in the order of the data latch DL_S<0>, the data latch DL_T<0>, the data latch DL_A<0>, the data latch DL_B<0>, the data latch DL_C<0> from the +Y side to the −Y side.

The data latches DL corresponding to the sense amplifier SA<1> are arranged in the order of the data latch DL_S<1>, the data latch DL_T<1>, the data latch DL_A<1>, the data latch DL_B<1>, the data latch DL_C<1> from the −Y side to the +Y side.

Accordingly, the wiring line (local bus LBUS) between the sense amplifier SA<0> and the plural data latches DL and the wiring line (local bus LBUS) between the sense amplifier SA<1> and the plural data latches DL can be laid out separately on both sides in the Y direction. For example, in the layout configuration as illustrated in FIG. 33, the local bus LBUS as the wiring line between the sense amplifier SA<0> and the plural data latches DL and the local bus LBUS as the wiring line between the sense amplifier SA<1> and the plural data latches DL are arranged in parallel to each other. On the other hand, according to the layout configuration of FIG. 35, only one local bus LBUS is required in each data latch DL. Accordingly, it is possible to reduce the number of wiring lines in the upper layer wiring in each data latch DL and expand the wiring pitch. As a result, it is possible to reduce the parasitic capacitance of the BUS to reduce charge/discharge current (reduce power consumption) and improve (increase) the data transfer speed on the BUS.

In this manner, the layout configuration illustrated in FIG. 35 also makes it possible to efficiently lay out the plural data latches DL corresponding to each of the sense amplifiers SA and thus reduce the layout area of the semiconductor memory device 100.

Figure 36:
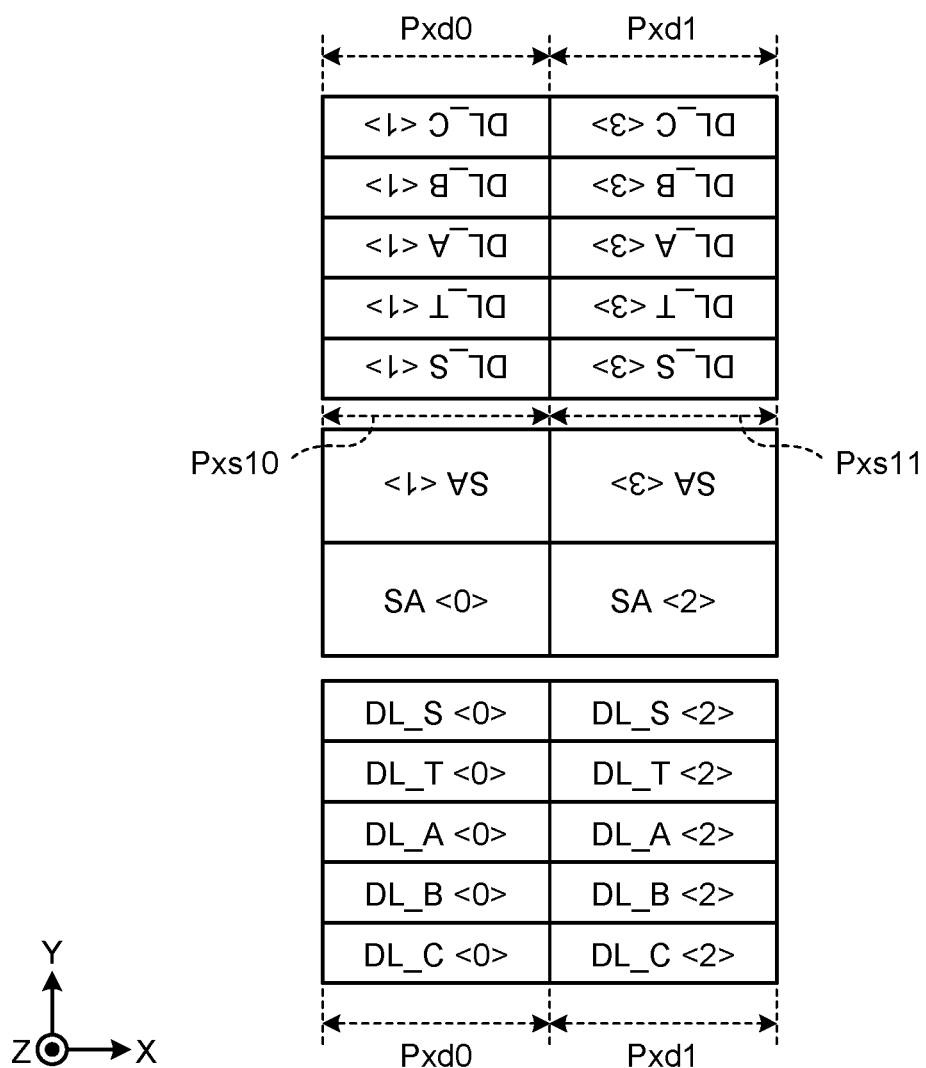
FIG. 36 is a plan view illustrating the layout configuration of plural sense amplifier circuits in a seventh modification of the third embodiment.

Alternatively, the arrangement pitch of the sense amplifiers SA in the X direction and the arrangement pitch of the data latches DL in the X direction may be substantially equal to each other as illustrated in FIG. 36. FIG. 36 is a plan view illustrating the layout configuration of plural sense amplifier circuits SADL<0> to SADL<3> in a seventh modification of the third embodiment. FIG. 36 illustrates, as an example, a configuration in which two sense amplifiers SA are arranged in the X direction at a pitch Pxs, and two data latches DL are arranged in the X direction at a pitch Pxd.

In the layout configuration of FIG. 36, the arrangement pitch of one sense amplifiers SA in the X direction corresponds to the arrangement pitch of one data latch DL in the X direction, and plural data latches DL corresponding to two sense amplifiers SA are arranged on both sides in the Y direction. The array of the data latches DL is similar to that in the layout configuration of FIG. 35.

In this manner, the layout configuration illustrated in FIG. 36 also makes it possible to efficiently lay out the plural data latches DL corresponding to each of the sense amplifiers SA and thus reduce the layout area of the semiconductor memory device 100.

Note that the layout configurations illustrated in FIGS. 28 to 29 and 31 to 34 are applicable not only to the data latch DL illustrated in FIG. 7, but also to any data latch. Furthermore, the layout configuration of the circuit corresponding to the data latch DL is not limited to the layout configurations illustrated in FIGS. 8 to 17 and 23 to 26 and applicable to the layout of a circuit corresponding to any data latch.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a substrate having a surface extending in a first direction and a second direction perpendicular to the first direction;
    a memory cell array including plural memory cells; and
    a peripheral circuit disposed around the memory cell array, wherein
    the peripheral circuit includes
        a sense amplifier connected to the memory cell via a bit line,
        plural data latches connected to the sense amplifier via a first bus,
    the data latch includes
        plural PMOS transistors formed on the surface of the substrate and arranged in the first direction, and
        plural NMOS transistors formed on the surface of the substrate at positions adjacent to the respective plural PMOS transistors in the second direction and arranged in the first direction,
    the plural PMOS transistors includes a first PMOS transistor, a second PMOS transistor, a third PMOS transistor, and a fourth PMOS transistor,
    the plural NMOS transistors includes a first NMOS transistor, a second NMOS transistor, a third NMOS transistor, and a fourth NMOS transistor,
    a gate electrode of the first PMOS transistor and a gate electrode of the first NMOS transistor are commonly connected, and a first contact plug connected to the commonly-connected gate electrodes is disposed at least partly overlapping an isolation portion when viewed in a third direction perpendicular to the first direction and the second direction,
    a gate electrode of the second PMOS transistor and a gate electrode of the second NMOS transistor are commonly connected, and a second contact plug connected to the commonly-connected gate electrodes is disposed at least partly overlapping the isolation portion when viewed in the third direction,
    a third contact plug is connected to a gate electrode of the third PMOS transistor to at least partly overlap with the isolation portion when viewed in the third direction,
    a fourth contact plug is connected to a gate electrode of the fourth PMOS transistor to at least partly overlap with the isolation portion when viewed in the third direction,
    a fifth contact plug is connected to a gate electrode of the third NMOS transistor to at least partly overlap with the isolation portion when viewed in the third direction, and
    a sixth contact plug is connected to a gate electrode of the fourth NMOS transistor to at least partly overlap with the isolation portion when viewed in the third direction.

2. The semiconductor memory device according to claim 1, wherein
    the plural PMOS transistors is disposed in order of the first PMOS transistor, the third PMOS transistor, the fourth PMOS transistor, and the second PMOSs transistor in the first direction, and
    the plural NMOS transistors is disposed in order of the first NMOS transistor, the third NMOS transistor, the fourth NMOS transistor, and the second NMOS transistor in the first direction.

3. The semiconductor memory device according to claim 1, wherein
    the plural PMOS transistors is disposed in order of the third PMOS transistor, the first PMOS transistor, the second PMOS transistor, and the fourth PMOS transistor in the first direction, and
    the plural NMOS transistors is disposed in order of the first NMOS transistor, the third NMOS transistor, the fourth NMOS transistor, and the second NMOS transistor in the first direction.

4. The semiconductor memory device according to claim 1, wherein
    the plural PMOS transistors is disposed in order of the first PMOS transistor, the third PMOS transistor, the fourth PMOS transistor, and the second PMOS transistor in the first direction, and
    the plural NMOS transistors is disposed in order of the third NMOS transistor, the first NMOS transistor, the second NMOS transistor, and the fourth NMOS transistor in the first direction.

5. The semiconductor memory device according to claim 1, wherein
    the plural PMOS transistors is disposed in order of the third PMOS transistor, the first PMOS transistor, the second PMOS transistor, and the fourth PMOS transistor in the first direction, and
    the plural NMOS transistors is disposed in order of the third NMOS transistor, the first NMOS transistor, the second NMOS transistor, and the fourth NMOS transistor in the first direction.

6. The semiconductor memory device according to claim 1, wherein the plural data latches is arranged in the second direction, and a positional relationship between PMOS and NMOS transistors is inverted in the second direction between two data latches disposed adjacent to each other in the second direction among the plural data latches.

7. The semiconductor memory device according to claim 6, wherein gate electrodes of the third PMOS transistors of two data latches disposed adjacent to each other in the second direction among the plural data latches is commonly connected, and the third contact plug connected to the commonly-connected gate electrodes is disposed at least partly overlapping the isolation portion when viewed in the third direction, gate electrodes of the fourth PMOS transistors of the two data latches are commonly connected, and the fourth contact plug connected to the commonly-connected gate electrodes is disposed at least partly overlapping the isolation portion when viewed in the third direction, gate electrodes of the third NMOS transistors of the two data latches are commonly connected, and the fifth contact plug connected to the commonly-connected gate electrodes is disposed at least partly overlapping the isolation portion when viewed in the third direction, and gate electrodes of the fourth NMOS transistors of the two data latches are commonly connected, and the sixth contact plug connected to the commonly-connected gate electrodes is disposed at least partly overlapping the isolation portion when viewed in the third direction.

8. The semiconductor memory device according to claim 1, wherein the plural data latches is arranged in the first direction, and a positional relationship between PMOS and NMOS transistors is the same between two data latches disposed adjacent to each other in the first direction among the plural data latches.

9. The semiconductor memory device according to claim 1, wherein the plural data latches is arranged in the first direction, and a positional relationship between PMOS and NMOS transistors is inverted in the first direction between two data latches disposed adjacent to each other in the first direction among the plural data latches.

10. The semiconductor memory device according to claim 1, wherein the peripheral circuit includes plural the sense amplifiers, the plural sense amplifiers is arranged in the second direction at a predetermined pitch, and the plural data latches is arranged in the second direction at twice the predetermined pitch.

11. The semiconductor memory device according to claim 10, wherein the plural sense amplifiers includes a first sense amplifier and a second sense amplifier, the plural data laches includes a first data latch group and a second data latch group, the first data latch group includes plural first data latches, each of the first data latches being connected to the first sense amplifier via a first bus line, the second data latch group includes plural second data latches, each of the second data latches being connected to the second sense amplifier via a second bus line, the first data latch having a first use and the second data latch having the first use are disposed adjacent to each other in the first direction, and the first data latch having a second use and the second data latch having the second use are disposed adjacent to each other in the first direction.

12. The semiconductor memory device according to claim 10, wherein the plural sense amplifiers includes a first sense amplifier and a second sense amplifier, the plural data laches includes a first data latch group and a second data latch group adjacent to the first data latch group in the first direction, the first data latch group includes plural first data latches, each of the first data latches being connected to the first sense amplifier via a first bus line, the second data latch group includes plural second data latches, each of the second data latches being connected to the second sense amplifier via a second bus line, the plural first data latches is disposed adjacent to each other in the first direction, and the plural second data latches are disposed adjacent to each other in the first direction.

13. The semiconductor memory device according to claim 10, wherein the plural sense amplifiers includes a first sense amplifier and a second sense amplifier, the plural data laches includes a first data latch group and a second data latch group, the first data latch group includes plural first data latches, each of the first data latches being connected to the first sense amplifier via a first bus line, the second data latch group includes plural second data latches, each of the second data latches being connected to the second sense amplifier via a second bus line, the first data latch includes a first portion corresponding to a first control line, and a second portion corresponding to a second control line, the second data latch includes a third portion corresponding to the first control line, and a fourth portion corresponding to the second control line, the first portion and the third portion are disposed adjacent to each other in the first direction, and the second portion and the fourth portion are disposed adjacent to each other in the first direction.

14. The semiconductor memory device according to claim 10, wherein the plural sense amplifiers includes a first sense amplifier and a second sense amplifier, the plural data laches includes a first data latch group and a second data latch group, the first data latch group includes plural first data latches, each of the first data latches being connected to the first sense amplifier via a first bus line, the second data latch group includes plural second data latches, each of the second data latches being connected to the second sense amplifier via a second bus line, the first sense amplifier is disposed between the first data latch group and the second data latch group in the first direction, the second sense amplifier is disposed between the first data latch group and the second data latch group in the first direction, the plural first data latches is disposed adjacent to each other in the first direction, and the plural second data latches is disposed adjacent to each other in the first direction.

15. The semiconductor memory device according to claim 1, wherein the peripheral circuit includes plural the sense amplifiers, the plural sense amplifiers is arranged in the second direction at a predetermined pitch, and the plural data latches is arranged in the second direction at the predetermined pitch.

16. The semiconductor memory device according to claim 1, further comprising:
- a first wiring layer including plural first lines, each of the first lines extending in the second direction; and
- a second wiring layer including plural second lines, each of the second lines extending in the first direction, the second wiring layer being an upper layer relative to the first wiring layer, wherein
- plural control lines connected to the data latch includes the first line,
- the first line is connected to each of the gate electrode of the third NMOS transistor, the gate electrode of the fourth NMOS transistor, the gate electrode of the third PMOS transistor, and the gate electrode of the fourth PMOS transistor, and
- the first NMOS transistor, the second NMOS transistor, the first PMOS transistor, and the second PMOS transistor are connected to each other via the first line and the second line.

17. The semiconductor memory device according to claim 16, wherein
- a gate of the first NMOS transistor, a drain of the second NMOS transistor, a drain of the second PMOS transistor, and a gate of the first PMOS transistor are connected to each other via the first line and the second line, and
- a gate of the second NMOS transistor, a drain of the first NMOS transistor, a drain of the first PMOS transistor, and a gate of the second PMOS transistor are connected to each other via the first line and the second line.

18. The semiconductor memory device according to claim 16, further comprising:
- a third wiring layer including plural third lines, each of the third lines extending in the second direction, the third wiring layer being an upper layer relative to the second wiring layer, wherein
- the plural control lines connected to the data latch further includes the third line.

19. The semiconductor memory device according to claim 18, wherein
- plural control lines connected to the sense amplifier includes the first line.

20. The semiconductor memory device according to claim 19, wherein
- the sense amplifier includes a capacitive element, and the capacitive element is formed of the third line.

21. The semiconductor memory device according to claim 1, further comprising:
- a first wiring layer including plural first lines, each of the first lines extending in the first direction; and
- a second wiring layer including plural second lines, each of the second lines extending in the second direction, the second wiring layer being an upper layer relative to the first wiring layer, wherein
- plural data latch control lines connected to the data latch include the second line, and
- the first line is connected to each of the gate electrode of the third NMOS transistor, the gate electrode of the fourth NMOS transistor, the gate electrode of the third PMOS transistor, and the gate electrode of the fourth PMOS transistor.

22. The semiconductor memory device according to claim 21, wherein
- the second line is connected, via the first line, to each of the gate electrode of the third NMOS transistor, the gate electrode of the fourth NMOS transistor, the gate electrode of the third PMOS transistor, and the gate electrode of the fourth PMOS transistor.

23. The semiconductor memory device according to claim 21, wherein
- the first NMOS transistor and the first PMOS transistor are connected to each other via the first line, and
- the second NMOS transistor and the second PMOS transistor are connected to each other via the first line.

24. The semiconductor memory device according to claim 21, wherein
- the first NMOS transistor and the first PMOS transistor are connected to each other via the first line and the second line, and
- the second NMOS transistor and the second PMOS transistor are connected to each other via the first line and the second line.

25. The semiconductor memory device according to claim 1, further comprising:
- an input/output data latch connected to the sense amplifier via a second bus, wherein
- the input/output data latch has the same layout configuration as the data latch.

* * * * *